(12) United States Patent
Nakashio et al.

(10) Patent No.: US 7,583,012 B2
(45) Date of Patent: Sep. 1, 2009

(54) PIEZOELECTRIC ELEMENT AND METHOD FOR MANUFACTURING PIEZOELECTRIC ELEMENT

(75) Inventors: Eiji Nakashio, Miyagi (JP); Junichi Honda, Miyagi (JP); Takashi Tamura, Miyagi (JP); Koji Suzuki, Miyagi (JP); Teruo Inaguma, Miyagi (JP); Manabu Aizawa, Miyagi (JP); Kazuo Takahashi, Miyagi (JP); Tadashi Sakurai, Miyagi (JP)

(73) Assignee: Sony Corporation, Tokyo (JP)

( * ) Notice: Subject to any disclaimer, the term of this patent is extended or adjusted under 35 U.S.C. 154(b) by 167 days.

(21) Appl. No.: 11/367,996

(22) Filed: Mar. 3, 2006

(65) Prior Publication Data
US 2006/0197415 A1   Sep. 7, 2006

(30) Foreign Application Priority Data

| Mar. 4, 2005 | (JP) | P2005-061694 |
| Mar. 4, 2005 | (JP) | P2005-061695 |
| Mar. 4, 2005 | (JP) | P2005-061696 |
| Jun. 29, 2005 | (JP) | P2005-190234 |
| Dec. 28, 2005 | (JP) | P2005-378321 |

(51) Int. Cl.
*H01L 41/08* (2006.01)
(52) U.S. Cl. .................. 310/358; 310/330; 310/331; 310/364

(58) Field of Classification Search .......... 310/357–359
See application file for complete search history.

(56) References Cited

U.S. PATENT DOCUMENTS

| 5,691,752 | A | * | 11/1997 | Moynihan et al. ............. 347/68 |
| 5,802,684 | A | * | 9/1998 | Fujiu et al. .................. 29/25.35 |
| 6,362,558 | B1 | * | 3/2002 | Fukui .......................... 310/358 |
| 6,411,017 | B1 | * | 6/2002 | Qiu et al. .................... 310/358 |
| 6,639,340 | B1 | * | 10/2003 | Qiu et al. .................... 310/358 |
| 2007/0046153 | A1 | * | 3/2007 | Matsuda et al. .............. 310/358 |
| 2007/0262678 | A1 | * | 11/2007 | Kubota et al. ............... 310/358 |

* cited by examiner

*Primary Examiner*—Mark Budd
(74) *Attorney, Agent, or Firm*—Sonnenschein Nath & Rosenthal LLP

(57) ABSTRACT

There is a need for a piezoelectric element capable of improving a productivity and a yield without impairing the piezoelectric characteristic and a method for manufacturing the same. A piezoelectric element is provided with a substrate, a first electrode film disposed on the substrate, a piezoelectric film disposed on the first electrode film, and a second electrode film disposed on the piezoelectric film. The piezoelectric film has a laminated structure composed of a plurality of crystallized piezoelectric thin films. The piezoelectric film having a predetermined thickness is formed by repeated cycles of a film formation step of forming a piezoelectric thin film and a crystallization heat treatment step of heat-treating the piezoelectric thin film to effect crystallization. In this manner, a piezoelectric film exhibiting uniform crystallinity in the film thickness direction may be produced.

10 Claims, 48 Drawing Sheets

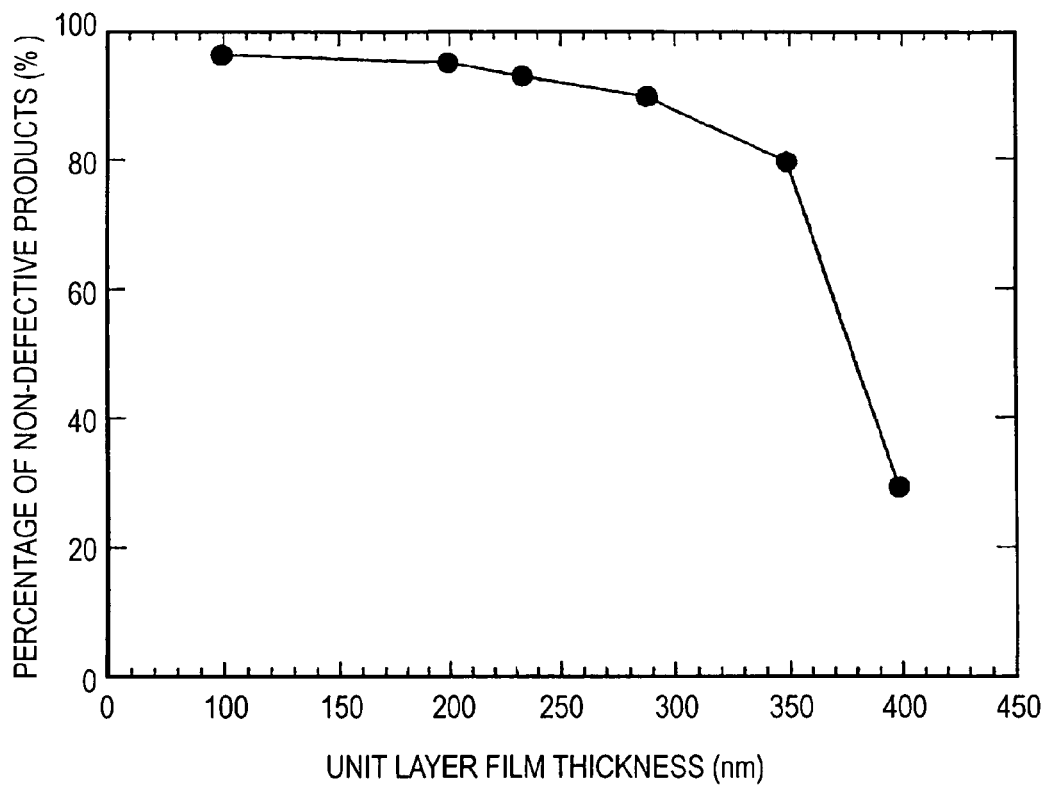

|  | TREATMENT TEMPERATURE [°C] | AMOUNT OF Ec SHIFT [V/μm] |
|---|---|---|
| $T_1$ | 30 | 0.00 |
| $T_2$ | 100 | 0.50 |
| $T_3$ | 170 | 1.46 |
| $T_4$ | 220 | 1.79 |
| $T_5$ | 260 | 1.60 |
| $T_6$ | 270 | 1.40 |

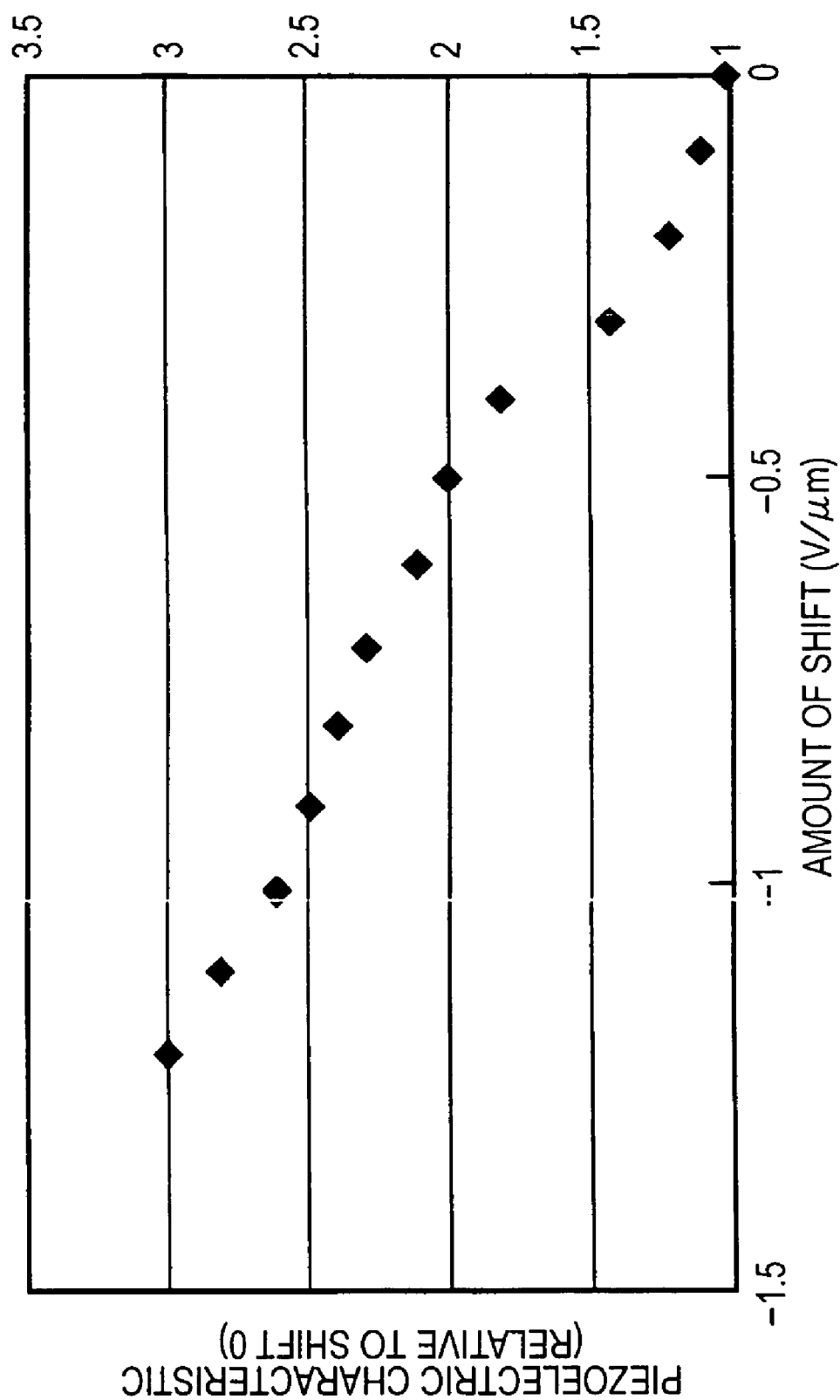

PIEZOELECTRIC ELEMENT AND METHOD FOR MANUFACTURING PIEZOELECTRIC ELEMENT

CROSS REFERENCES TO RELATED APPLICATIONS

The present invention contains subject matter related to Japanese Patent Applications JP 2005-061694, JP 2005-061695, JP 2005-061696, JP 2005-190234, and JP 2005-378321 filed in the Japanese Patent Office on Mar. 4, 2005, Mar. 4, 2005, Mar. 4, 2005, Jun. 29, 2005, and Dec. 28, 2005, respectively, the entire contents of which are incorporated herein by reference.

BACKGROUND OF THE INVENTION

1. Field of the Invention

The present invention relates to a piezoelectric element including a piezoelectric film and a method for manufacturing the same.

2. Description of the Related Art

Piezoelectric elements have been previously used for piezoelectric vibrators of actuators, sensors, and the like. In general, piezoelectric elements in the related art have a structure in which a first electrode film is disposed on a wafer, a piezoelectric film is disposed on this first electrode film by a sputtering method, a sol-gel method, or the like, and a second electrode film is further disposed on the above-described piezoelectric film (refer to Japanese Unexamined Patent Application Publication No. 7-113643 and Japanese Unexamined Patent Application Publication No. 10-19574, for example).

SUMMARY OF THE INVENTION

For this type of piezoelectric element, sometimes, it is desired that the piezoelectric film formed on the first electrode film is processed into a predetermined shape by patterning. A dry etching method or a wet etching method may be used for processing the piezoelectric film by patterning.

In general, a piezoelectric element exhibits a higher piezoelectric characteristic as the thickness of the piezoelectric film is increased. However, in the dry etching method, when the thickness of the piezoelectric film is 1 µm or more, the process takes a long time, and the production time of the element is increased. In the wet etching method, there is a problem in that the yield tends to be decreased due to a portion being left unetched.

For example, in the case where the piezoelectric film consists of lead zirconate titanate (PZT), a mixed solution of hydrofluoric acid and nitric acid, for example, is used as an etching solution, and the piezoelectric film is etched by being immersed in this etching solution for a few minutes. However, in this process, a zirconium component of the piezoelectric film tends to remain as a residue on a wafer, and can cause an electrical short circuit with an electrode film, a wiring layer, or the like, so that the wafer yield is decreased significantly.

The present invention was made in consideration of the above-described problems. There is a need for a piezoelectric element capable of improving a productivity and a yield without impairing the piezoelectric characteristic and a method for manufacturing the same.

A piezoelectric element according to an embodiment of the present invention is provided with a substrate, a first electrode film disposed on the substrate, a piezoelectric film disposed on the first electrode film, and a second electrode film disposed on the piezoelectric film, wherein the above-described piezoelectric film has a laminated structure composed of a plurality of crystallized piezoelectric thin films.

For the piezoelectric element, in the past, a piezoelectric film having a thickness suitable for attaining a desired piezoelectric characteristic was formed in a single step and, thereafter, a crystallization heat treatment (annealing treatment) was conducted. However, when a piezoelectric film having a thickness of 1 µm or more, for example, is formed in a single step, it is difficult to make the crystal orientation uniform in the layer thickness direction with high precision even when the annealing treatment is conducted. However, according to an embodiment of the present invention, the crystallinity of the piezoelectric film is enhanced by allowing the piezoelectric film to have a laminated structure composed of crystallized piezoelectric thin films. In this manner, the piezoelectric characteristic may be improved and, in addition, the patterning precision of the piezoelectric film by the wet etching method may be improved, so that excellent productivity and an improved yield may be achieved as compared with those obtained by the dry etching method.

A method for manufacturing such a piezoelectric film includes the steps of forming a first electrode film on a substrate, forming a piezoelectric film on the first electrode film, and forming a second electrode film on the piezoelectric film, wherein the piezoelectric film having a predetermined thickness is formed by repeated cycles of a film formation step of forming a piezoelectric thin film and a crystallization heat treatment step of heat-treating the piezoelectric thin film to effect crystallization. In this manner, a piezoelectric film exhibiting uniform crystallinity in the film thickness direction may be produced.

It is desirable that the thickness of the piezoelectric thin film per cycle of film formation is 350 nm or less. If the thickness of the piezoelectric thin film exceeds 350 nm, inadequate etching occurs due to reduction in the crystallinity, so that the yield may be decreased. Therefore, when the piezoelectric film having a film thickness of 1 µm or more is formed, at least four layers of piezoelectric thin films having a film thickness of 350 nm or less are laminated. Preferably, the temperature of the crystallization heat treatment is in the range of 700° C. or more and 800° C. or less.

The film formation of the piezoelectric thin film may be conducted in an atmosphere of mixed gas of an oxygen gas and an inert gas since the oxygen deficiency of the formed piezoelectric thin film may be reduced and, thereby, a piezoelectric film exhibiting an excellent piezoelectric characteristic may be produced. Preferably, the partial pressure of oxygen gas is 50% or more. It is further preferable that the film formation is conducted in an pure oxygen gas atmosphere without introducing the inert gas.

It is desirable that the piezoelectric thin film consists of lead zirconate titanate (PZT) since an excellent piezoelectric characteristic may be exhibited. Besides this, other perovskite oxide based piezoelectric materials may be used. A sputtering method may be used for forming the piezoelectric thin film.

On the other hand, it has been made clear that the crystal orientation of the piezoelectric film is able to be controlled by means of the film configuration of the first electrode film serving as a substrate. According to an embodiment of the present invention, the first electrode film is composed of a laminated film of a Ti layer and a Pt layer and, furthermore, the thickness of the Ti layer is in the range of 5 nm or more and 20 nm or less.

As described above, according to an embodiment of the present invention, a piezoelectric film exhibiting high crystallinity may be formed and, thereby, the processing of the piezoelectric film by patterning may be conducted with high precision. In this manner, a piezoelectric film exhibiting an excellent piezoelectric characteristic may be produced with high productivity.

BRIEF DESCRIPTION OF THE DRAWINGS

FIG. 5A is a plan view of a single crystal silicon substrate, and FIG. 5B is a sectional view of the section indicated by a line VB-VB shown in FIG. 5A.

FIG. 6A is a plan view, and FIG. 6B is a sectional view of the section indicated by a line VIB-VIB shown in FIG. 6A.

FIG. 7A is a plan view, and FIG. 7B is a sectional view of the section indicated by a line VIIB-VIIB shown in FIG. 7A.

FIG. 8A is a plan view, and FIG. 8B is a sectional view of the section indicated by a line VIIIB-VIIIB shown in FIG. 8A.

FIG. 10A is a plan view, and FIG. 10B is a sectional view of the section indicated by a line XB-XB shown in FIG. 10A.

FIGS. 11A and 11B are diagrams showing the relationship between the unit layer film thickness of the piezoelectric thin films constituting the above-described piezoelectric film and the percentage of non-defective products.

FIG. 15A is a plan view, and FIG. 15B is a sectional view of the section indicated by a line XVB-XVB shown in FIG. 15A.

FIG. 16A is a plan view, and FIG. 16B is a sectional view of the section indicated by a line XVIB-XVIB shown in FIG. 16A.

FIG. 19A is a plan view, and FIG. 19B is a sectional view of the section indicated by a line XIXB-XIXB shown in FIG. 19A.

FIG. 39A is a plan view of the entire substrate, and FIG. 39B is a magnified plan view showing the state of the above-described substrate.

FIG. 40A is a plan view of the entire substrate, and FIG. 40B is a magnified plan view showing the state of the above-described substrate.

FIG. 41A is a plan view of the entire substrate, and FIG. 41B is a magnified plan view showing the state of the above-described substrate.

FIG. 41A is a plan view of the entire substrate, and FIG. 41B is a magnified plan view showing the state of the above-described substrate.

FIG. 53 is a diagram showing an example of the relationship between the amount of shift of the coercive electric field and the piezoelectric characteristic of a piezoelectric subjected to a high-temperature polarization treatment.

DESCRIPTION OF THE PREFERRED EMBODIMENTS

The embodiments according to the present invention will be described below with reference to drawings. As a matter of course, the present invention is not limited to the following embodiments, and various modifications can be made based on the technical idea of the present invention.

First Embodiment

Figure 1A:
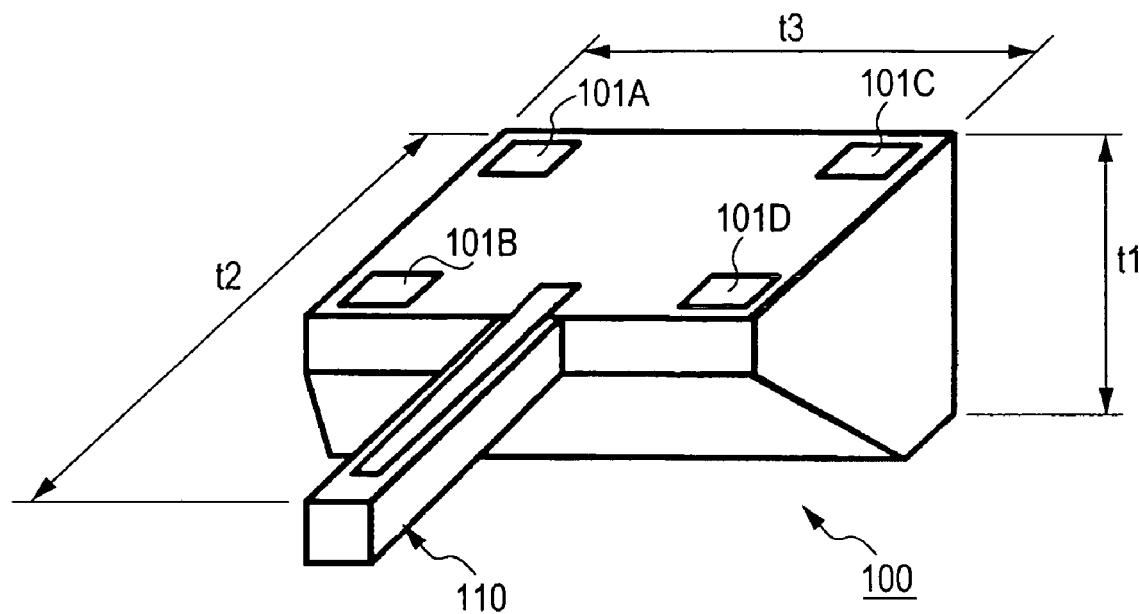
FIGS. 1A and 1B are schematic perspective views of a vibration gyro sensor element explained in a first embodiment of the present invention.
Figure 1B:
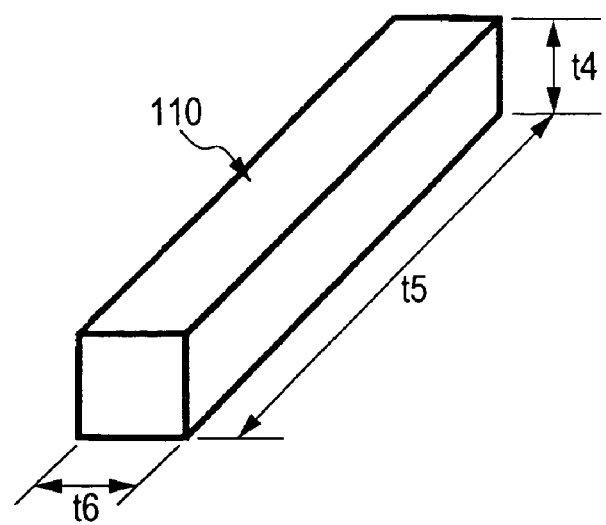

FIGS. 1A and 1B show a vibration gyro sensor element 100 serving as a piezoelectric element according to an embodiment of the present invention. FIG. 1A is a perspective external view of the entire vibration gyro sensor element 100, and FIG. 1B is a magnified perspective view of a vibrator 110 separate from the vibration gyro sensor element 100. As shown in FIGS. 1A and 1B, the vibration gyro sensor element 100 is provided with a so-called cantilever-shaped vibrator 110 cut from a silicon single crystal substrate. The vibrator 110 is formed into the shape of a quadrangular prism having a cross section in the shape of a rectangle when cut in a plane perpendicular to a longitudinal direction.

For the approximate size of the vibration gyro sensor element 100, the element thickness t1 is 300 μm, the element length t2 is 3 mm, and the element width t3 is 1 mm. For the size of a vibration beam, that is, the vibrator 110 that actually vibrates, the vibration beam thickness t4 is specified to be 100 μm, the vibration beam length t5 is specified to be 2.5 mm, and the vibration beam width t6 is specified to be 100 μm. When the vibration beam of this shape is vibrated, the resonant frequency is about 40 kHz. The above-described values are shown as one example, and it is possible to set them optimally depending on the frequency to be used and the size of a target element.

Figure 2:
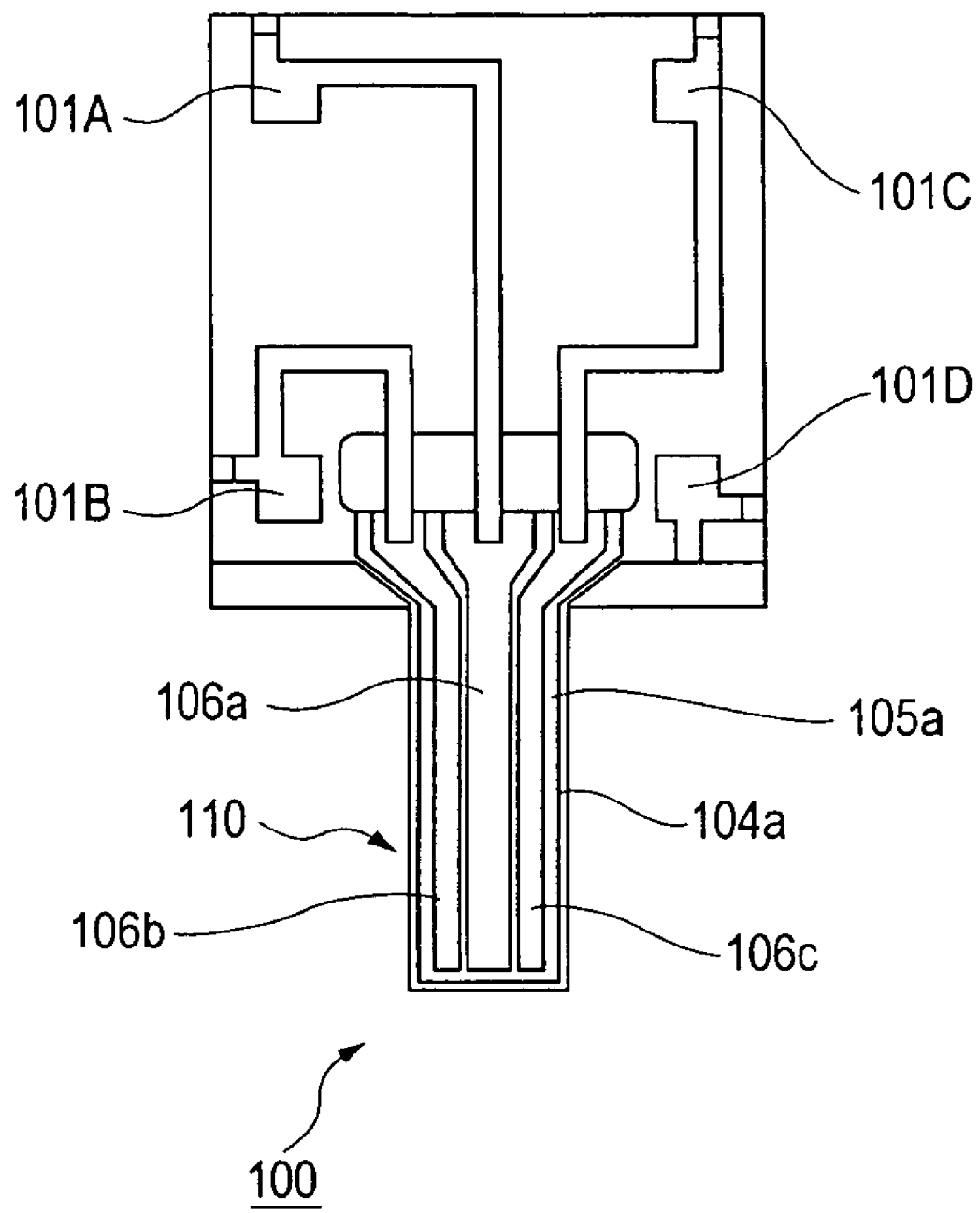
FIG. 2 is a schematic bottom view of the above-described vibration gyro sensor element.

The vibration gyro sensor element 100 is mounted on an IC substrate, although not shown in the drawing, and is used. The mounting surface (bottom surface) of the element 100 on the side facing the IC substrate is shown in FIG. 2.

A reference electrode 104a and a piezoelectric film 105a are laminated sequentially on the surface of the vibrator 110. A driving electrode 106a and a pair of detection electrodes 106b and 106c are disposed on the piezoelectric film 105a discretely and parallel to each other along a longitudinal direction of the vibrator 110. The driving electrode 106a, detection electrodes 106b and 106c, and reference electrode 104a are provided with wiring connection terminals 101A, 101B, 101C, and 101D, respectively.

The piezoelectric film 105a is a piezoelectric film composed of a piezoelectric ceramic material, e.g., lead zirconate titanate (PZT), or piezoelectric single crystal, e.g., quartz or LaTaO$_3$. The reference electrode 104a, the driving electrode 106a and the detection electrodes 106b and 106c are composed of a metal electrode, an electrically conductive oxide electrode, or the like. The reference electrode 104a corresponds to "a first electrode film" in the present invention, and the driving electrode 106a, and detection electrodes 106b and 106c correspond to "a second electrode film" in the present invention.

Figure 3:
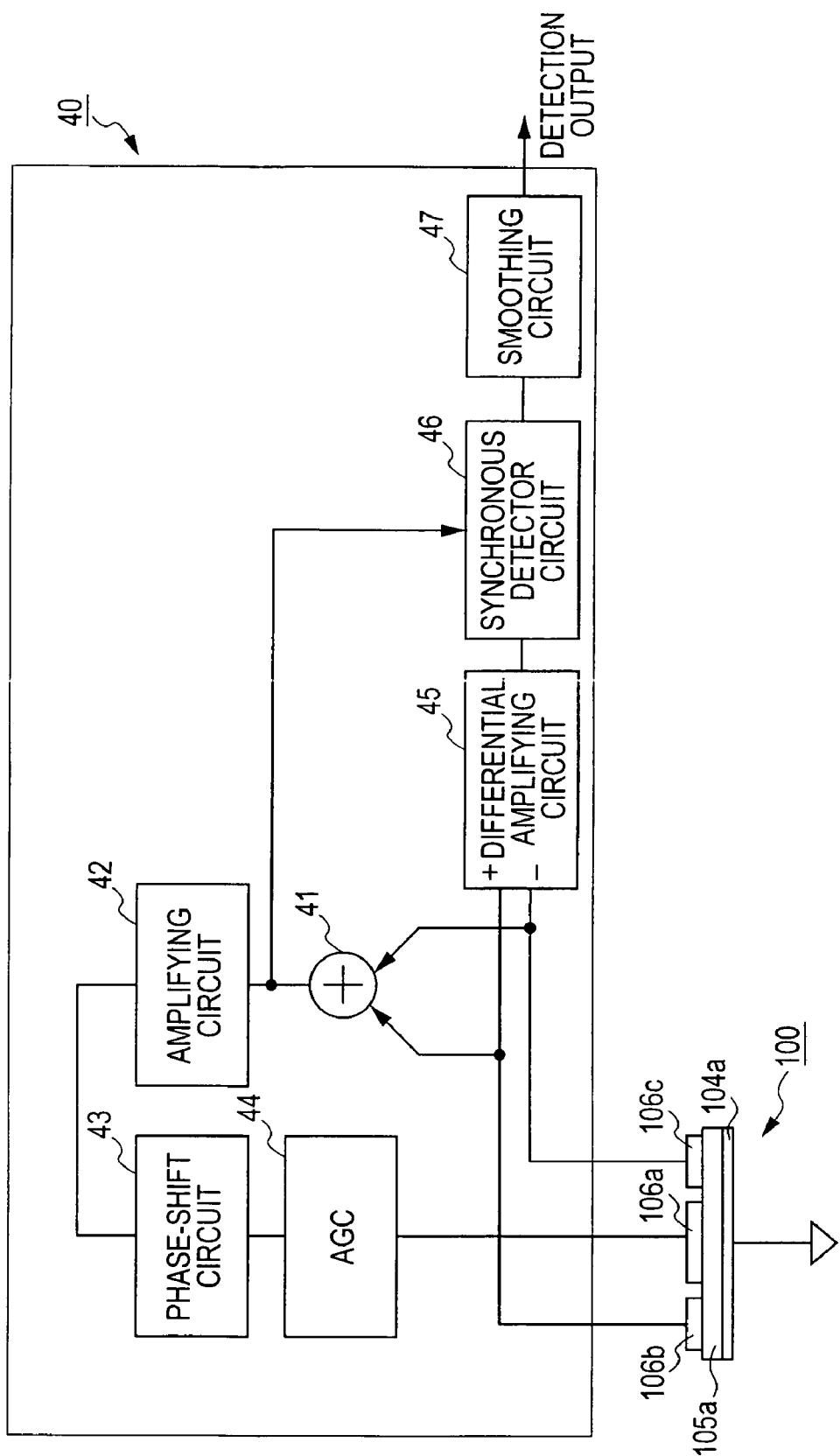
FIG. 3 is a block diagram showing the configuration of a drive detection circuit of the above-described vibration gyro sensor element.

The vibration gyro sensor element 100 is operated by being connected to an IC circuit 40 shown in FIG. 3, and functions as an angular velocity sensor (vibration gyro sensor) to detect a Coriolis force generated in accordance with an angular velocity. The IC circuit 40 is composed of IC circuit elements and other electronic components installed simultaneously on an IC substrate, on which the vibration gyro sensor element 100 is mounted.

The IC circuit 40 is provided with a summing circuit 41, an amplifying circuit 42, a phase-shift circuit 43, an auto gain controller (AGC) 44, a differential amplifying circuit 45, a synchronous detector circuit 46, and a smoothing circuit 47.

Each of the pair of detection electrodes 106b and 106c of the vibration gyro sensor element 100 is connected to the summing circuit 41 and the differential amplifying circuit 45. The driving electrode 106a of the vibration gyro sensor element 100 is connected to an output terminal of the AGC 44.

In the angular velocity sensor, a so-called phase-shift oscillation circuit is constituted by the summing circuit 41, the amplifying circuit 42, the phase-shift circuit 43, the AGC 44, and the vibration gyro sensor element 100. A voltage is applied between the reference electrode 104a and the driving electrode 106a of the vibration gyro sensor element 100 by the phase-shift oscillation circuit, so that the vibrator 110 is vibrated through self-excitation. The vibration direction of the vibrator 110 is a thickness direction of the vibrator 110.

In the angular velocity sensor, the pair of detection electrodes 106b and 106c are connected to the summing circuit 41 and the differential amplifying circuit 45, the output terminal of the differential amplifying circuit 45 is connected to the synchronous detector circuit 46, and the synchronous detector circuit 46 is connected to the smoothing circuit 47. These components and the piezoelectric film 105a function as a detection unit to detect the angular velocity of the vibrator 110.

That is, when an angular velocity is generated around the longitudinal direction of the vibrator 110 of the vibration gyro sensor element 100 while the vibrator 110 is vibrated through self-excitation by the above-described phase-shift oscillation circuit, the vibration direction of the vibrator 110 is changed by the Coriolis force. In this case, the output of one of the detection electrodes 106b and 106c is increased, and the output of the other is decreased. The change in the amount of any one output or both outputs is detected and measured by the IC circuit 40, so that the input angular velocity around the longitudinal direction of the vibrator 110 is detected.

Figure 4:
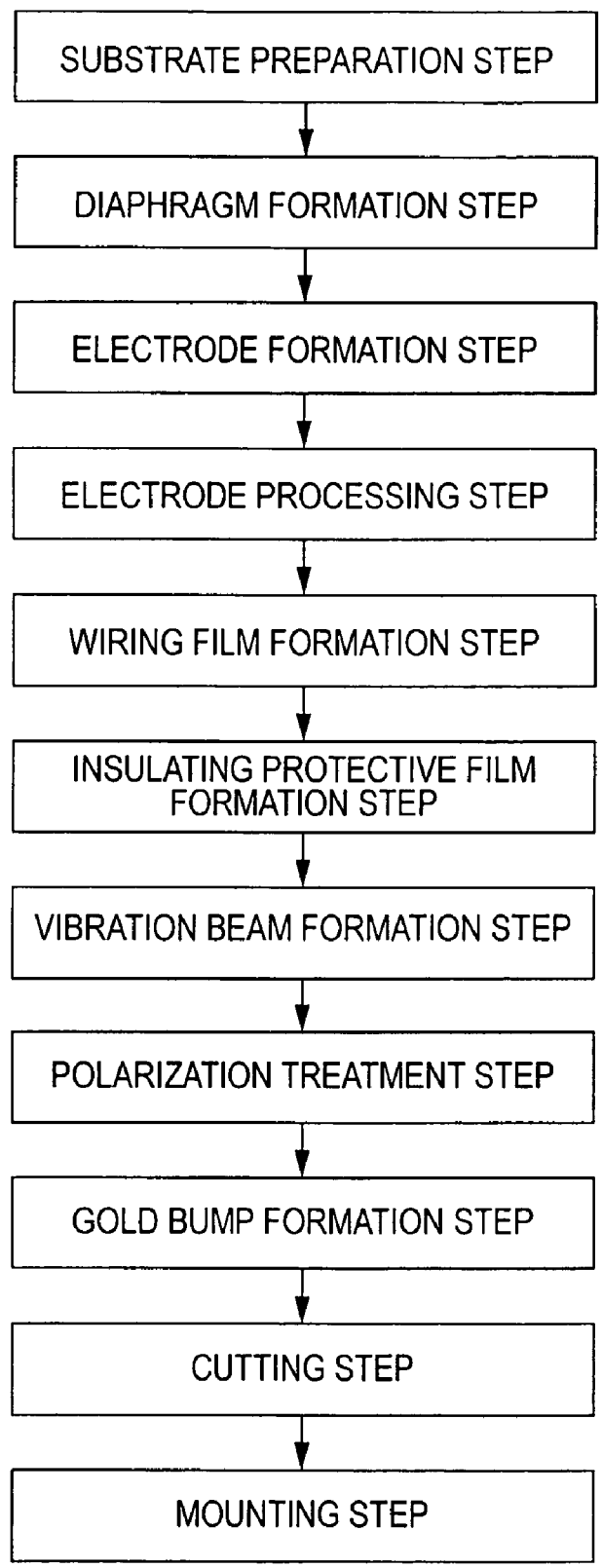
FIG. 4 is a main step flow diagram for explaining a method for manufacturing the above-described vibration gyro sensor element.

A manufacturing example of the vibration gyro sensor element 100 of the present embodiment having the above-described configuration will be described below. FIG. 4 shows a main step flow for explaining a method for manufacturing the vibration gyro sensor element 100.

Substrate Preparation Step

Figure 5A:
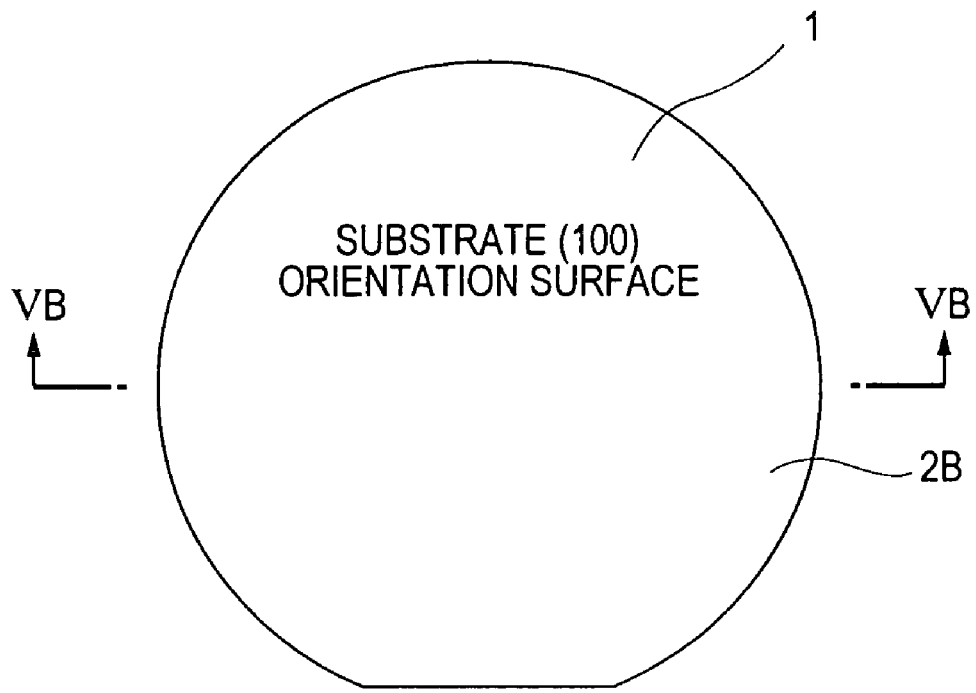
FIGS. 5A and 5B are diagrams for explaining a step of manufacturing the above-described vibration gyro sensor element.
Figure 5B:
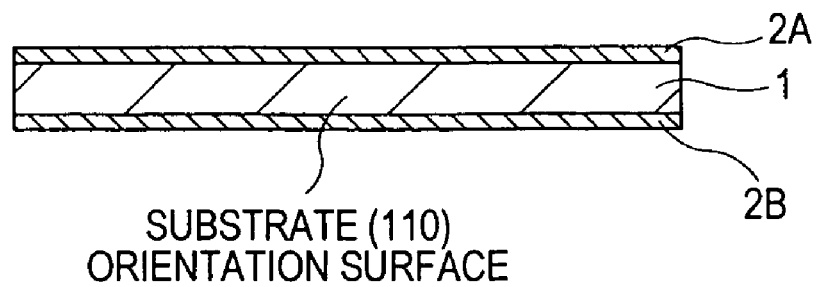

A Si substrate 1 as shown in FIGS. 5A and 5B is prepared. The size of the substrate 1 is set optimally in accordance with the type of thin film process utilized. In the present embodiment, a wafer having a diameter of 4 inches is used. The thickness of the substrate 1 is determined on the basis of the operability and the cost, but it is desirable that the thickness becomes larger than or equal to the thickness of the vibrator finally. In the present embodiment, the thickness is specified to be 300 μm.

Thermal oxidation films ($SiO_2$ films) 2A and 2B serving as protective masks in anisotropic wet etching are formed on either surface of the Si substrate 1. The thicknesses of the thermal oxidation films are set at will, and are specified to be about 0.3 μm in the present embodiment. An N type is adopted for the Si substrate 1, although it can also be selected at will. The substrate is cut in such a way that, with respect to the oriented surface of the Si substrate 1, a substrate wide-mouthed surface shown in FIG. 5A becomes a (100) orientated surface, and a surface shown in FIG. 5B, which is a cross section of the substrate 1, becomes a (110) surface.

Diaphragm Formation Step

Figure 6A:
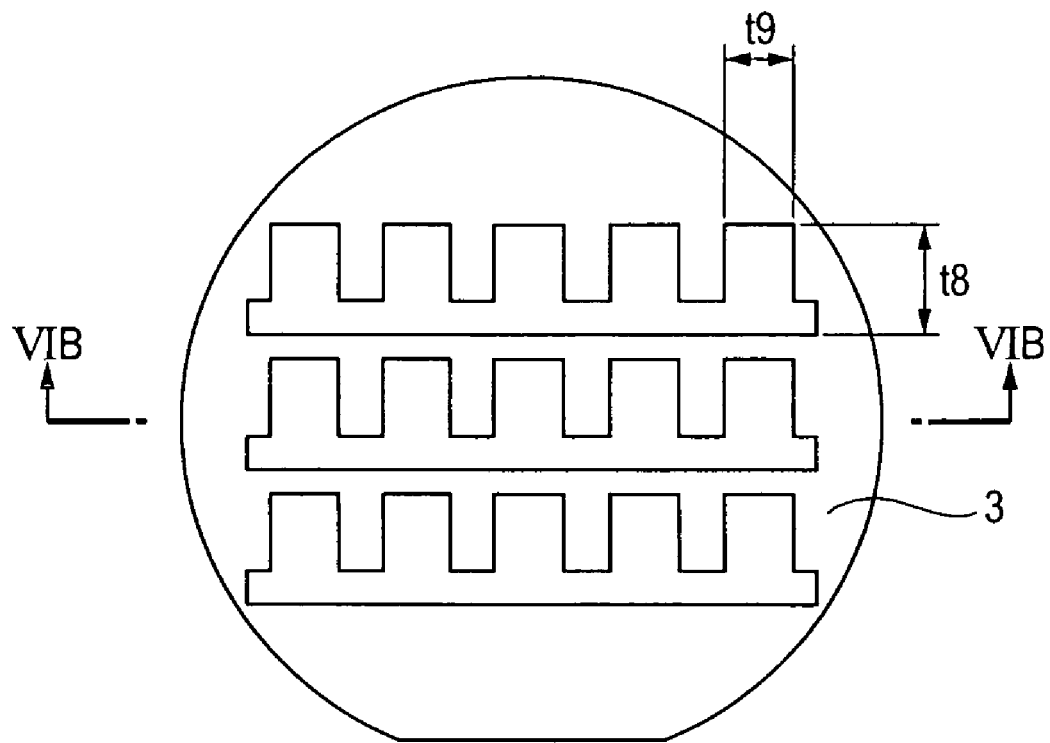
FIGS. 6A and 6B are diagrams showing the state in which a resist pattern film is disposed on the above-described substrate.
Figure 6B:
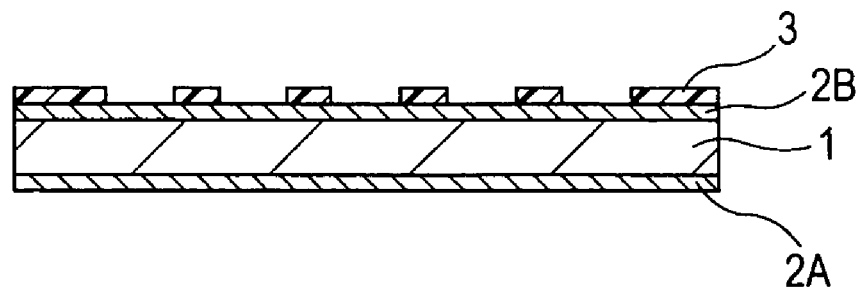

As shown in FIGS. 6A and 6B, in order to remove a part of the thermal oxidation film 2B on a back surface of the substrate 1, a resist pattern film 3 having an opening portion corresponding to the part to be removed is formed. A photolithography technology used in a usual semiconductor thin film formation process is used as a method for forming the resist pattern film 3. For example, OFPR-8600 produced by TOKYO OHKA KOGYO CO., LTD., is used as the resist material, although the type is not limited to this. The photolithography step is a technology of resist material application, prebaking, exposure, and development, which is widely used in a thin film formation step, and therefore, a detailed explanation will not be provided here. Although the photolithography technology is also used in the following process, detailed explanations of general steps will not be provided except for special methods for application.

Each of the opening portions shown in FIG. 6A corresponds to one element. The shape of the opening portion is determined on the basis of the final shape of the beam, the thickness of the substrate 1, and the etching width (indicated by reference numeral t7 shown in FIG. 34 and FIG. 35) in the formation of the beam shape (vibrator 110). The etching width t7, as described below, is specified to be 200 μm here.

Figure 9:
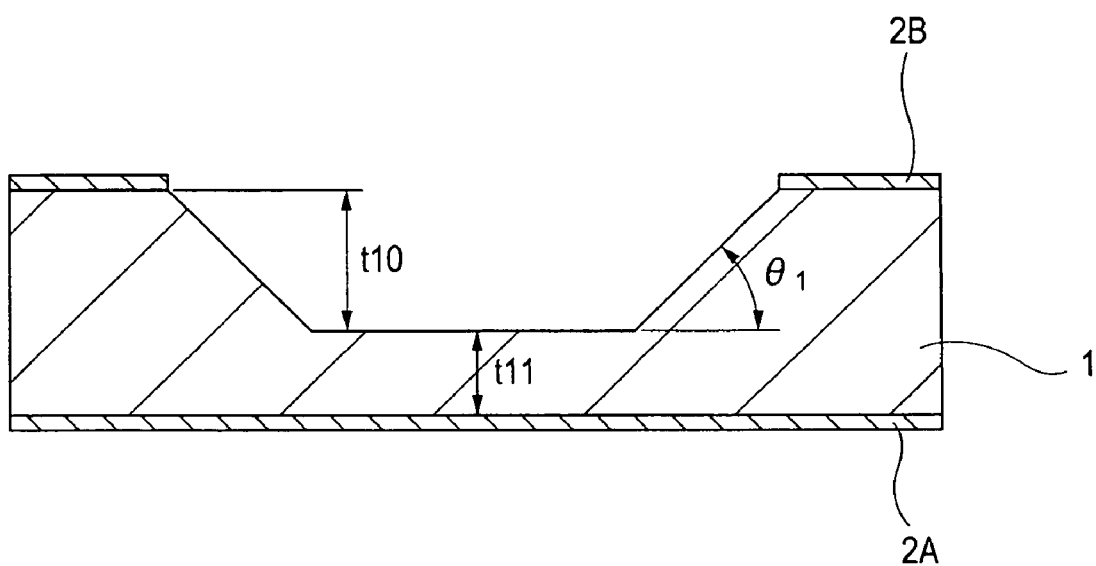
FIG. 9 is a magnified view of the portion W of the above-described substrate shown in FIG. 8.

With respect to the width direction of the opening portion (diaphragm width t9), the necessary width is, first of all, the vibration beam width t6+the etching width t7×2 (left and right sides). Furthermore, in the case where the thickness of the substrate 1 is 300 μm, the thickness of the vibration beam is 100 μm, and the substrate thickness of 300 μm is cut to the vibration beam thickness of 100 μm by a wet etching method, as described below, the diaphragm depth t10 is 200 μm and cutting is conducted at an angle of θ1=55°, as shown in FIG. 9. Therefore, the width corresponding thereto: t10×1/tan 55°=140 μm is added to the left and right sides. Consequently, the diaphragm width t9=t6+t7×2+140×2=100+200×2+140×2=780 μm holds. Likewise, the diaphragm length t8=vibration beam length t5+beam spacing t7+140×2=2,500+200+140×2=2,980 μm holds.

Figure 7A:
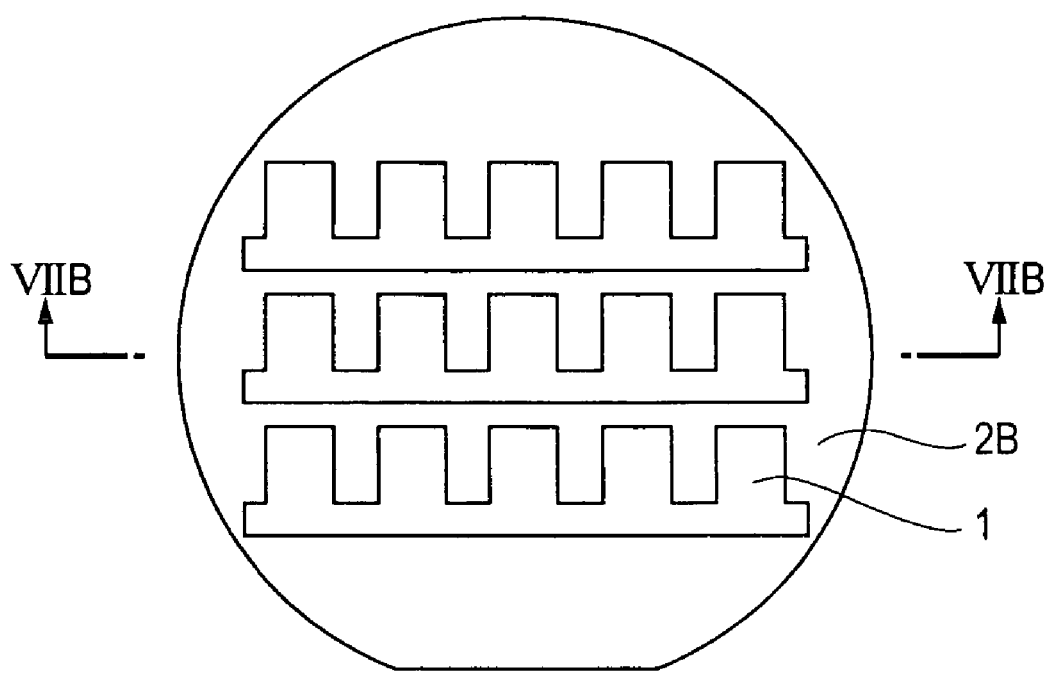
FIGS. 7A and 7B are diagrams showing the state in which a thermal oxidation film of the above-described substrate has been removed.
Figure 7B:
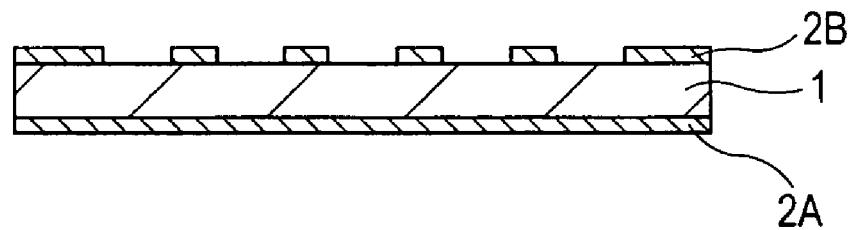

As shown in FIGS. 7A and 7B, the parts of a thermal oxidation film 2B, the parts corresponding to the above-described opening portions, are removed. The method for removal may be any one of physical etching, e.g., ion etching, and wet etching. However, the wet etching is desirable in consideration of the smoothness of an interface of the substrate 1 since only the thermal oxidation film 2B is removed. In the present embodiment, ammonium fluoride is used as a chemical solution for the wet etching. However, with respect to the wet etching, if the etching is conducted for a long time, the occurrence of so-called side etching is increased where etching proceeds from a side surface of the opening portion and, therefore, it is desirable that the etching is terminated at the point in time when only the thermal oxidation film 2B corresponding to the opening portions are removed.

Figure 8A:
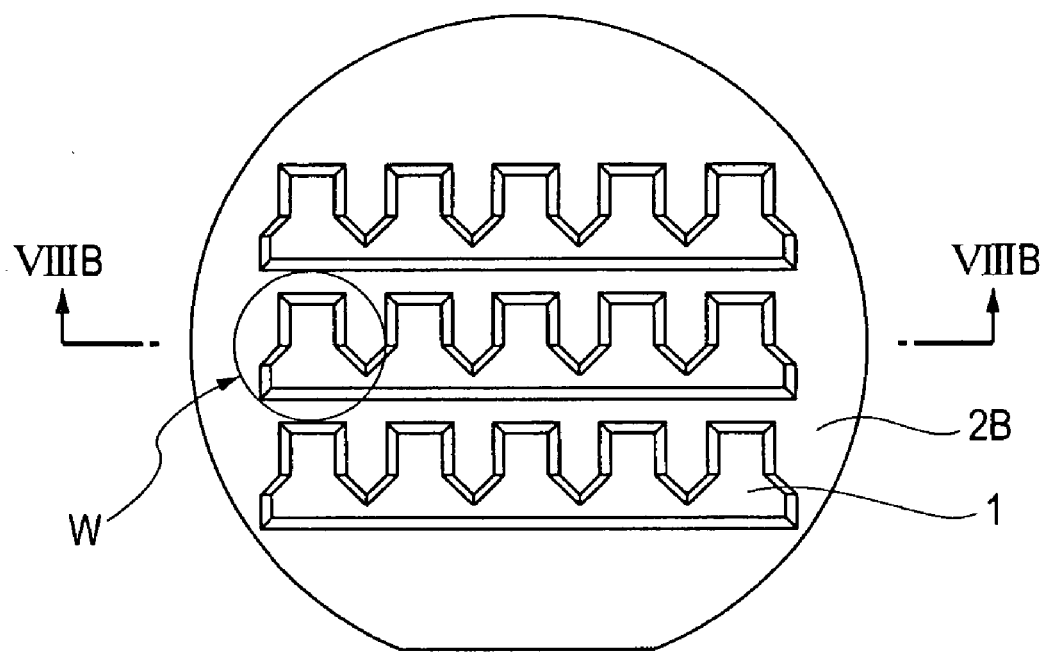
FIGS. 8A and 8B are diagrams showing the state in which anisotropic etching is applied to the above-described substrate.
Figure 8B:
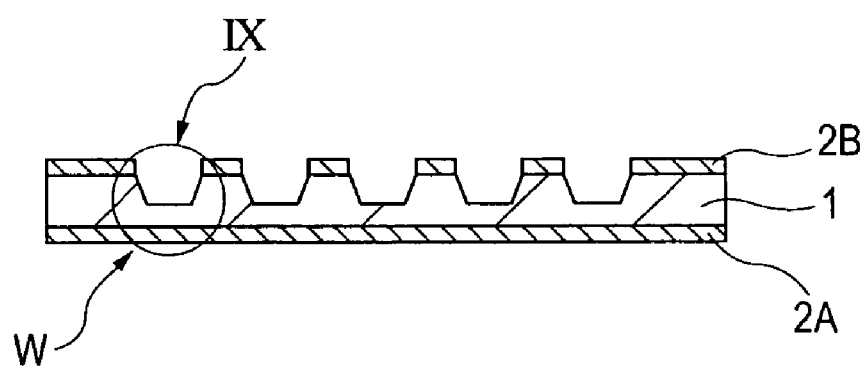

As shown in FIGS. 8A and 8B and FIG. 9, wet etching is applied to the substrate 1 exposed at the opening portions, so that the thickness of the substrate 1 corresponding to the opening portions is cut until a desired vibration beam thickness t4 is reached. In the present embodiment, a 20% solution of tetramethylammonium hydroxide (TMAH) is used for etching the substrate 1 consisting of Si. At this time, the solution temperature is maintained at 80° C., and immersion etching is conducted.

FIG. 9 is a magnified view of the portion W shown in FIG. 8. Etching is conducted under the above-described condition for about 6 hours in such a way that the amount of etching (diaphragm depth) t10 becomes 200 μm. With respect to the shape of the substrate 1 corresponding to the opening portion, edge portions are formed by this etching with a wet etching angle θ1 (=55°), as shown in FIG. 9. Alternatively, potassium hydroxide (KOH), ethylenediamine-pyrocatechol-water (EDP) solution, or the like other than TMAH may be used as the wet etching chemical solution. However, in the present embodiment, TMAH is adopted since the selection ratio of etching rate relative to the thermal oxidation films 2A and 2B is further increased.

In the present embodiment, wet etching, which takes advantage of the feature of Si, is adopted to cut the substrate until the vibration beam thickness is reached. However, the cutting method is selected at will, and is not limited to this method.

A diaphragm is formed in the above-described opening portion by the above-described method. The diaphragm thickness t11 left after the wet etching becomes equal to the vibration beam thickness t4 finally.

In the following description, one element indicated by W shown in FIGS. 8A and 8B will be described under magnification. In the drawings, the dimension ratio may be different from the actual dimension ratio for the sake of clarity of explanation. Hereafter, explanation will be made in which the diaphragm formed as described above is in the position with the opening portion and the thermal oxidation film 2B down, as shown in FIGS. 10A and 10B.

Electrode Film Formation Step

Figure 10A:
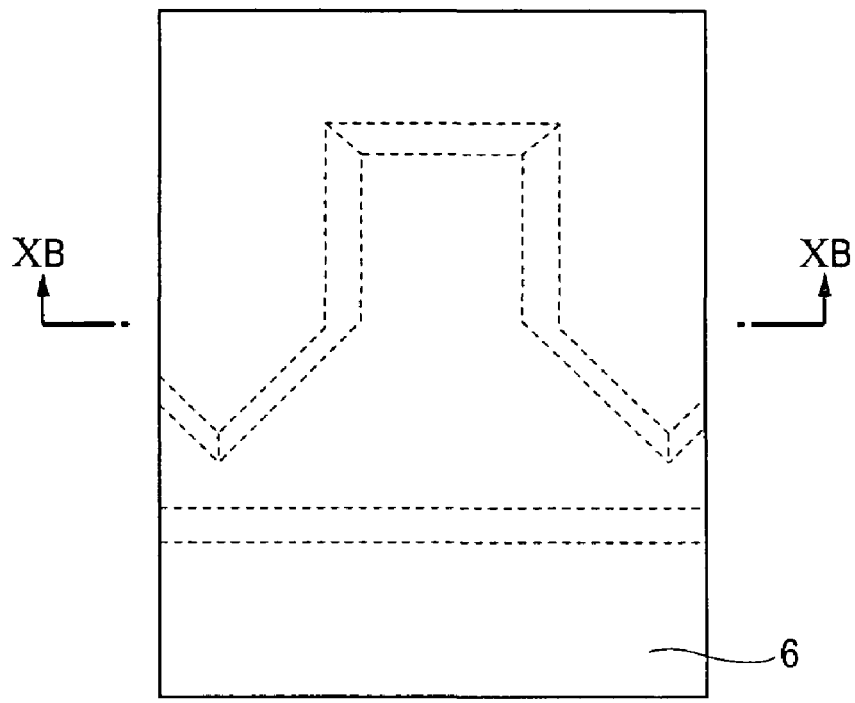
FIGS. 10A and 10B are magnified views showing the state of the above-described substrate provided with a lower electrode film, a piezoelectric film, and an upper electrode film.
Figure 10B:
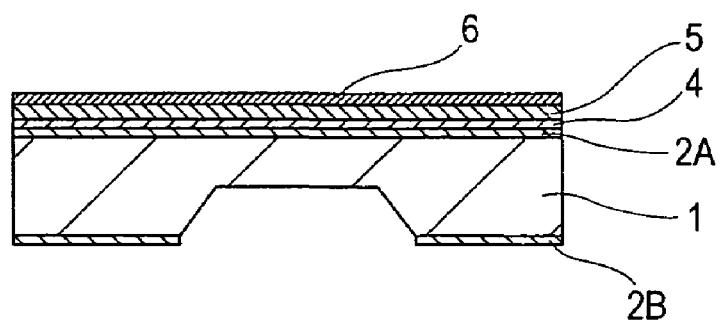

As shown in FIGS. 10A and 10B, a lower electrode film 4, a piezoelectric film 5, and an upper electrode film 6 are formed. The lower electrode film 4 corresponds to "a first electrode film", and the upper electrode film 6 corresponds to "a second electrode film". The lower electrode film 4 is specified to be a laminated film composed of a titanium (Ti) film (film thickness 20 nm) serving as a substrate film and a platinum (Pt) film (film thickness 100 nm) formed on the Ti film in order to improve the characteristics of the piezoelectric film. A film of metal, e.g., Au, rhodium (Rh), or rhenium (Re), other than Pt is applicable, and tantalum (Ta) or the like other than Ti is also applicable.

In the formation step of the lower electrode film 4, a Ti film of 20 nm thickness is formed by a magnetron sputtering apparatus, and a Pt film of 100 nm is formed on the above-described Ti film. Films of Ti and Pt are formed at a gas pressure of 0.5 Pa and at radio frequency (RF) powers of 1 kW and 0.5 kW, respectively. A Pt film is used as a substrate film of lead zirconate titanate, and the Ti film is formed to increase the adhesion therebetween.

The piezoelectric film 5 is formed. In the formation step of the piezoelectric film 5, a piezoelectric film of 1.4 μm thickness is formed with a magnetron sputtering apparatus by using an oxide target of Pb1.02(Zr0.53Ti0.47)O3 under the condition of ambient temperature, an oxygen gas pressure of 0.2 to 3 Pa, and an RF power of 0.1 to 5 kW. The method for forming the piezoelectric film 5 will be described below in detail.

In the formation step of the upper electrode film 6, a Pt film of 200 nm thickness is formed on a surface of the piezoelectric film 5 formed as described above. The above-described Pt film is formed with a magnetron sputtering apparatus under the condition of a gas pressure of 0.5 Pa and an RF power of 0.5 kW.

Method for Forming Piezoelectric Film

In the method for forming the piezoelectric film 5 of the present embodiment, a film formation step of forming a piezoelectric thin film consisting of lead zirconate titanate and having a layer thickness smaller than the thickness of the piezoelectric film 5 to be formed and a crystallization heat treatment (annealing) step of heat-treating the piezoelectric thin film to effect crystallization are conducted a plurality of times and, thereby, the piezoelectric film 5 having a predetermined thickness is formed. In this manner, the piezoelectric film 5 exhibiting the uniform crystallinity in the layer thickness direction is produced.

In the film formation step, the number of laminations of the piezoelectric thin film is specified to be seven, and the unit layer thickness is specified to be 200 nm. In the crystallization heat treatment step, an electric furnace is used, and the step is conducted in an oxygen atmosphere at a temperature in the range of 700° C. or more and 800° C. or less for 30 minutes.

With respect to a known piezoelectric element, a piezoelectric film having a thickness suitable for attaining a desired piezoelectric characteristic is formed in a single step and, thereafter, an annealing treatment is conducted. However, when a piezoelectric film having a thickness of 1 μm or more, for example, is formed in a single step, it is difficult to make the crystal orientation of the piezoelectric film uniform in the layer thickness direction even when the annealing treatment is conducted. Consequently, in the above-described embodiment of the present invention, the crystallinity of the piezoelectric film 5 is enhanced by forming the piezoelectric film 5 through lamination of a plurality of crystallized piezoelectric thin films. In this manner, the piezoelectric characteristic may be improved and, in addition, the yield may be improved by increasing the patterning precision in the processing step of the piezoelectric film 5, as described below.

FIG. 11A shows an experimental result indicating the percentage of non-defective products (wafer yield) with change in the film thickness per unit layer of the piezoelectric thin film in the case where the total lamination thickness of piezoelectric thin films (lead zirconate titanate) is specified to be 1.4 μm. FIG. 11B shows the relationship between the unit layer film thickness and the percentage of non-defective products at each point shown in FIG. 11A. Here, the deterioration of the percentage of non-defective products results from the deterioration of the piezoelectric characteristic. It is clear that the percentage of non-defective products is increased as the film thickness per application of the piezoelectric thin film is decreased (for example, 100 nm×14 times, 200 nm×7 times). When the film thickness of the piezoelectric thin film exceeds 350 nm, at which the number of laminations is four, the percentage of non-defective products is decreased significantly. Therefore, it is desirable that the unit layer film thickness of lamination of the piezoelectric thin film is 350 nm or less.

The total lamination thickness of piezoelectric thin films is not limited to that in the above-described example. In the case where the film thickness per unit layer is 350 nm, three layers are laminated when the total lamination thickness of the piezoelectric film is 1 μm, and two layers are laminated when the total lamination thickness is 700 nm.

On the other hand, the oxygen deficiency tends to occur in the film formation of lead zirconate titanate. If the amount of oxygen taken into the film is small, the insulating property may be deteriorated and a favorable piezoelectric characteristic may not be exhibited. Therefore, in the present embodiment, the piezoelectric thin film consisting of lead zirconate titanate is formed in an oxygen gas atmosphere. Here, the oxygen gas atmosphere refers to an atmosphere of a mixed gas of an oxygen gas and an inert gas (argon or the like) or an atmosphere of a pure oxygen gas.

Table 1 shows the vibration amplitudes of vibrators including their respective piezoelectric films formed by changing the mixing ratio of oxygen and argon under the film formation condition of lead zirconate titanate. A larger value of amplitude indicates a more favorable piezoelectric characteristic, and a vibrator exhibiting the magnitude of amplitude of 35 μm or more is evaluated as a sample at the level of a non-defective product. In general, the detection sensitivity to the Coriolis force becomes better as the mass of the vibrator or the amplitude of the vibrator is increased. For the vibration gyro sensor element 100 having the above-described element shape or element dimension of the present embodiment, since there is a limit of increase in mass, the amplitude is set at a large value and, thereby, predetermined detection sensitivity is ensured. In this example, a lower limit of the amplitude to ensure a predetermined detection sensitivity is set at 35 μm.

TABLE 1

| Film formation condition | Amplitude (μm) |
|---|---|
| Film formation in 100% oxygen | 52 |
| Film formation in 95% oxygen and 5% argon | 50 |
| Film formation in 90% oxygen and 10% argon | 50 |
| Film formation in Ar/50% oxygen | 35 |
| Film formation in Ar/15% oxygen | 15 |

As a result, it becomes possible to produce a piezoelectric element capable of exhibiting a desired vibration characteristic at an oxygen gas partial pressure of 50% or more. In particular, a more favorable vibration characteristic may be exhibited as the oxygen gas partial pressure is increased.

A Pb content in a target is important for the film formation of the piezoelectric thin film in an atmosphere of 100% oxygen gas. As is clear from Table 2, when the amount of Pb is 1.01 relative to Zr/Ti, the resulting piezoelectric film is not a perovskite phase exhibiting a piezoelectric characteristic, but a pyrochlore phase is deposited, so that the piezoelectric characteristic is deteriorated.

TABLE 2

| Pb content | Presence or absence of pyrochlore phase |
|---|---|
| 1.1 | absence |
| 1.02 | absence |
| 1.01 | presence |
| 1 | presence |

Furthermore, as shown in Table 3, when a target containing an excessive amount of Pb of 1.2 or more is used, the value of dielectric loss, which indicates the insulating property, is increased. This is because the film structure of lead zirconate titanate becomes sparse.

TABLE 3

| Pb content | Dielectric loss |
|---|---|
| 1.3 | 0.25 |
| 1.2 | 0.2 |
| 1.1 | 0.1 |
| 1 | 0.09 |

Figure 12:
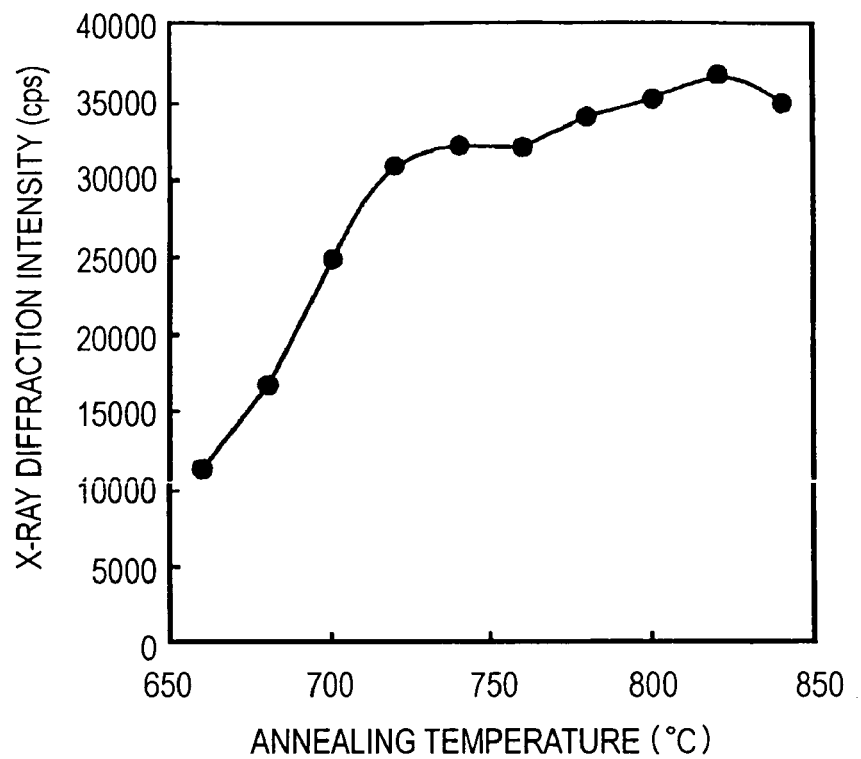
FIG. 12 is a diagram showing the relationship between the annealing temperature of the piezoelectric film and the X-ray diffraction intensity.

FIG. 12 shows the measurement result of the X-ray diffraction intensity of the (111) surface of a perovskite phase of a piezoelectric thin film (lead zirconate titanate) where the annealing temperature is changed. The X-ray diffraction intensity indicates the peak intensity of the X-ray diffraction pattern. The amount of change in diffraction intensity becomes small in the vicinity of an annealing temperature of 700° C. This refers to the fact that the crystallization of the piezoelectric thin film reaches substantially saturation at the annealing temperature of 700° C. or more. The diffraction intensity is increased again at 750° C. or more. This indicates that the crystallinity of the piezoelectric thin film is influenced by the development of crystallization of a Pt layer (lower electrode film) serving as a substrate.

Figure 13:
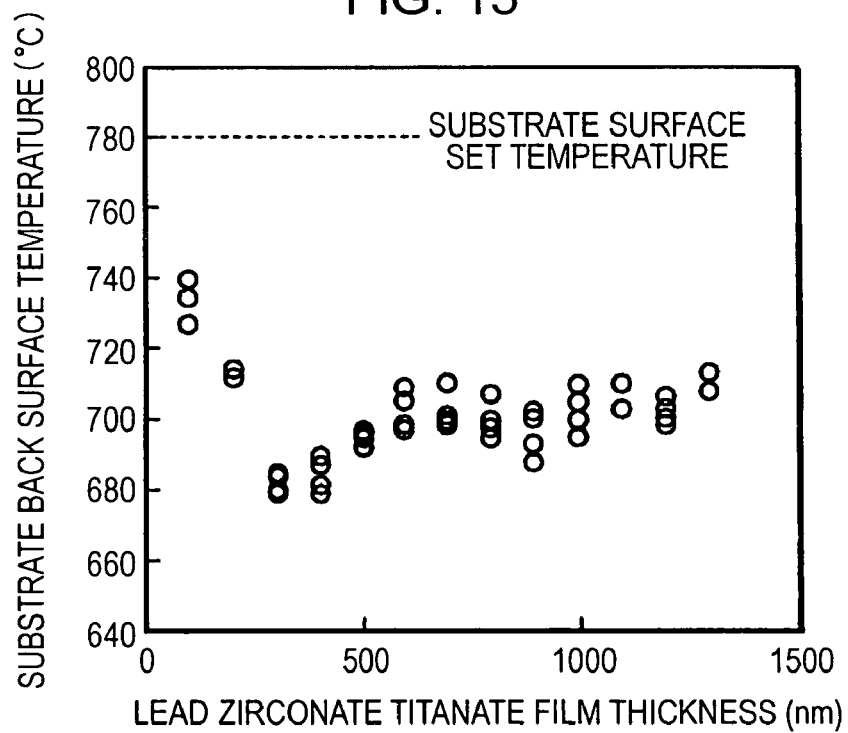
FIG. 13 is a diagram showing the relationship between the thickness of the piezoelectric film and the substrate back surface temperature.

FIG. 13 shows the relationship between the change in film thickness of the piezoelectric thin film and the substrate back surface temperature in crystallization annealing. A dotted line indicates a set value (780° C.) of a thermocouple for controlling the temperature of the substrate surface. The temperature of the substrate back surface is varied depending on the film thickness of lead zirconate titanate on the substrate surface. This is because the color of lead zirconate titanate on the surface is varied depending on the film thickness and the infrared absorptivity is varied. Therefore, an actual annealing temperature is varied when piezoelectric films having different film thicknesses are formed. Consequently, in the present embodiment, the temperature is controlled by using the temperature of the substrate back surface in the above-described crystallization annealing treatment.

Figure 14:
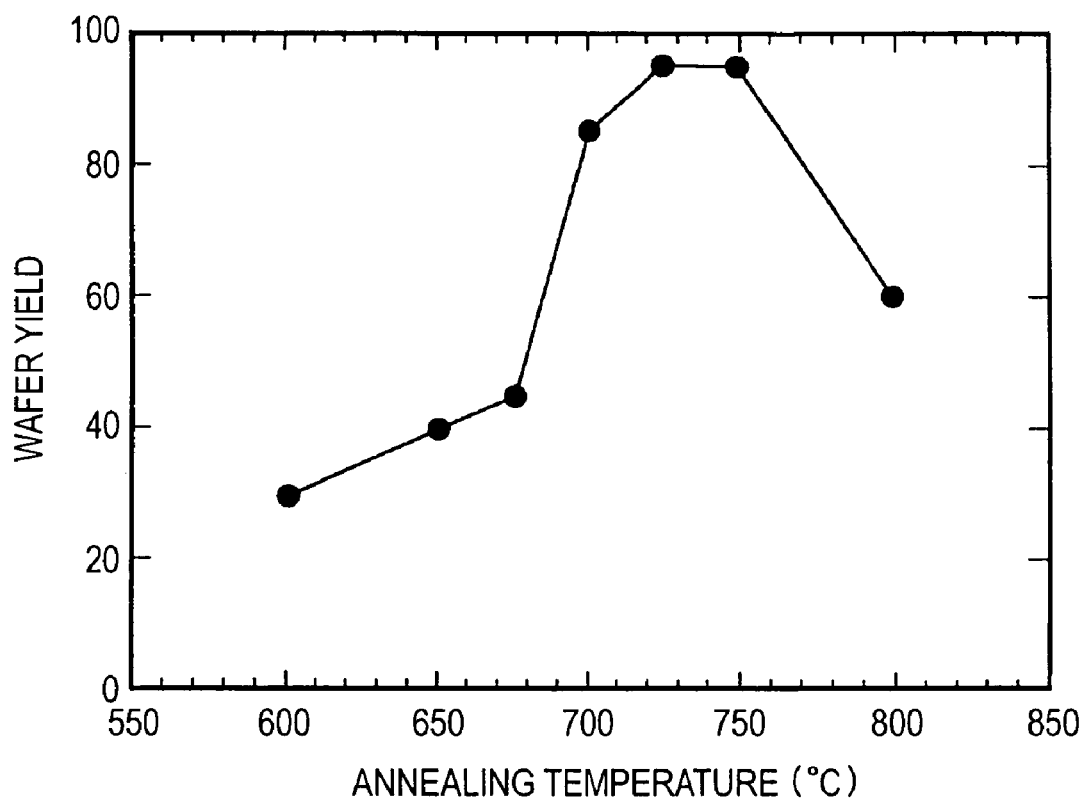
FIG. 14 is a diagram showing the relationship between the annealing temperature of the piezoelectric film and the yield.

FIG. 14 shows the percentage of non-defective products (wafer yield) when the annealing temperature is changed. Here, the percentage of non-defective products refers to a proportion of elements having a predetermined piezoelectric characteristic among a plurality of elements produced from one wafer. When the annealing temperature is 700° C. or less, the percentage of non-defective products is deteriorated. The reason for this is believed that the piezoelectric characteristic is deteriorated since the crystallization of lead zirconate titanate is inadequate. Conversely, the percentage of non-defective products tends to be deteriorated at an annealing temperature in the vicinity of 800° C. Although this may be because of deposition of a pyrochlore phase, it is also believed that some portions are left unetched in the piezoelectric film and, thereby, the percentage of non-defective products is deteriorated. As is clear from the result shown in FIG. 14, an optimum range of the annealing temperature is 700° C. or more and 800° C. or less, a preferable range is 700° C. or more and 750° C. or less, and a further preferable range is 725° C. or more and 750° C. or less.

As described above, preferably, the annealing temperature of lead zirconate titanate is in the range of 700° C. or more and 800° C. or less. Preferably, the annealing treatment is conducted in an oxygen gas atmosphere.

Electrode Film Processing Step

Figure 15A:
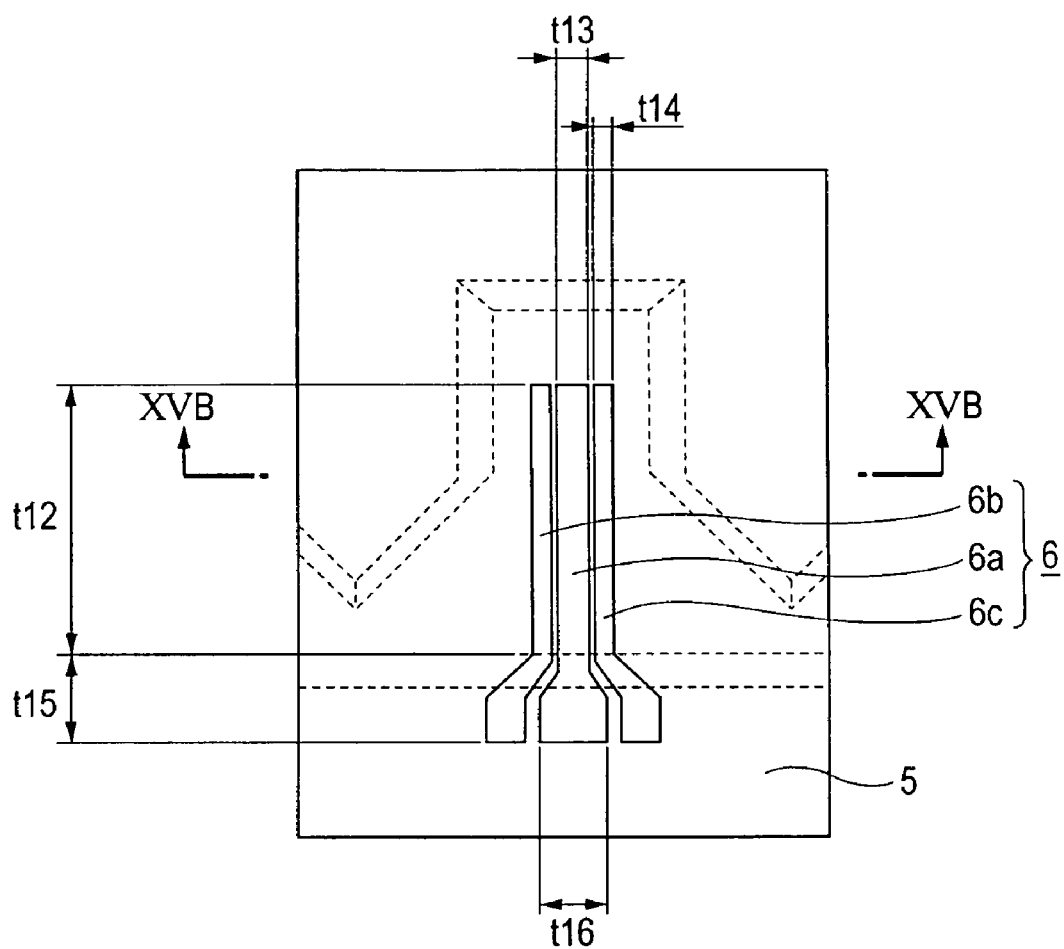
FIGS. 15A and 15B are magnified views showing the state of the above-described substrate provided with a driving electrode and detection electrodes.
Figure 15B:
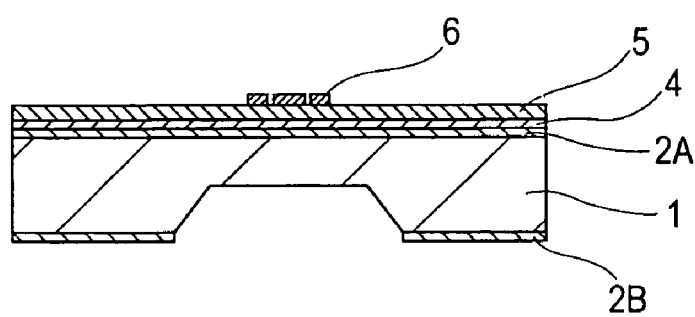

As shown in FIGS. 15A and 15B, the formed upper electrode film 6 is processed into a predetermined shape. The upper electrode film 6 is divided into three parts, as shown in FIG. 15A. The center thereof is a driving F electrode 6a for generating a power for driving a vibration beam, and detection electrodes 6b and 6c for detecting the Coriolis force are disposed on the left and right sides thereof. The center of the driving electrode in the width direction aligns with the center of the vibration beam, and the left and right detection electrodes are formed symmetrically. Wiring connection portions are disposed at the ends of linear portions of the upper electrode film 6.

In the present embodiment, the driving electrode width t13 is specified to be 50 μm, the detection electrode width t14 is specified to be 10 μm, the upper electrode length t12 is specified to be 2 mm, and the spacings between the driving electrode 6a and the detection electrodes 6b and 6c are specified to be 5 μm. These dimensions are specified at will, but the dimensions are adjusted within the range of a final size of the vibration beam. The shapes of portions connected to wiring patterns described below are determined at will. In the present embodiment, the connection portion width t16 is specified to be 50 μm, and the connection portion length t15 is specified to be 50 μm.

For the method for processing the upper electrode film 6, a desired resist pattern film is formed by using a photolithography technology and, thereafter, unnecessary portions are removed from the upper electrode film 6 by ion etching. The method for processing the upper electrode film 6 is not specifically limited.

Figure 16A:
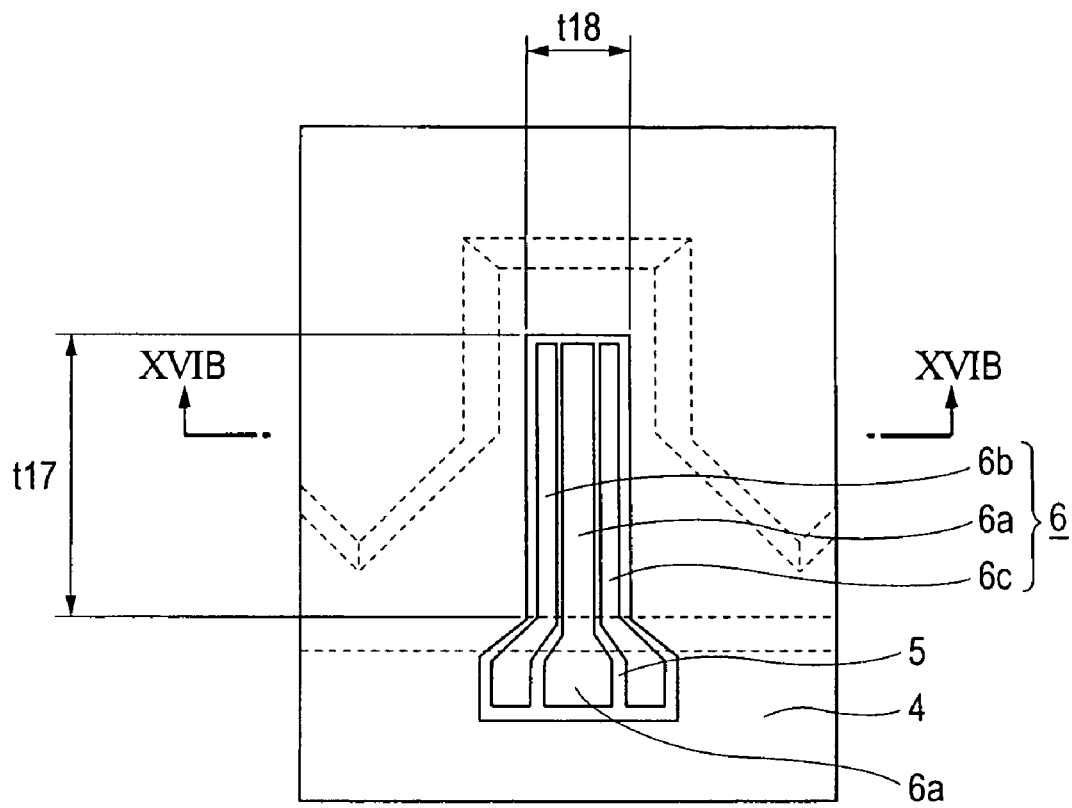
FIGS. 16A and 16B are magnified views showing the state of the above-described substrate provided with a piezoelectric film.
Figure 16B:
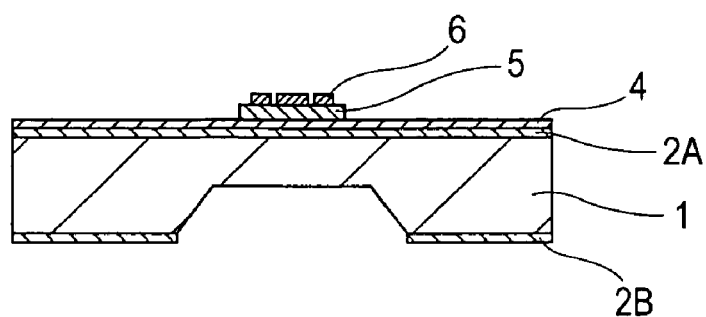

As shown in FIGS. 16A and 16B, the piezoelectric film 5 is processed into a predetermined shape. The shape is determined at will as long as the piezoelectric film 5 has a shape that covers the upper electrode film 6 completely. In the present embodiment, the piezoelectric film length t17 is specified to be 2.2 mm, and the piezoelectric film width t18 is specified to be 90 μm. Here, the center of the piezoelectric film in the width direction is allowed to align with the center of the vibration beam. It is desirable that the piezoelectric film width t18 is smaller than or equal to the vibration beam width t4. The piezoelectric film 5 is processed to have a width of 5 μm from the outer perimeter of the upper electrode film 6. This width is set at will on the basis of the shape and the size of the entire element.

In the present embodiment, the Pt film is used as the substrate film (lower electrode film) of lead zirconate titanate, as described above. The Ti film is formed for the purpose of enhancing the adhesion between the Pt film and the silicon substrate. Here, an aging test of the piezoelectric element is conducted by using a clean oven at 260° C. (for 10 minutes) where the film thickness of the Ti film is changed. As is clear from the result shown in FIG. 17, the change in piezoelectric displacement between before and after the aging test becomes smaller as the Ti film thickness is decreased. Therefore, the piezoelectric element becomes insensitive to the temperature change of a use environment, and a piezoelectric element exhibiting a high degree of reliability in the use at high temperatures as well may be produced.

Figure 17:
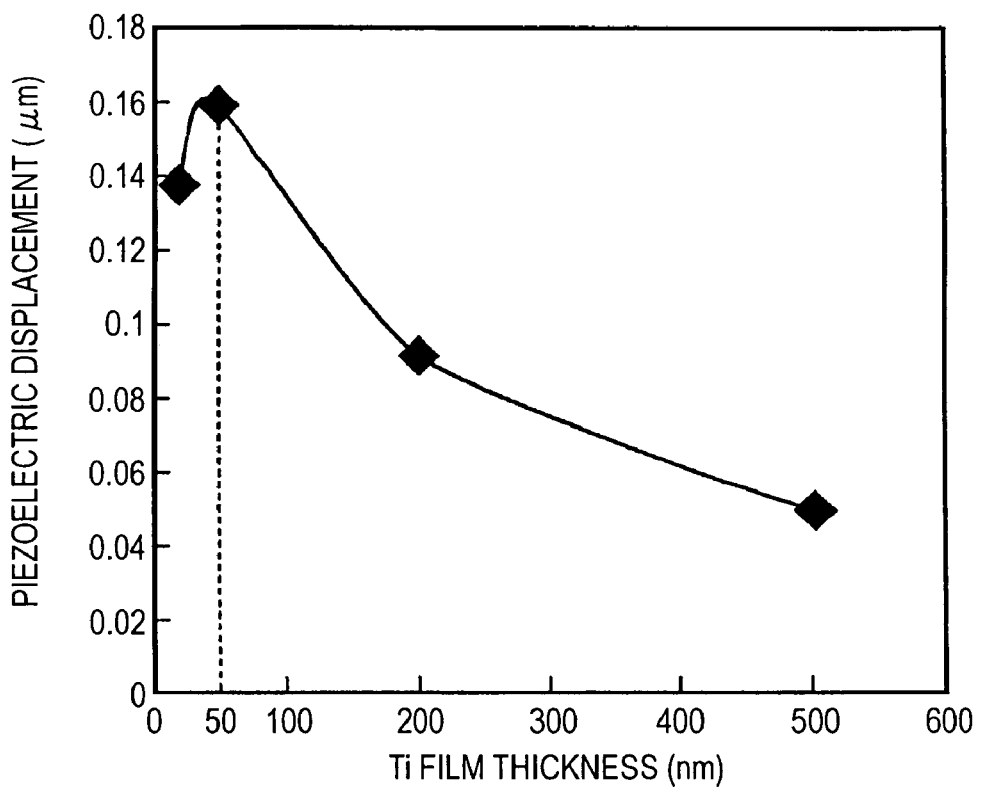
FIG. 17 is a diagram showing the relationship between the thickness of a Ti layer and the piezoelectric displacement.
Figure 18:
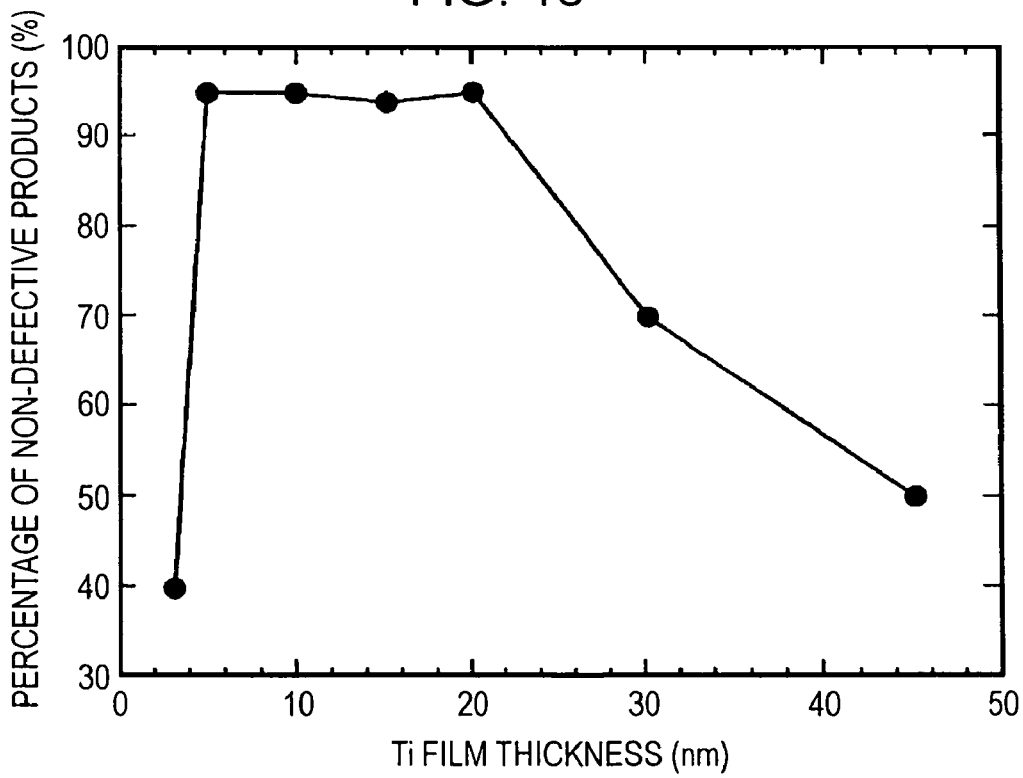
FIG. 18 is a diagram showing the relationship between the thickness of a Ti layer and the percentage of non-defective products.

FIG. 17 shows the relationship between the Ti film thickness and the piezoelectric displacement of the element. As shown in FIG. 17, when the film thickness of the Ti layer exceeds 50 nm, the piezoelectric displacement is decreased sharply. FIG. 18 shows the relationship between the film thickness of the Ti layer and the percentage of non-defective products (wafer yield). When the film thickness of the Ti layer is within the range of 5 nm or more and 20 nm or less, a high percentage of non-defective products is exhibited. The reason for this is believed to be that the crystal orientation of the piezoelectric film is enhanced by forming the Ti layer within the above-described range and, therefore, patterning processing by etching can be conducted with a high precision.

On the other hand, the reason the yield is decreased when the film thickness of the Ti layer is less than 5 nm or more than 20 nm is believed to be that the crystal orientation of the piezoelectric film is reduced and, therefore, a Zr component of lead zirconate titanate is left unetched. As a result, the portion being left unetched may function as a cover agent (mask) during etching of the lower electrode film, and an electrode pattern may not be formed into a desired shape, so that a short circuit may occur between the electrodes.

For the method for processing the piezoelectric film 5, a resist pattern film in the shape of a piezoelectric portion is formed by using a photolithography technology and, thereafter, in the present embodiment, removal is conducted by wet etching with fluoro-nitric acid solution. The removal method is determined at will, and a physical removal method by ion etching and a chemical removal method by reactive ion etching (RIE) may be suggested.

Figure 19A:
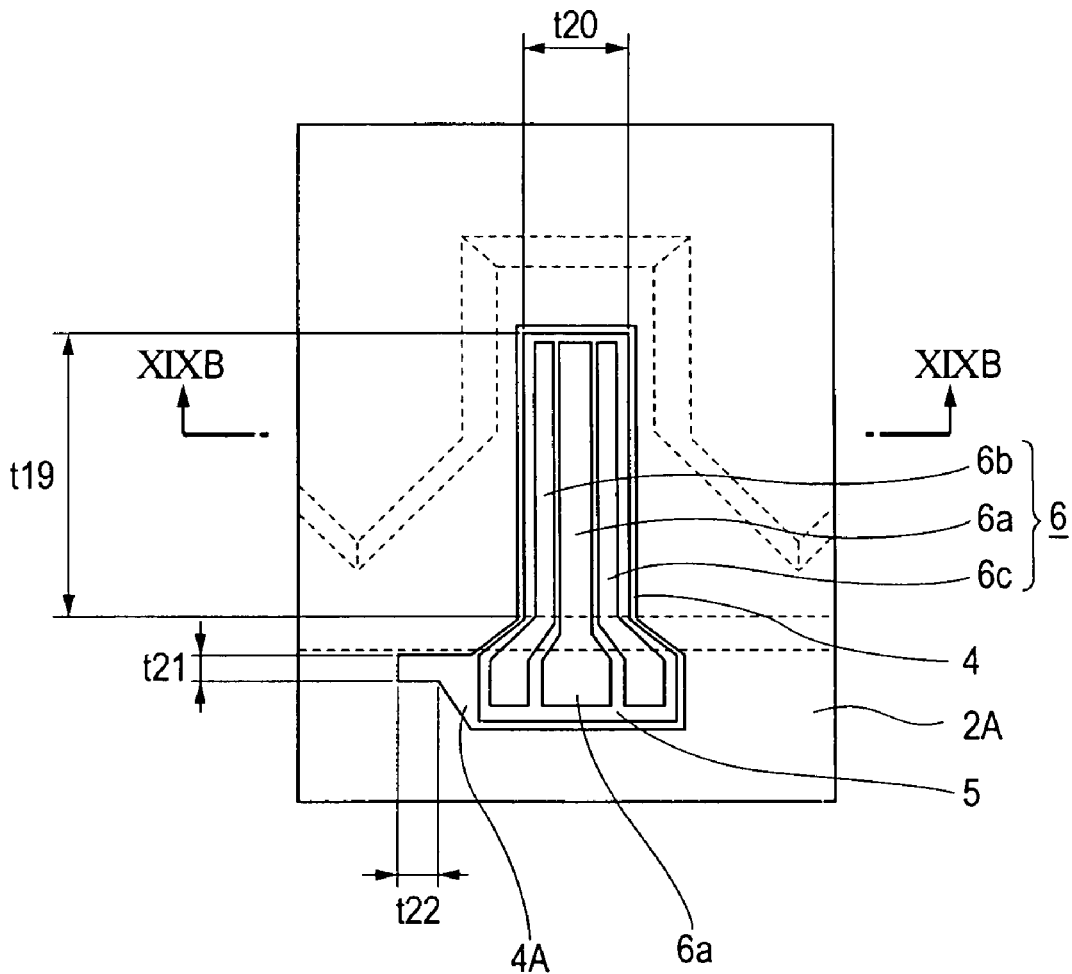
FIGS. 19A and 19B are magnified views showing the state of the above-described substrate provided with a lower electrode film.
Figure 19B:
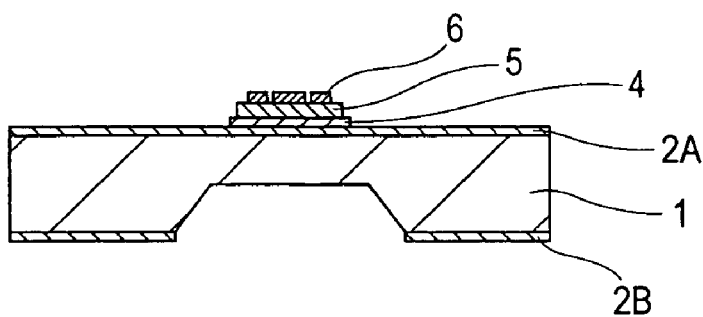

As shown in FIGS. 19A and 19B, the lower electrode film 4 is processed into a predetermined shape. The shape is determined at will as long as the lower electrode film 4 has a shape that covers the piezoelectric film 5 completely. In the present embodiment, the lower electrode length t19 is specified to be 2.3 mm, and the lower electrode width t20 is specified to be 94 μm. Here, the center of the lower electrode in the width direction is allowed to align with the center of the vibration beam. It is desirable that the lower electrode width t20 is smaller than or equal to the vibration beam width t4. The lower electrode film 4 is processed to have a width of 5 μm from the outer perimeter of the piezoelectric film 5. This width is set at will on the basis of the shape and the size of the entire element. As shown in FIG. 19A, a lower electrode connection portion 4A is disposed in order to electrically connect the lower electrode film 4 to the outside. Since it is desirable that the lower electrode connection portion 4A ensures an area suitable for being drawn out by a wiring pattern in the following step, the lower electrode connection portion length t21 is specified to be 200 μm, and the lower electrode connection portion width t22 is specified to be 100 μm.

For the method for processing the above-described lower electrode film 4, a resist pattern film in the shape of the lower electrode portion is formed by using a photolithography technology and, thereafter, unnecessary portions are removed by ion etching. This processing method is also determined at will, and is not limited to the ion etching.

Wiring Film Formation Step

Figure 20:
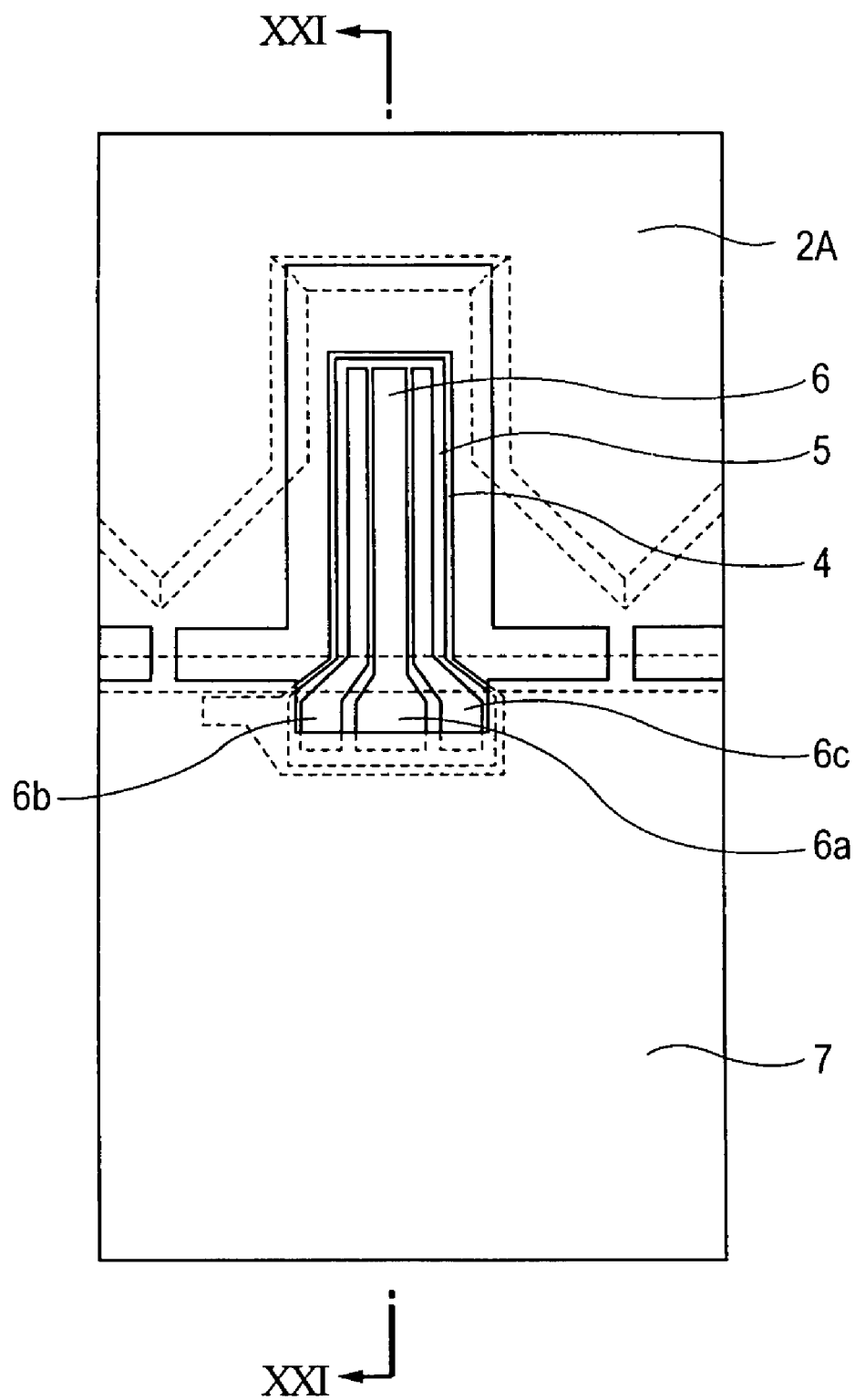
FIG. 20 is a magnified plan view showing the state of the above-described substrate provided with a wiring substrate film.
Figure 21:
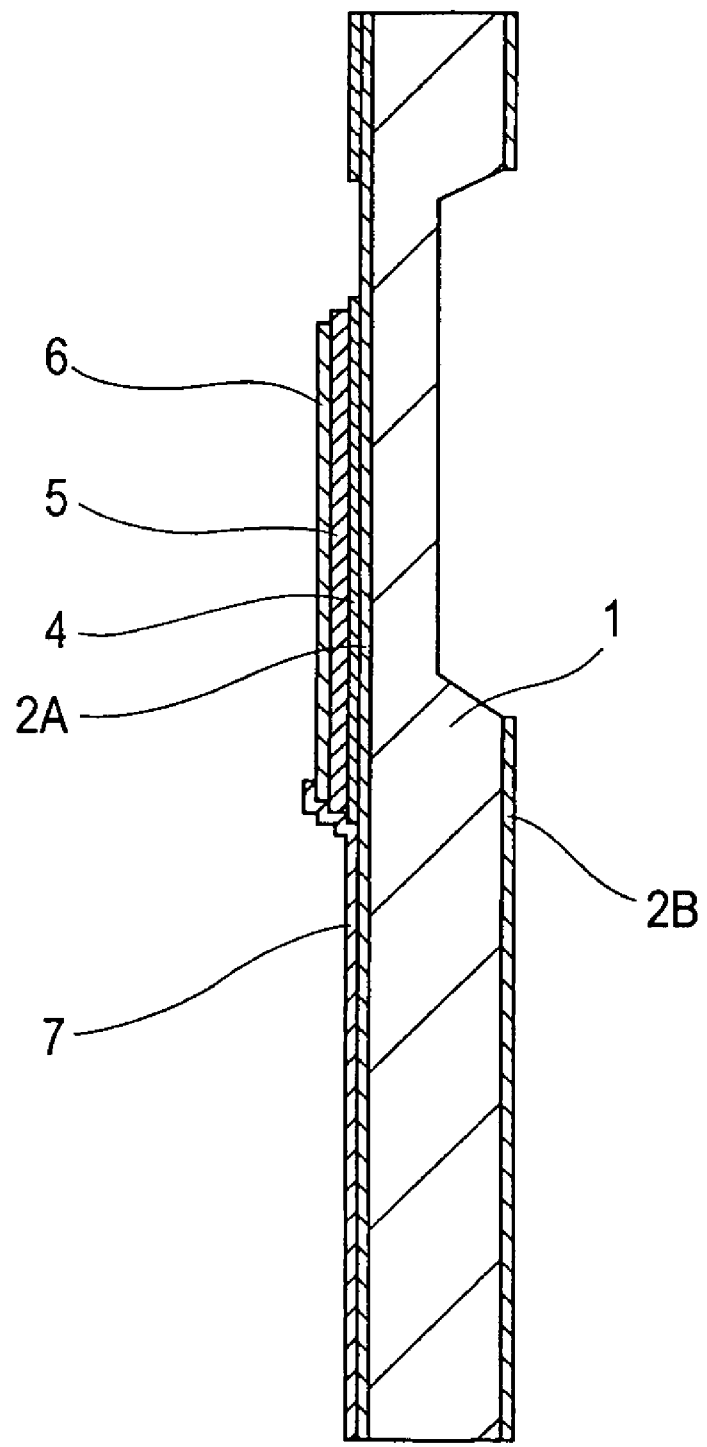
FIG. 21 is a sectional view of the section indicated by a line XXI-XXI shown in FIG. 20.

As shown in FIG. 20 and FIG. 21, a wiring substrate film 7 is formed. The purpose of this is to ensure the adhesion of a wiring film 9 described below. It is a precondition that the wiring substrate film 7 consists of an insulating material. The shape of the wiring substrate film 7 is determined at will as long as the film is formed on a portion other than the portions on the vibrator and individual electrode connection portions 6a, 6b, and 6c and on an etching area around the vibrator. In the present embodiment, each of the upper electrode film 6 and the lower electrode film 4 is allowed to overlap the wiring substrate film 7 by 5 μm in order that the adhesion of the electrode films may also be improved.

For the method for forming the wiring substrate film 7, a technique of so-called lift off is used, wherein a resist pattern film having an opening portion in a desired shape is formed by the photolithography technology, the wiring electrode film is formed by sputtering and, thereafter, sputtered films adhered to unnecessary portions are removed at the same time with the removal of the resist pattern film. Alumina is selected as a material, and is deposited to a thickness of 75 nm. However, the material and the method for forming the wiring substrate film 7 are determined at will, and are not limited to the above-described formation method and material.

Figure 22:
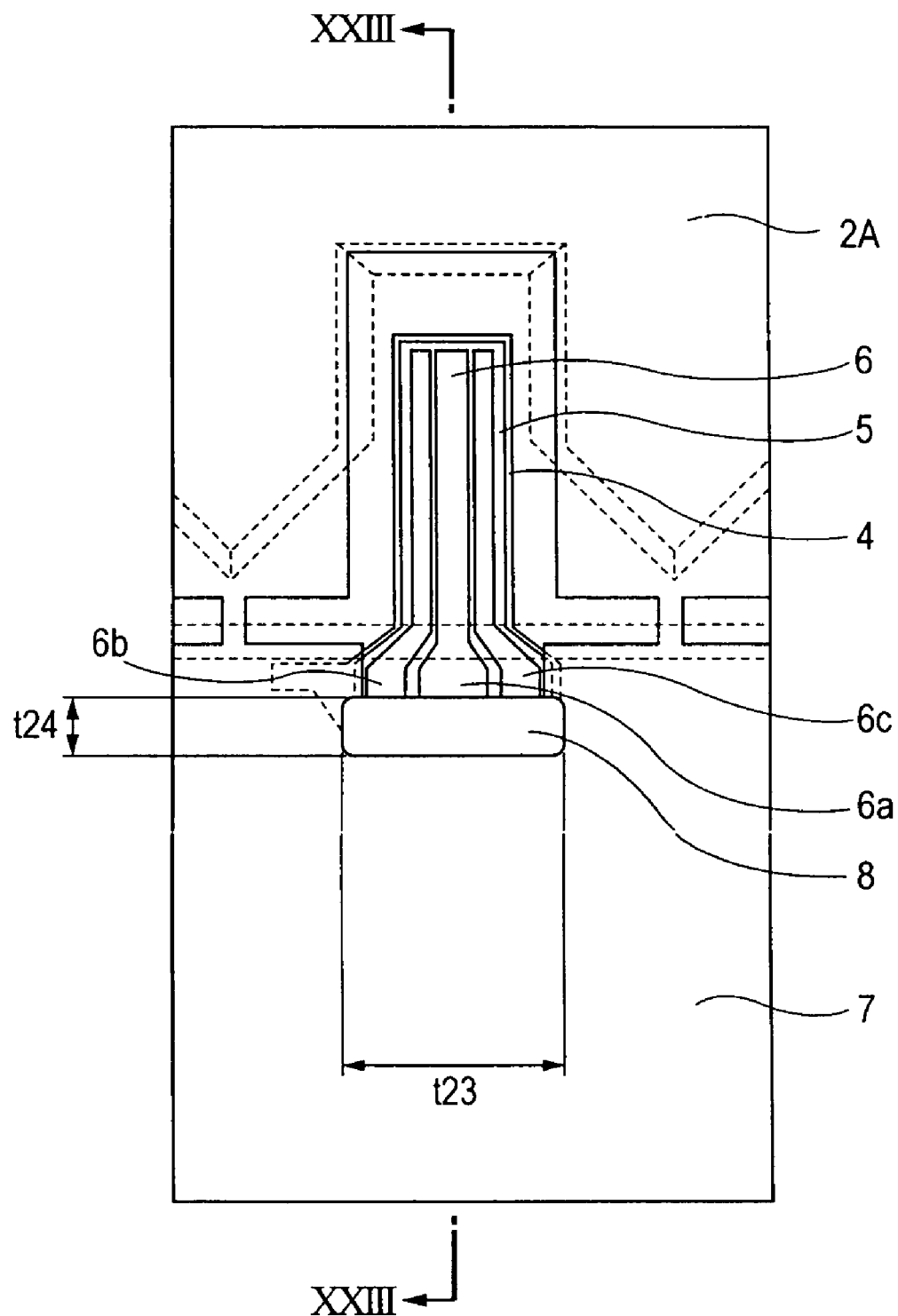
FIG. 22 is a magnified plan view showing the state of the above-described substrate provided with a planarizing resist film.
Figure 23:
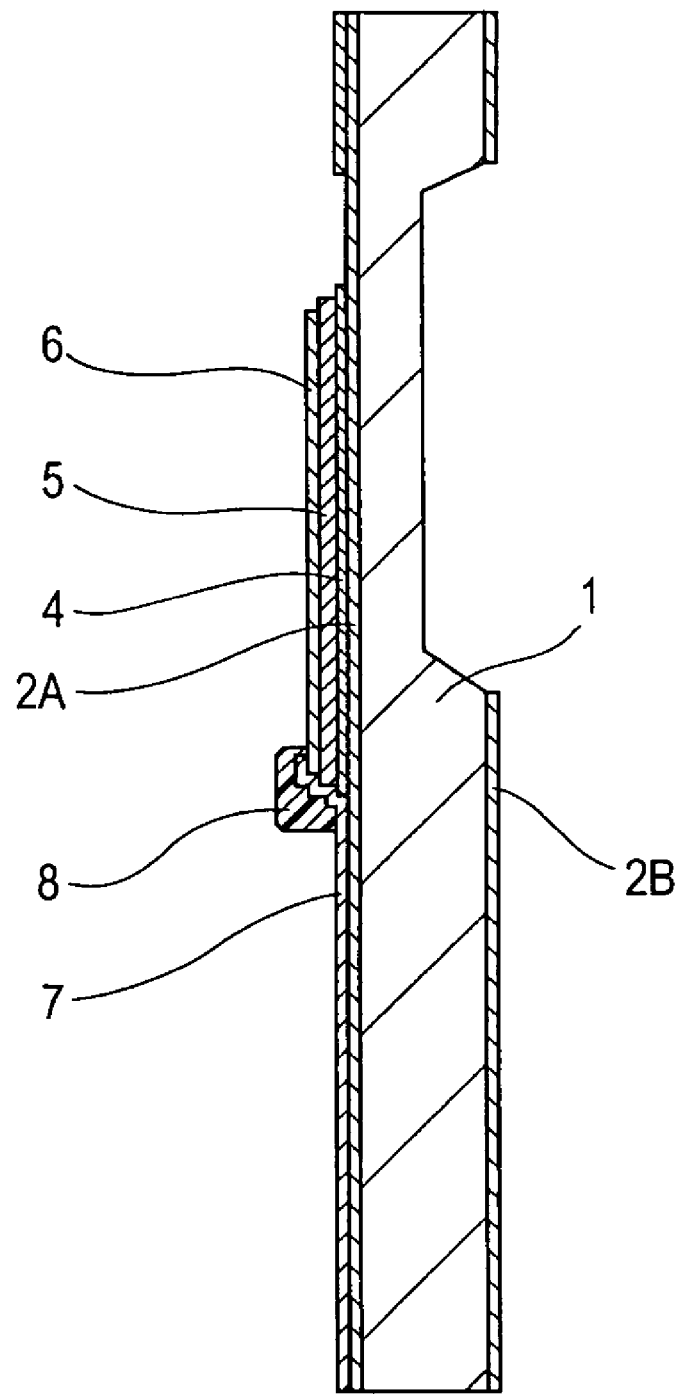
FIG. 23 is a sectional view of the section indicated by a line XXIII-XXIII shown in FIG. 22.

As shown in FIG. 22 and FIG. 23, a planarizing resist film 8 is disposed on the electrode connection portions 6a, 6b, and 6c. The purpose of this planarizing resist film 8 is to smoothly conduct the electrical connection between the wiring film 9 described below and the upper electrode film 6. When the wiring film 9 is physically connected to the upper electrode film 6, it may be difficult to avoid passing the end portions of the piezoelectric film 5 over the edge of the lower electrode film 4. In the present embodiment, the piezoelectric film 5 is formed by wet etching, and the end portion thereof is in a reverse-tapered or substantially perpendicular state. Therefore, if the wiring is conducted without disposing the planarizing resist film 8, breaking may occur at the end portion. Furthermore, since the lower electrode film 4 is exposed, if insulation is not ensured by the planarizing resist film 8, an electrical short circuit may occur. The planarizing resist film 8 is disposed from the above-described viewpoint.

The shape of the planarizing resist film 8 is determined at will as long as the shape covers the wiring film 9 described below. In the present embodiment, the planarizing resist film width t23 is specified to be 200 μm, and the planarizing resist film length t24 is specified to be 50 μm.

For the method for forming the planarizing resist film 8, a resist film is patterned into a desired shape by the photolithography technology and, thereafter, a heat treatment at about 280° C. to 300° C. is conducted, so that the patterned resist film is cured. In the present embodiment, the thickness of the resist film at this time is specified to be about 2 μm. However, it is desirable that this thickness is changed in accordance with the thicknesses of the piezoelectric film 5 and the lower electrode film 4, and the thickness is allowed to become larger than or equal to the total thickness of the two.

In the present embodiment, a photosensitive resist film is used as the above-described planarizing resist film 8. However, the material is not limited to this. The material, as well as the formation method, is determined at will as long as the material is suitable for the above-described application and is electrically non-conductive.

Figure 24:
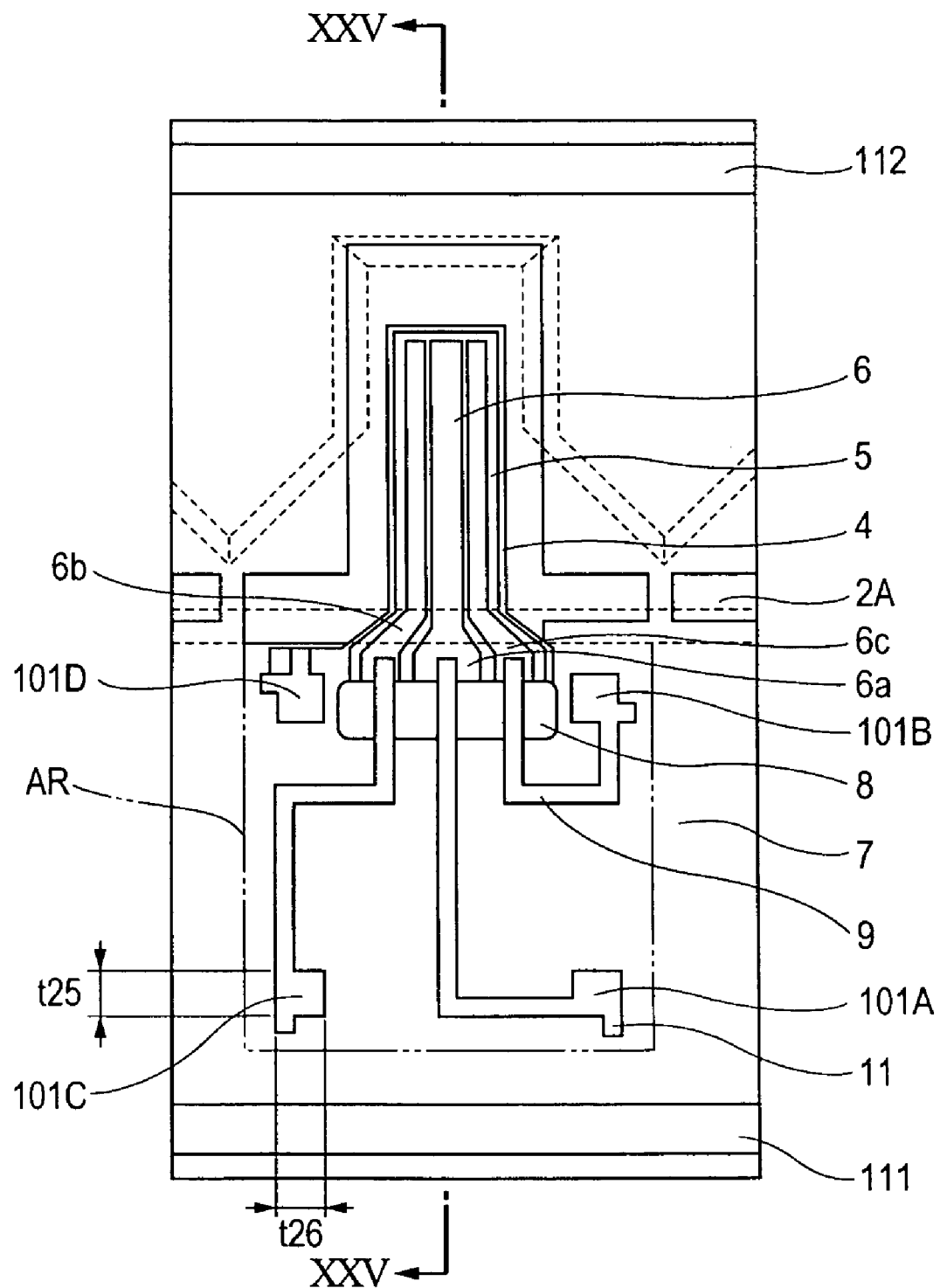
FIG. 24 is a magnified plan view showing the state of the above-described substrate provided with wiring connection terminals.
Figure 25:
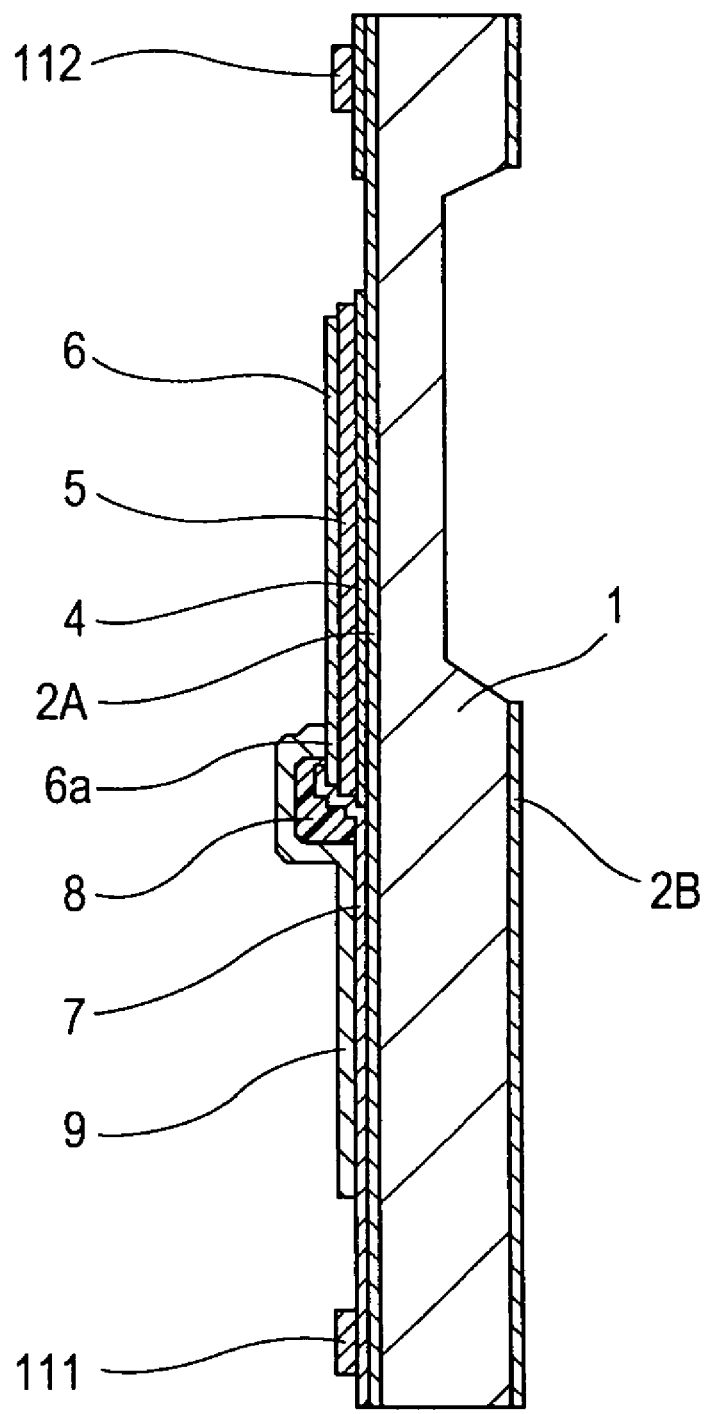
FIG. 25 is a sectional view of the section indicated by a line XXV-XXV shown in FIG. 24.

As shown in FIG. 24 and FIG. 25, a wiring film 9 is formed to connect the upper electrode film 6 to the outside. This is for facilitating electrical connection to the outside, and the wiring film 9 passes over the top surface of the planarizing resist film 8 and is connected to the connection portion of the upper electrode film 6. Although the shapes of the upper electrode connection portions 6a, 6b, and 6c are determined at will, it is desirable that the size is 5 μm square or more to decrease electrical contact resistance. In the present embodiment, it is a precondition that the electrical connection to the outside is conducted by a connection method through the use of a flip chip of Au bumps. Therefore, Au bump regions for individual electrodes are ensured by disposing electrode pads 101A, 101B, 101C, and 101D, as shown in FIG. 24.

The electrode pads 101A, 101B, 101C, and 101D have areas adequate for disposing the Au bumps. In the present embodiment, the electrode pad portion length t25 is specified to be 120 μm, and the electrode pad width t26 is specified to be 120 μm. Since four portions including the driving electrode 6a, the left and right detection electrodes 6b and 6c, the three portions constituting the upper electrode film 6, and the lower electrode film 4 are electrically connected to the outside independently, each of the four portions is connected to an independent wiring film 9. It is a precondition that the electrode pads 101A, 101B, 101C, and 101D are positioned in an element area AR.

Figure 26:
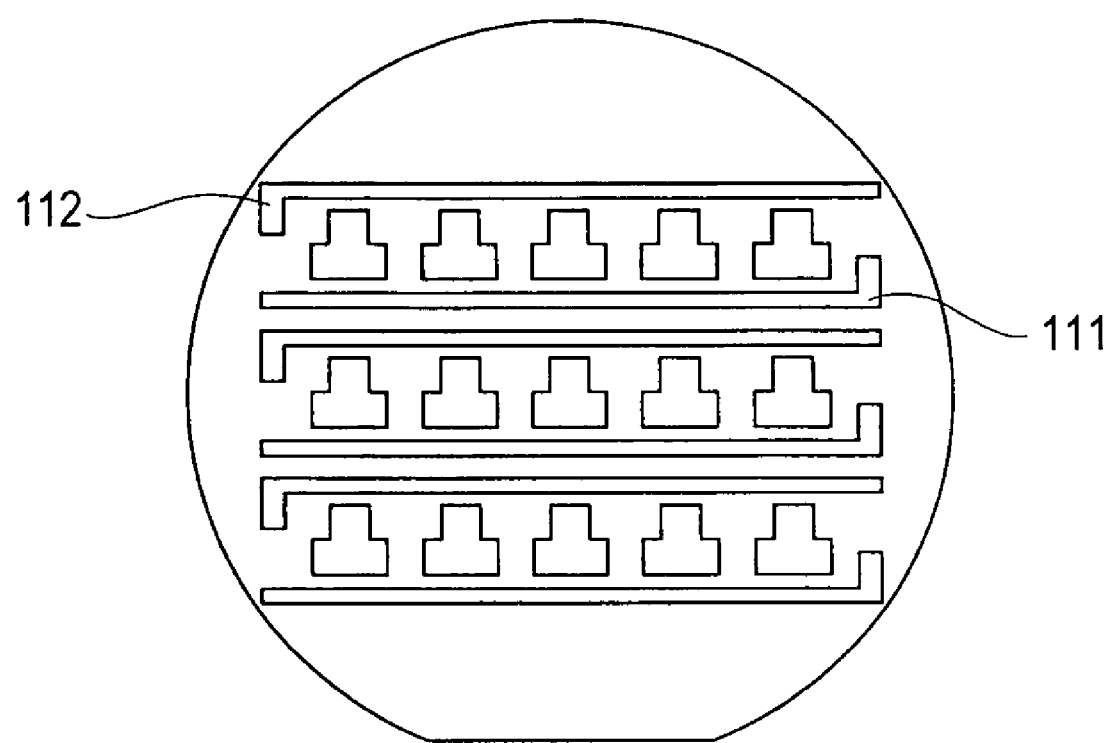
FIG. 26 is a plan view showing the entire state of the above-described substrate provided with polarization rails.

In this step, polarization rails are also formed simultaneously. The vibrator of the present embodiment is polarized finally so as to stabilize the piezoelectric characteristic. In order to efficiently conduct the polarization operation, elements in the same row may be polarized by one operation. It is desirable that wirings on the voltage application side and the GND side are formed in advance to conduct the simultaneous polarization. As shown in FIG. 26, each of polarization rails 111 and 112 is formed in a horizontal straight line here. The elements and the rails are independent of one another at this time, and connection of the wiring on the voltage application side and connection of the wiring on the GND side are conducted by forming Cu wirings 11, as described below.

For the method for forming the wiring film 9, a technique of so-called lift off is used, wherein a resist pattern film having an opening portion in a desired shape is formed by the photolithography technology, the wiring film is formed by sputtering and, thereafter, sputtered films adhered to unnecessary portions are removed at the same time with the removal of the resist film. With respect to the material for the wiring film, after 20 nm of Ti is deposited to improve the adhesion, 300 nm of Cu having low electrical resistance and low cost is deposited, and subsequently, 500 nm of Au is deposited to facilitate the connection to the Au bump. However, the material and the formation method for the wiring film is determined at will, and are not limited to the above-described formation method and the material.

Insulating Protective Film Formation Step

Figure 27:
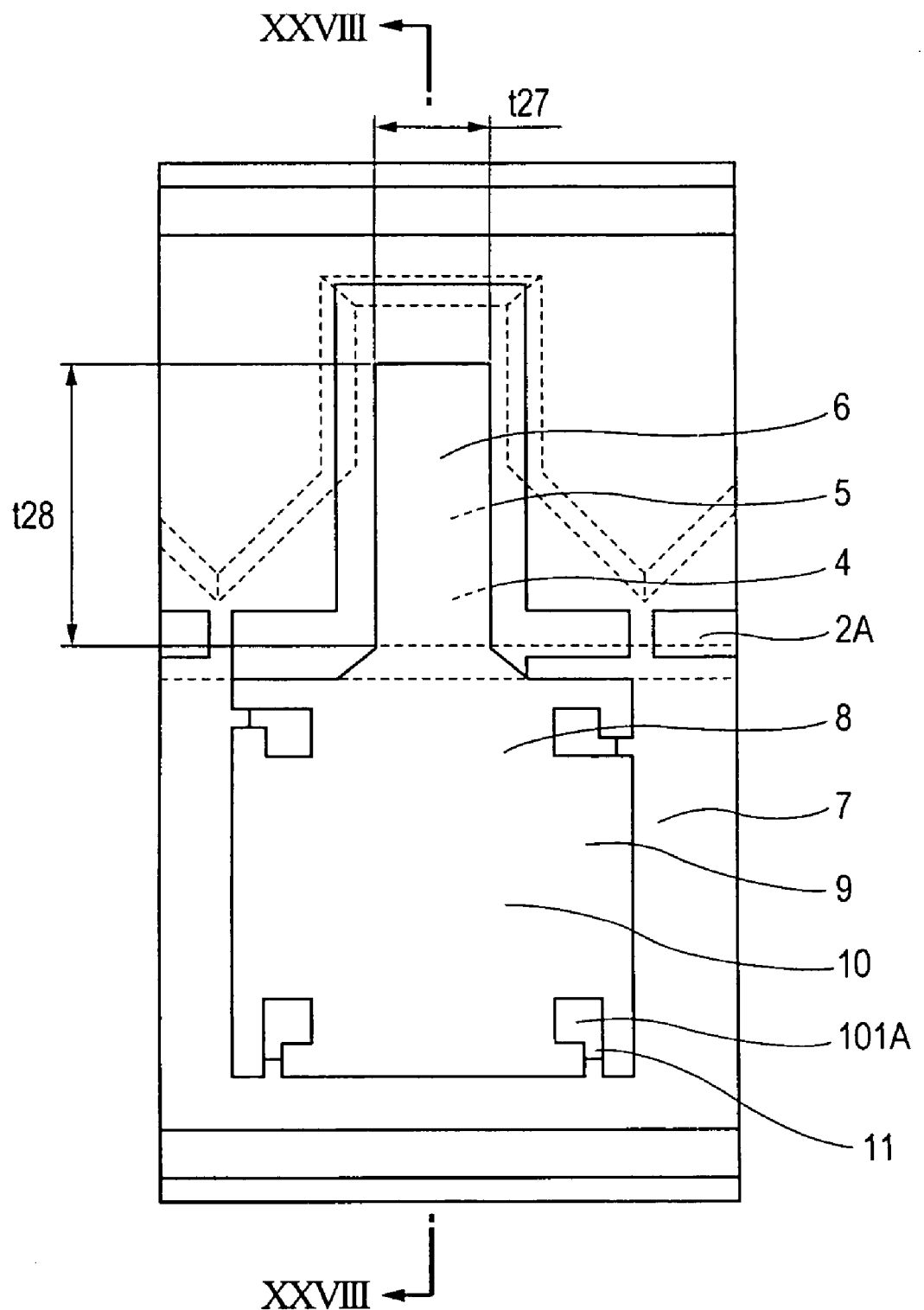
FIG. 27 is a magnified plan view showing the state of the above-described substrate provided with an insulating protective film.
Figure 28:
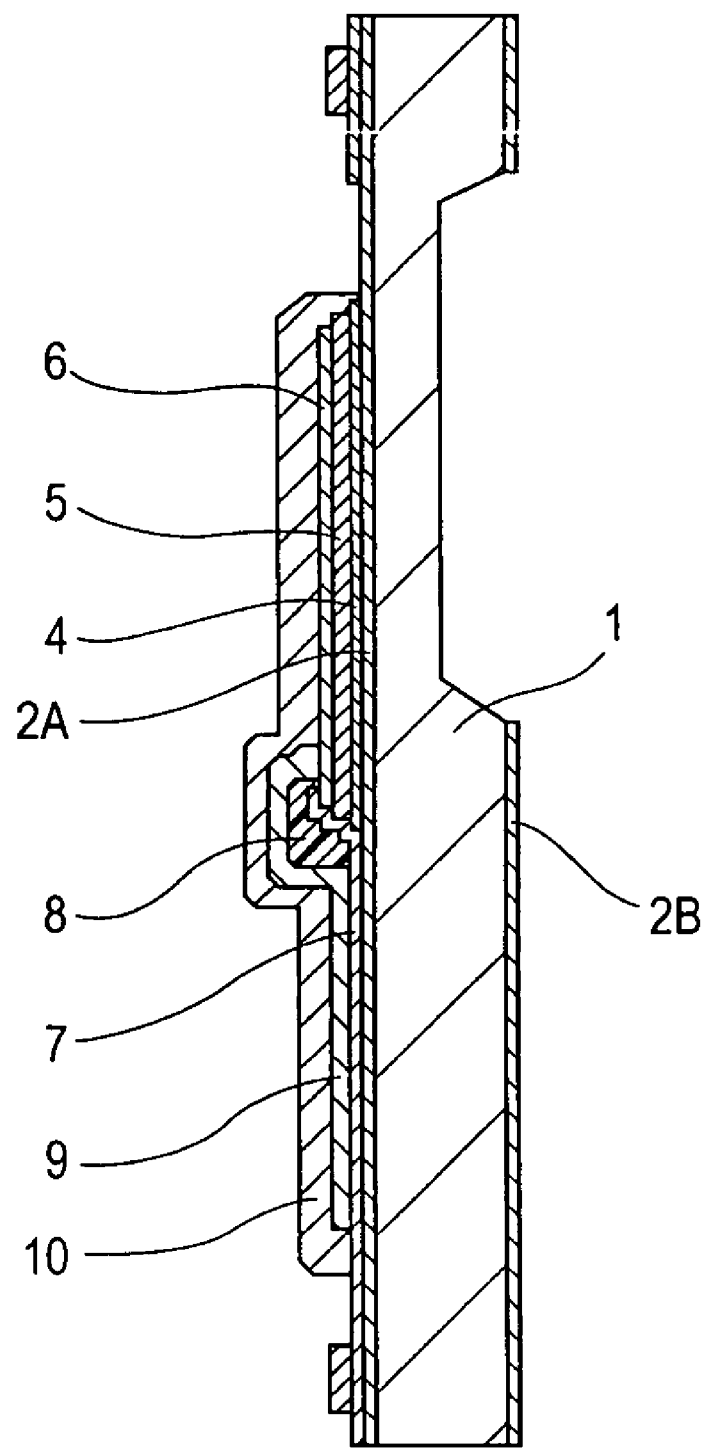
FIG. 28 is a sectional view of the section indicated by a line XXVIII-XXVIII shown in FIG. 27.

As shown in FIG. 27 and FIG. 28, an insulating protective film 10 is formed on the vibration beam and the wirings. This may facilitate prevention of leakage between electrodes due to external factors, e.g., humidity, and prevention of oxidation of the electrode films. It is desirable that the protective film width t27 on the vibrator is larger than the lower electrode width t20 and smaller than the vibration beam width t6. In the present embodiment, t27 is specified to be 98 μm. It is desirable that the protective film length t28 on the vibrator is longer than the lower electrode length t19 and shorter than the vibration beam length t5. In the present embodiment, t28 is specified to be 1.95 mm. The protective film 10 has a pattern covering the entire wiring film 9. However, it is desirable that the protective film is not disposed on the four electrode pad portions to be connected to Au bumps and four connection portions to be connected to Cu wirings 11 selectively.

For the method for forming the protective film 10, a technique of so-called lift off is used, wherein a resist pattern film having an opening portion in a desired shape is formed by the photolithography technology, the protective film is formed by sputtering and, thereafter, sputtered films adhered to unnecessary portions are removed at the same time with the removal of the resist film. With respect to the material for the protective film 10, after 50 nm of $Al_2O_3$ is deposited to improve the adhesion, 750 nm of $SiO_2$ exhibiting a high insulating property is deposited, and subsequently, 50 nm of $Al_2O_3$ is deposited as an uppermost layer to improve the resist adhesion in the following vibration beam formation. It is desirable that the thickness of $SiO_2$ to function as the insulating protective film is at least double the thickness of the upper electrode film. However, if the thickness becomes 1 μm or more, burrs tend to be generated in the lift off. Therefore, the thickness is specified to be 750 nm in the present embodiment. Furthermore, the $SiO_2$ film formation may be conducted at an Ar pressure of 0.4 Pa, which is a lower limit of the electric discharge, to increase the film density.

Figure 29:
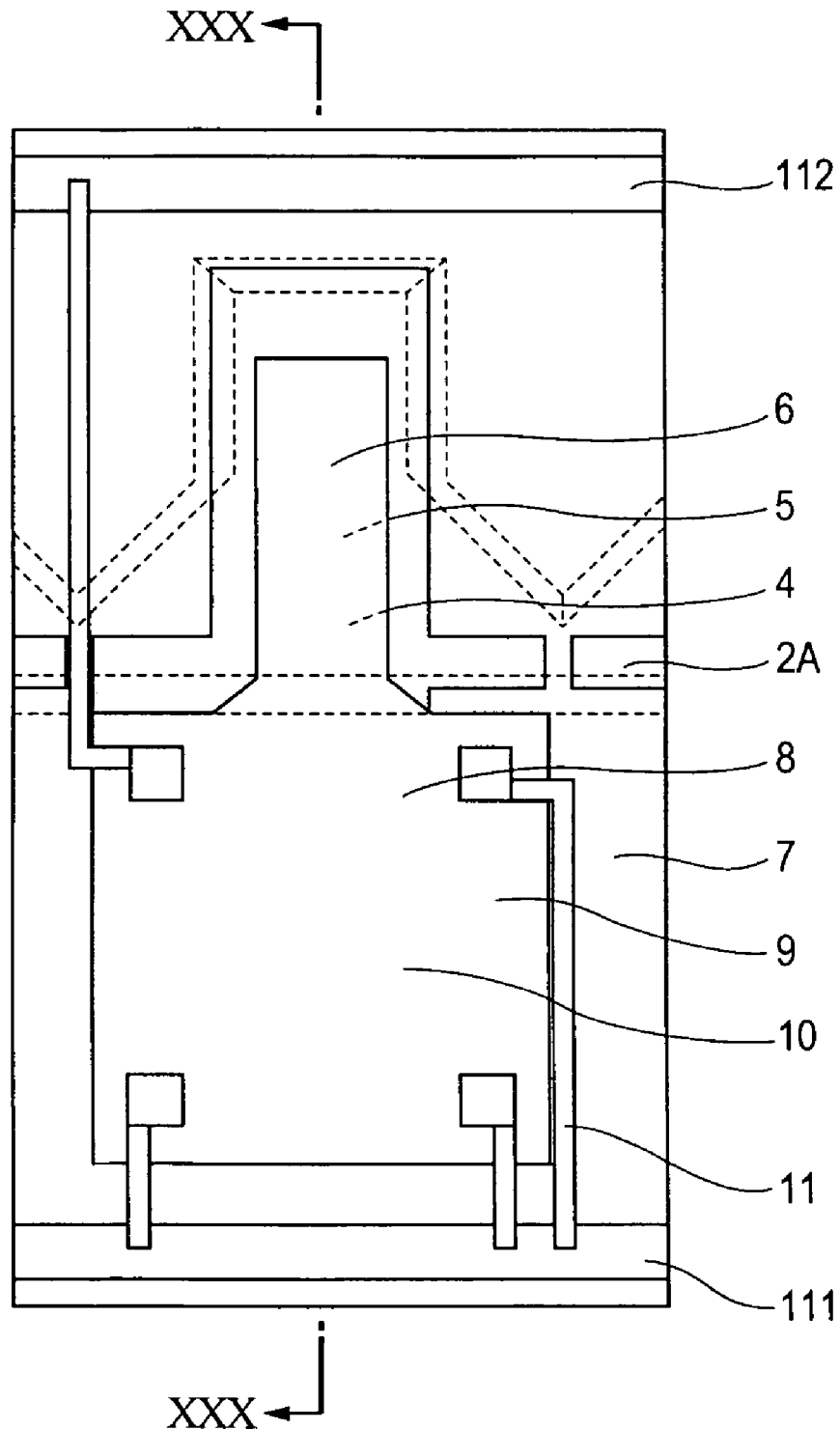
FIG. 29 is a magnified plan view showing the state of the above-described substrate provided with Cu wirings.
Figure 30:
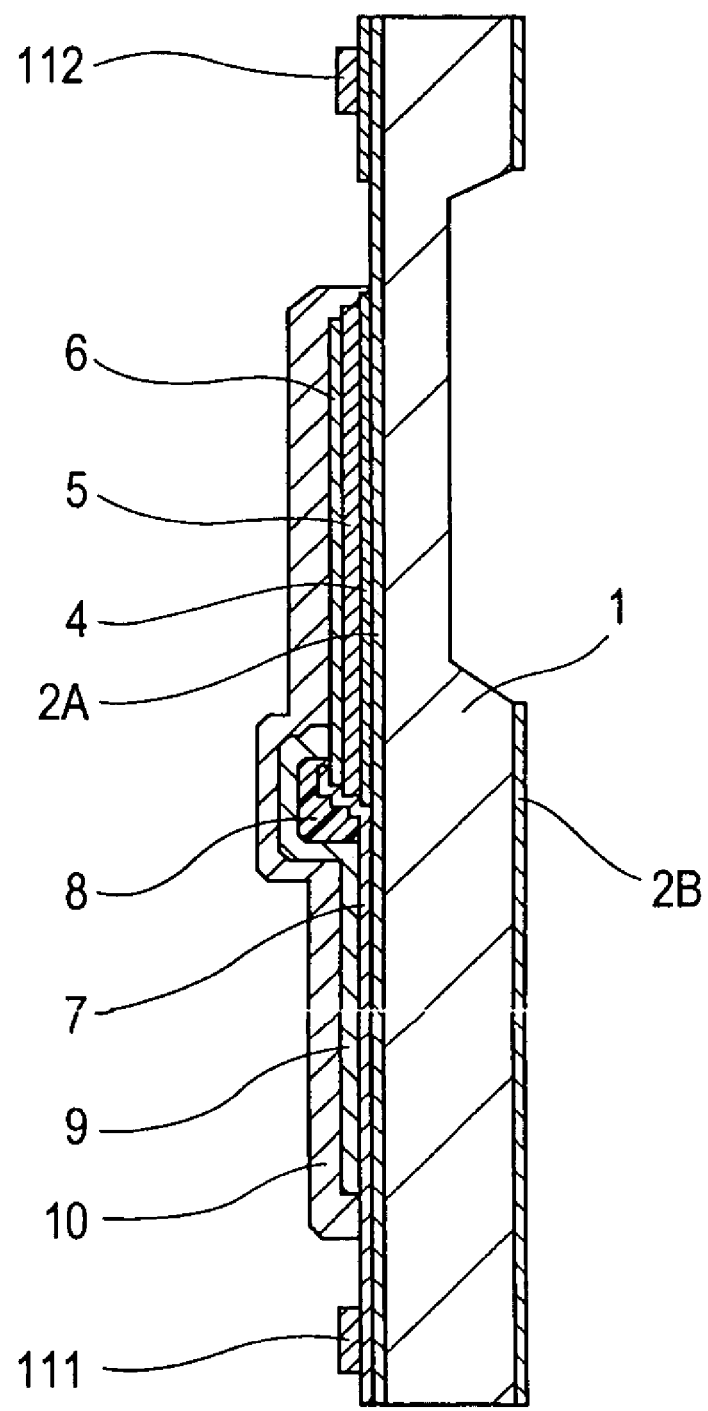
FIG. 30 is a sectional view of the section indicated by a line XXX-XXX shown in FIG. 29.
Figure 31:
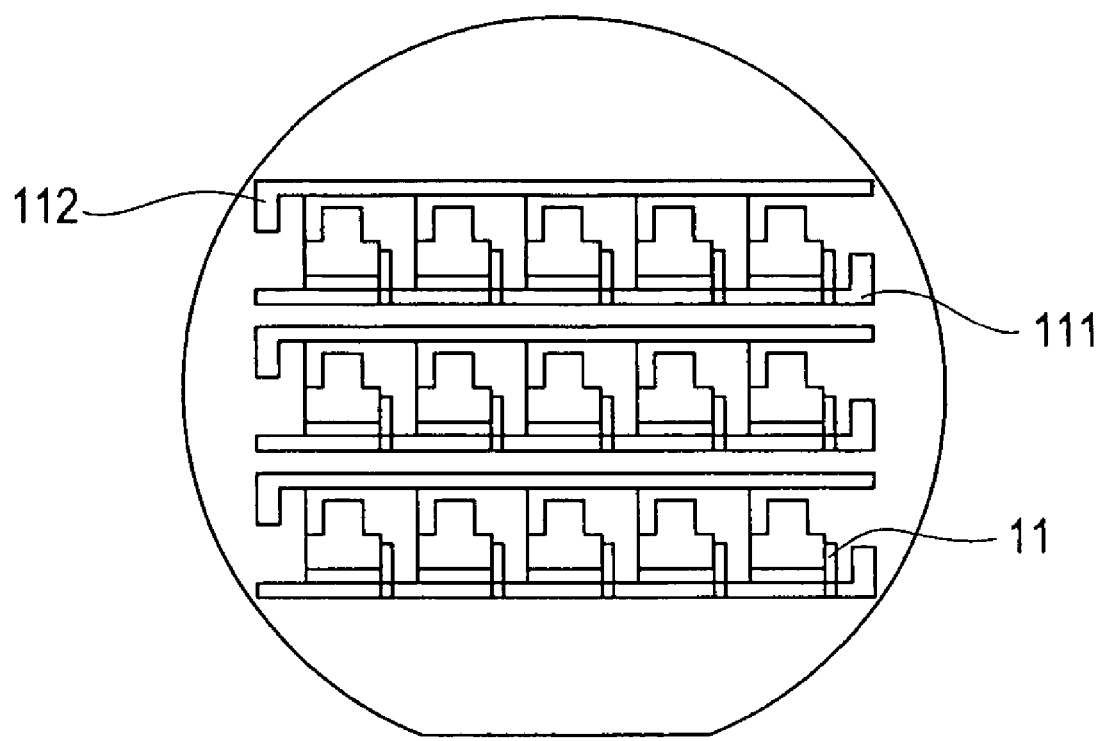
FIG. 31 is a plan view of the above-described substrate provided with Cu wirings, in its entirety.

As shown in FIG. 29 and FIG. 30, the Cu wirings 11 are formed. The Cu wirings 11 connect the driving electrode 6a and the left and right detection electrodes 6b and 6c of the upper electrode film 6 to the rail 111 on the voltage application side, and connect the lower electrode 4 to the rail 112 on the GND side. As shown in FIG. 31, the connection by the Cu wirings 11 is conducted for all elements in a manner similar to that described above. The reason Cu is used for the wirings is that Cu is dissolved easily by wet etching after the polarization and, thereby, the elements are allowed to become independent of each other again without being damaged. Therefore, the material is determined at will as long as the material is an electrically conductive material capable of being eliminated without damaging the elements. It is desirable that the wiring width t29 (refer to FIG. 33) is 30 μm or more to ensure continuity in the polarization.

For the method for forming the Cu wirings 11, a technique of so-called lift off is used, wherein a resist pattern film having an opening portion in a desired shape is formed by the photolithography technology, films of Cu are formed by sputtering and, thereafter, sputtered films adhered to unnecessary portions are removed at the same time with the removal of the resist film. The Cu film thickness is specified to be 400 nm to ensure continuity in the polarization. The method for forming the wiring film is determined at will, and is not limited to the above-described formation method.

Figure 32:
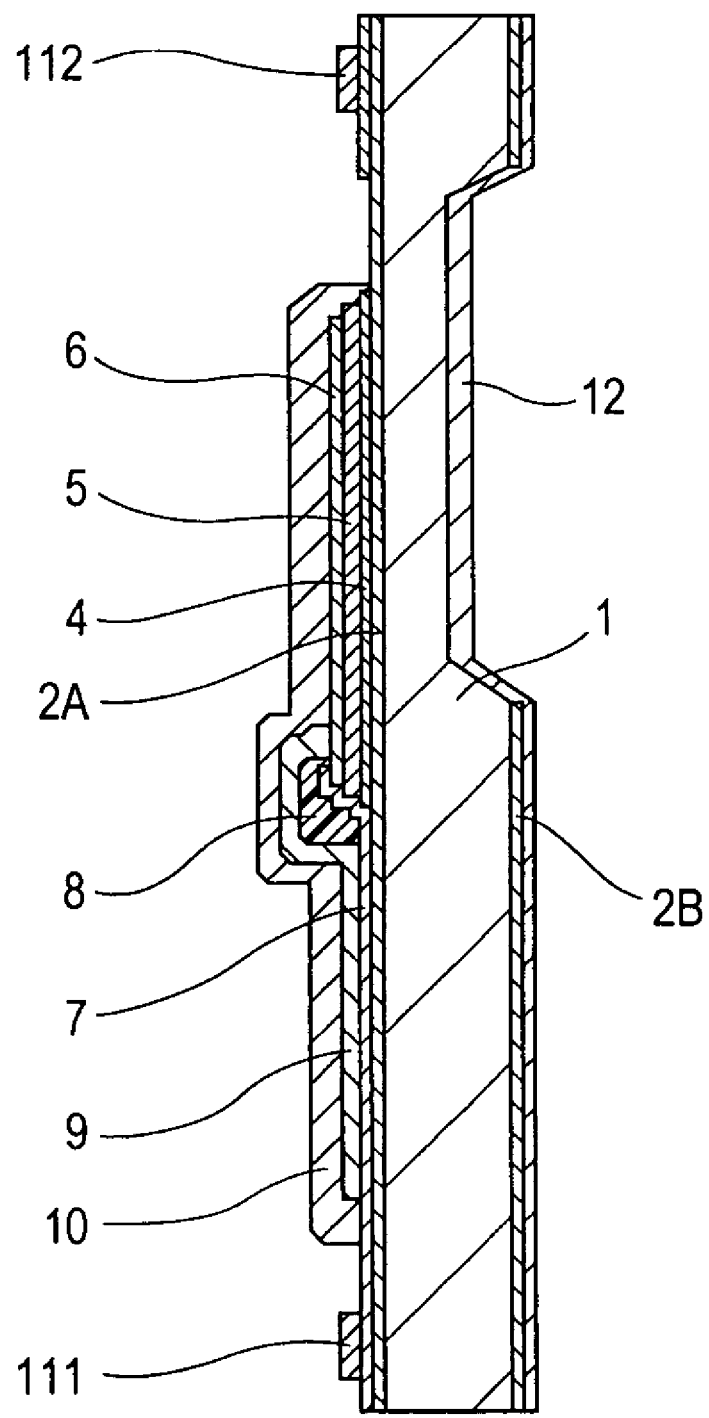
FIG. 32 is a sectional view of the above-described substrate showing the state in which a back surface stopper film is disposed on the above-described substrate.

As shown in FIG. 32, a back surface stopper film 12 is formed. This facilitates prevention of occurrence of an odd edge shape of the lowermost surface due to concentration of plasma when penetration etching is conducted in the vibration beam formation described below. In the present embodiment, 500 nm of $SiO_2$ is formed all over the back surface by sputtering.

Vibration Beam Formation Step

Figure 33:
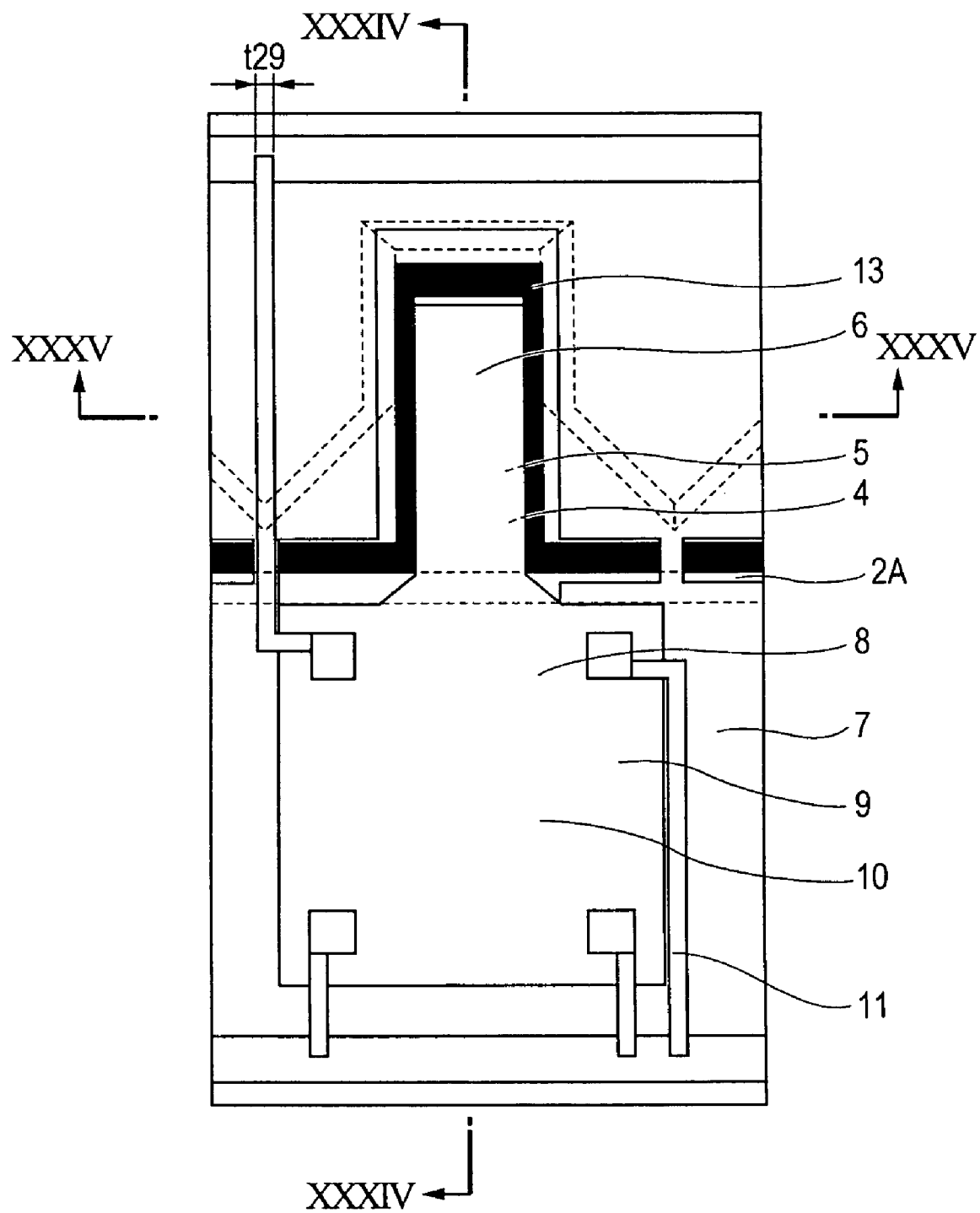
FIG. 33 is a magnified plan view showing the state of the above-described substrate provided with a vibration beam by providing a beam space.
Figure 34:
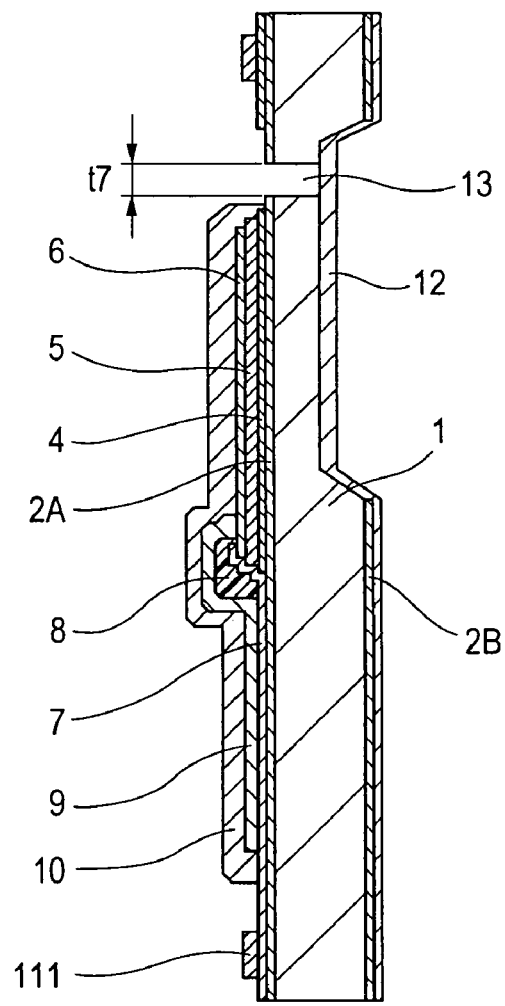
FIG. 34 is a sectional view of the section indicated by a line XXXIV-XXXIV shown in FIG. 33.
Figure 35:
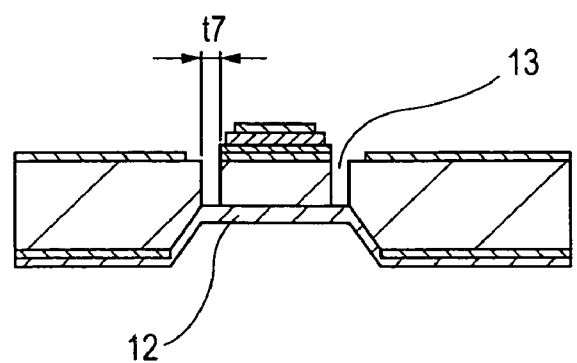
FIG. 35 is a sectional view of the section indicated by a line XXXV-XXXV shown in FIG. 33.

As shown in FIG. 33, FIG. 34, and FIG. 35, a beam space is provided and, thereby, the vibration beam is formed. FIG. 34 is a sectional view of the section indicated by a line XXXIV-XXXIV shown in FIG. 33. FIG. 35 is a sectional view of the section indicated by a line XXXV-XXXV shown in FIG. 33.

For the method for providing the beam space, a resist pattern film having an opening portion corresponding to a penetration portion 13 is formed by the photolithography technology, the thermal oxidation film 2A is removed by ion etching and, thereafter, the substrate 1 is etched until being penetrated. The thermal oxidation film 2A may be removed by wet etching. However, the ion etching is preferable in consideration of dimension error due to side etching.

In the present embodiment, the vibration beam thickness t14 (diaphragm thickness t11) is 100 μm. Therefore, it is desirable that this amount is removed by etching in order to penetrate Si of the substrate 1. In the usual ion etching and the like, it is difficult to ensure the selection ratio relative to the resist film and to leave a perpendicular wall surface. In the present embodiment, a vibration beam having a perpendicular side wall surface is formed by using an apparatus provided with inductively coupled plasma (ICP) and a Bosch process in which etching and film formation of a side wall protective film (SF6 in the etching and a C4F8 gas in the film formation) are repeated. This technology of perpendicularly grinding the Si material has been established generally. In the present embodiment as well, a commercially available apparatus is used. However, the method for providing the beam space is determined at will, and is not limited to the above-described method. In the present embodiment, the etching width t7 is specified to be 200 μm that is suitable for etching by ICP. The Cu wirings 11 are prevented from being penetrated.

Figure 36:
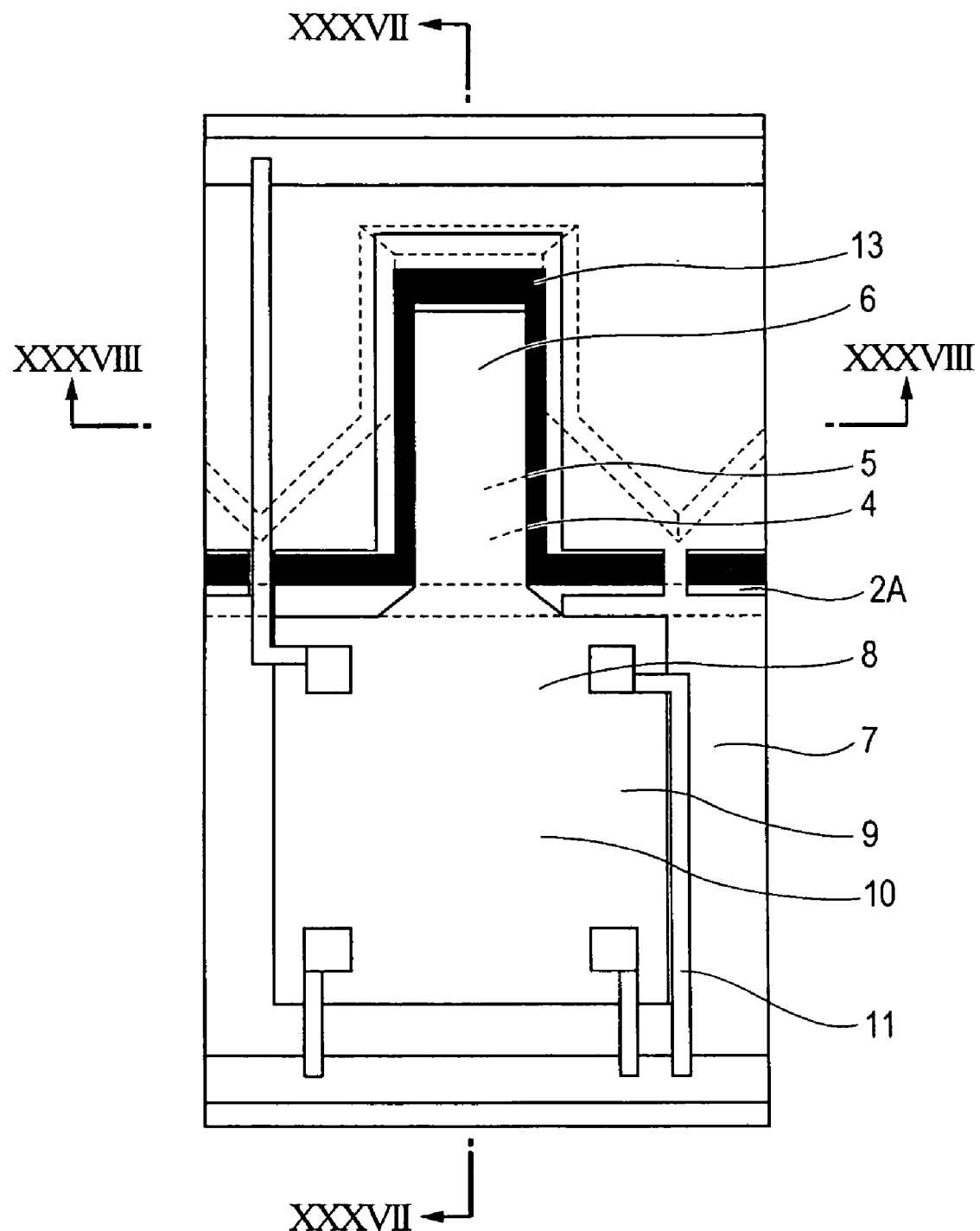
FIG. 36 is a magnified plan view showing the state of the above-described substrate from which the stopper layer has been removed.
Figure 37:
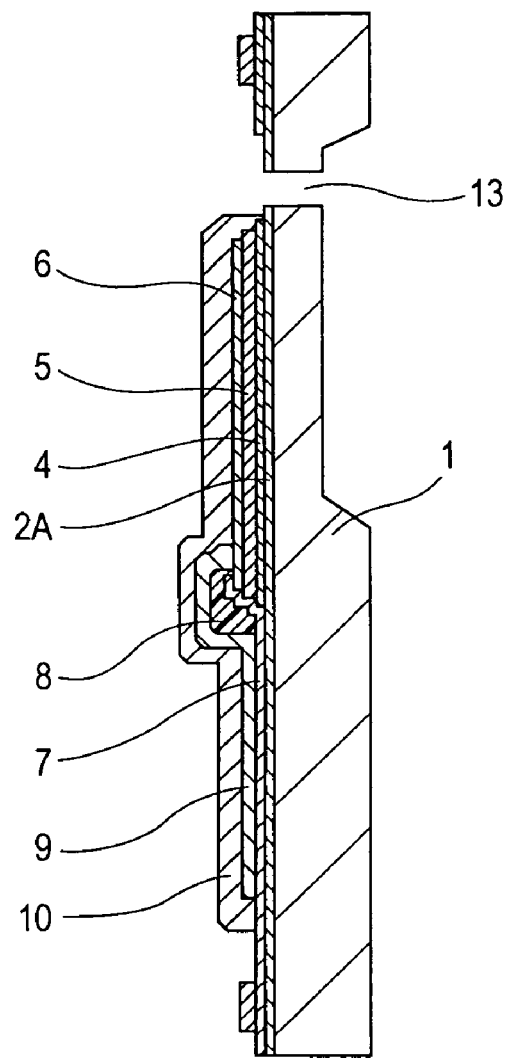
FIG. 37 is a sectional view of the section indicated by a line XXXVII-XXXVII shown in FIG. 36.
Figure 38:
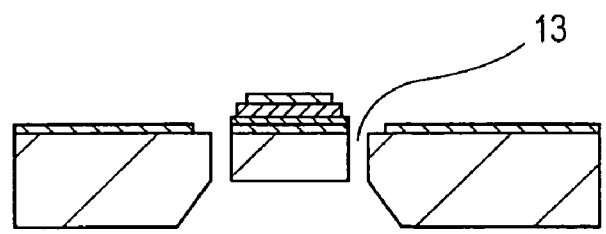
FIG. 38 is a sectional view of the section indicated by a line XXXVIII-XXXVIII shown in FIG. 36.

After the etching by ICP is completed, the back surface stopper film 12 is removed. The removal method is determined at will. In the present embodiment, the removal is conducted by wet etching with ammonium fluoride. At this time, if the resist with the penetration pattern is removed before the stopper film 12 is removed, the insulating protective film 10 is eliminated. Therefore, the resist is removed after the stopper film is removed. FIG. 36 to FIG. 38 show the state after the stopper film 12 and the resist are removed.

Polarization Treatment Step

Figure 39A:
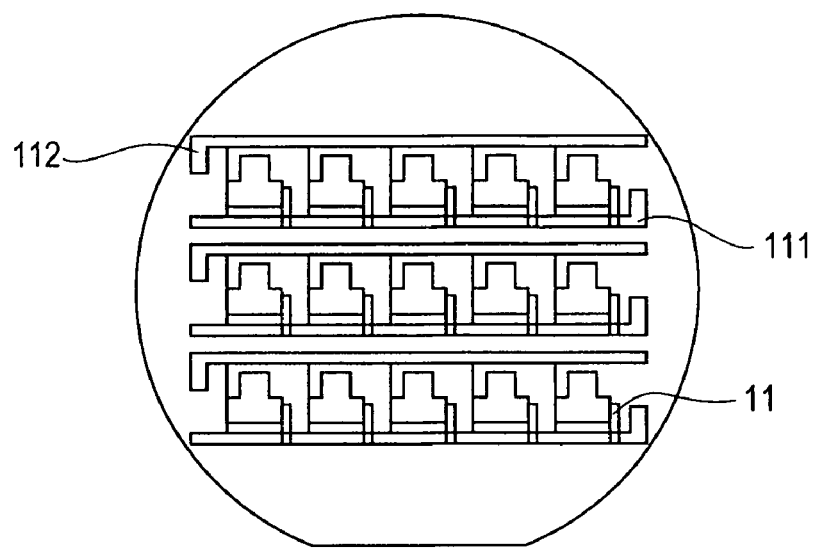
FIGS. 39A and 39B are diagrams showing a step of applying a polarization treatment to stabilize the piezoelectric characteristic.
Figure 39B:
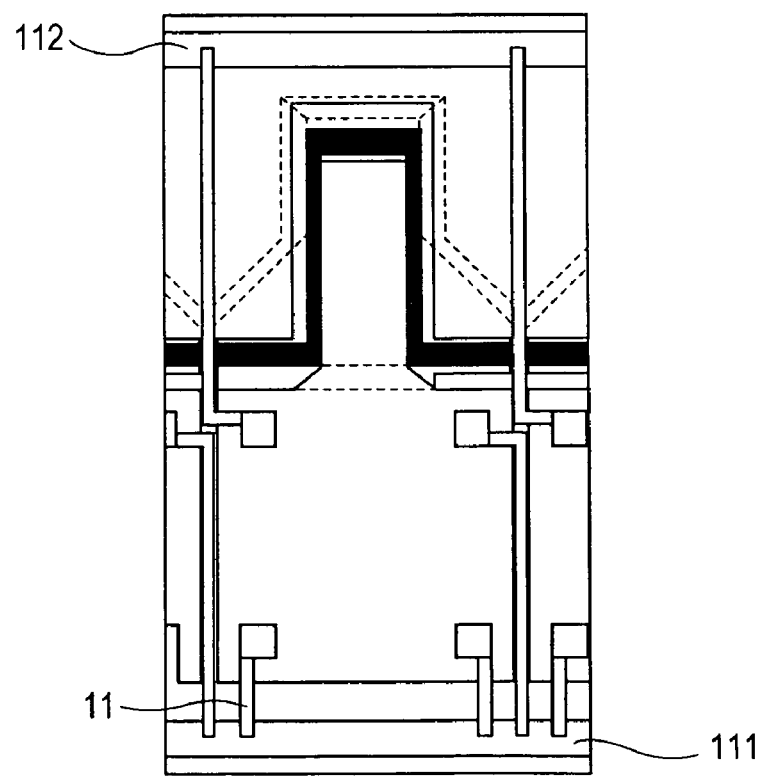

The elements shown in FIGS. 39A and 39B are subjected to a polarization treatment to stabilize the piezoelectric characteristic. The elements in the same row are connected to an external power supply through the application-side pads and the GND-side pads so as to be polarized by one operation. The connection method and the polarization method are determined at will. In the present embodiment, the connection to the external power supply is conducted by wire bonding and, thereafter, the polarization treatment is conducted.

Figure 40A:
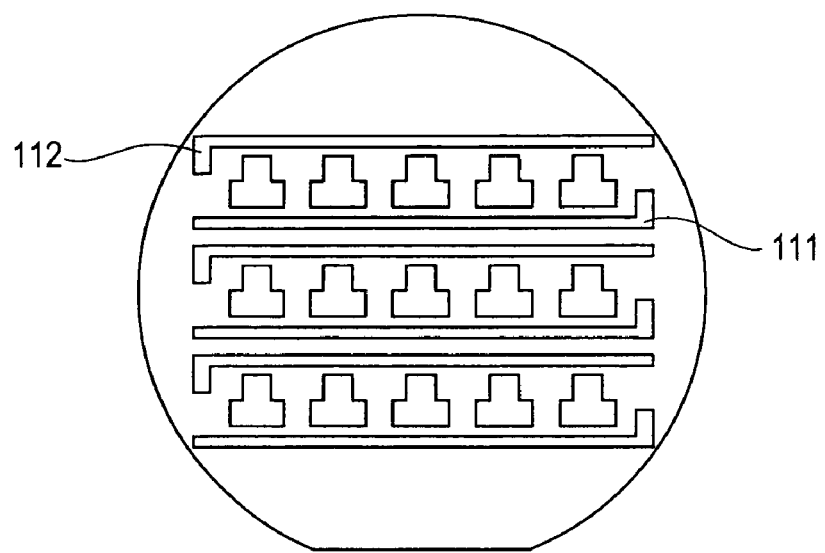
FIGS. 40A and 40B are diagrams showing the state in which unnecessary Cu wirings have been removed after the polarization treatment.
Figure 40B:
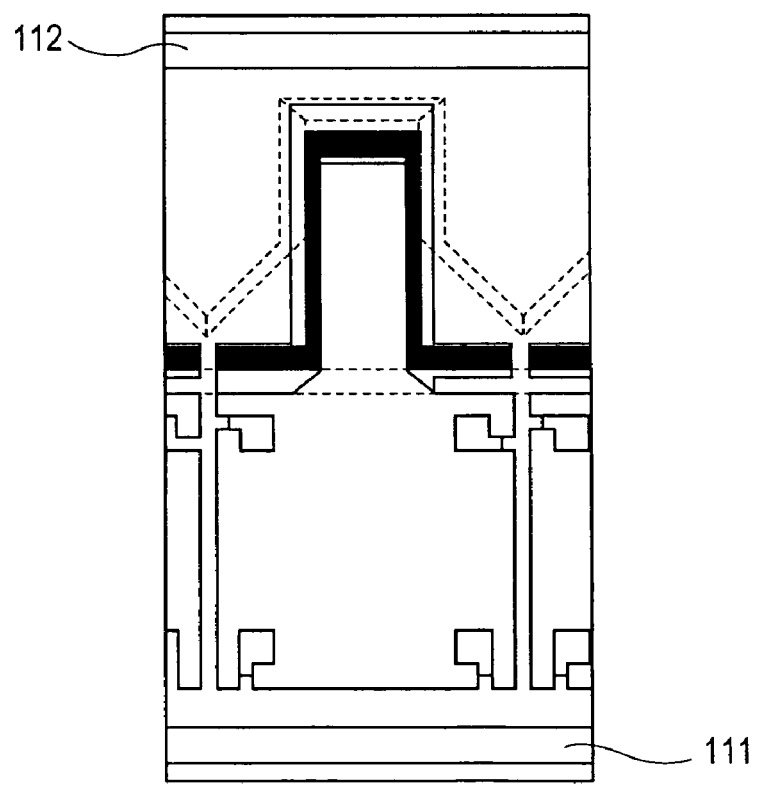

As shown in FIGS. 40A and 40B, after the polarization treatment is conducted, unnecessary Cu wirings 11 are removed. When cutting is conducted to separate the elements while the Cu wirings 11 remain, the Cu wirings 11 and the substrate 1 cause electrical leakage at the cut surfaces. Therefore, it is desirable to perform the removal chemically. In the present embodiment, the Cu wirings 11 are dissolved and removed by conducting wet etching with an ENSTRIP solution produced by Meltex Inc., in such a way that the elements are not damaged.

As described above, the vibration gyro sensor element 100 is formed by the thin film process, a plurality of elements are subjected to a polarization treatment by one operation through wirings of the thin film produced by the above-described thin film process and, thereby, large amounts of thin film gyros may be formed inexpensively and stably.

The removal of the Cu wirings 11 is not limited to the above-described dissolution and removal by the wet etching. In the element cutting step described below, since the elements are cut along the Cu wirings 11, the Cu wirings 11 may be removed by grinding in the cutting of the elements with a dicer. In this case, it is desirable that the formation width t29 of the Cu wiring 11 is smaller than or equal to the cutting grindstone width. In the present embodiment, the elements are separated by using a dicer having a grindstone width of 40 μm, it is desirable that the formation width t29 of the Cu wiring 11 is 20 μm or more and 40 μm or less. If the width is less than 20 μm, heat may be generated due to the resistance in the application of the polarization voltage and the wiring 11 may be fused. If the width exceeds 40 μm, the wiring may remain on the element after separation since the width is larger than the grindstone width.

Gold Bump Formation Step

Figure 41A:
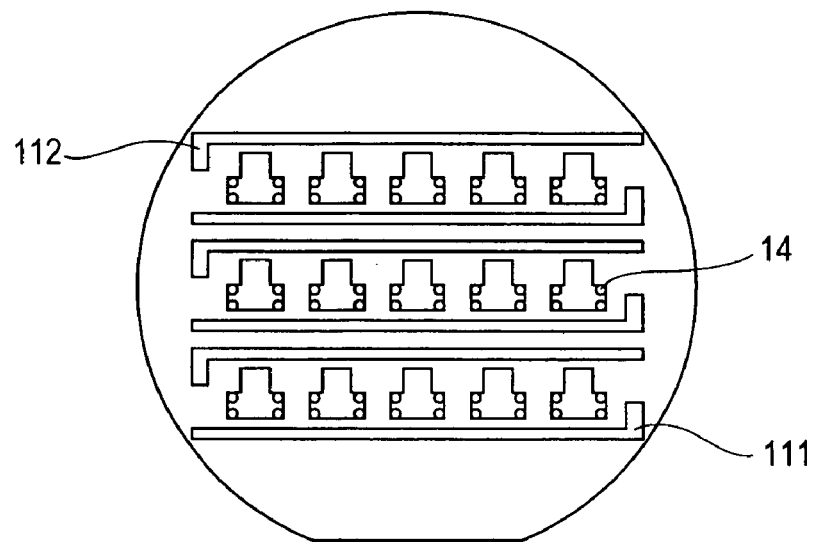
FIGS. 41A and 41B are diagrams showing the state in which Au bumps to enable flip chip mounting are formed.
Figure 41B:
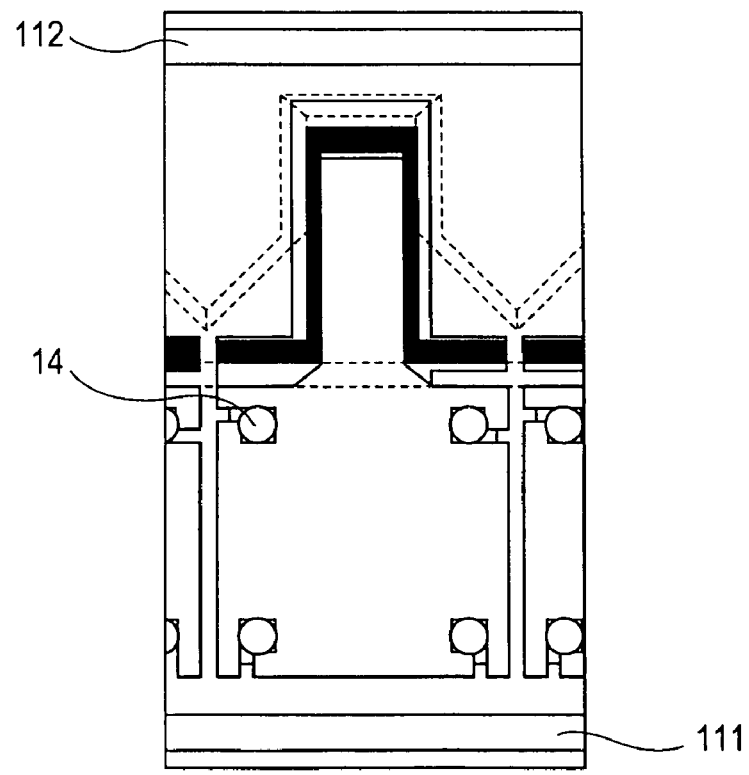

As shown in FIGS. 41A and 41B, Au bumps 14 to enable the flip chip are formed. The Au bumps 14 are formed on the four electrode pads.

Cutting Step

Figure 42A:
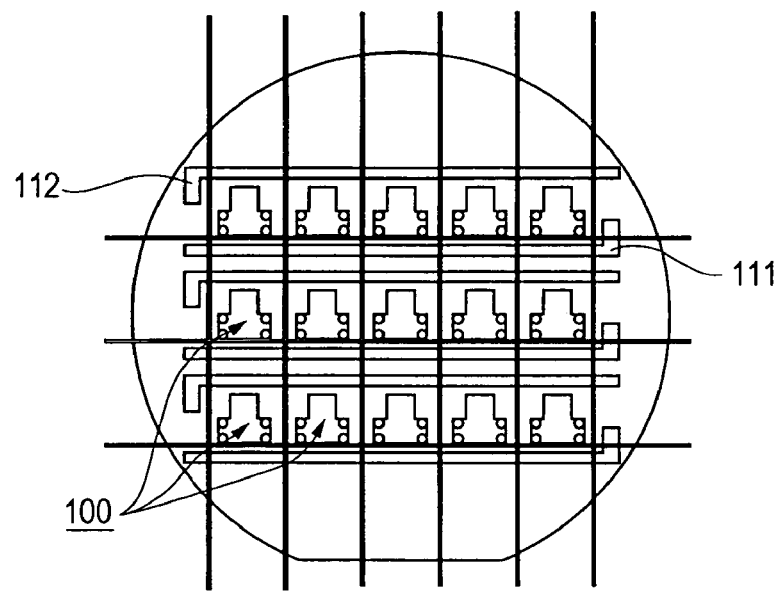
FIGS. 42A and 42B are diagrams showing the cutting lines to divide into individual vibration gyro sensor elements formed as piezoelectric thin film sensors.
Figure 42B:
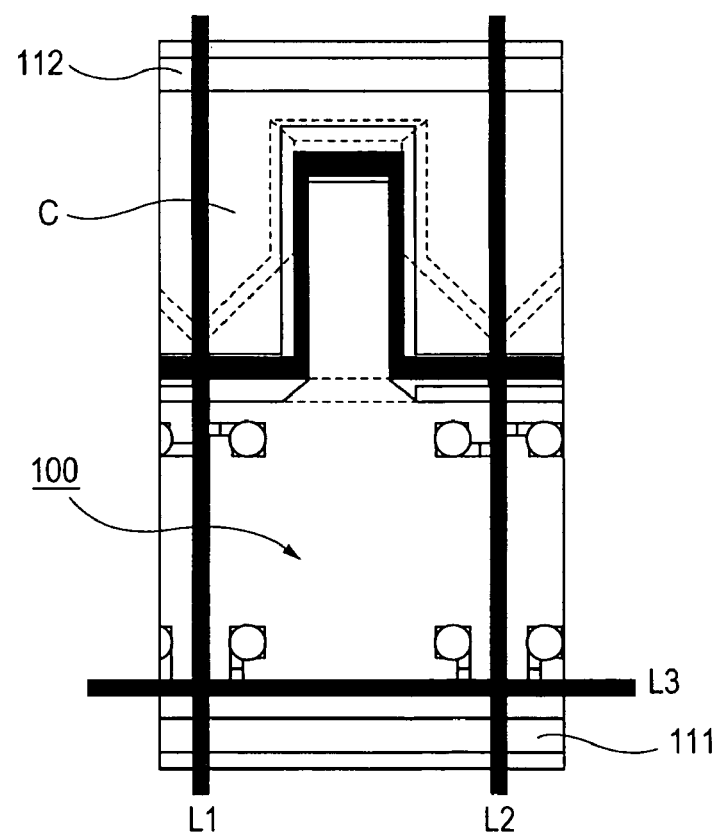
Figure 43:
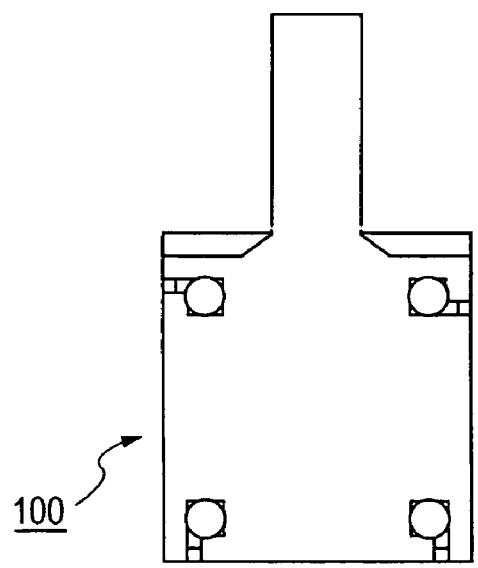
FIG. 43 is a plan view of a vibration gyro sensor element formed as a piezoelectric thin film sensor.

As shown in FIGS. 42A and 42B, fifteen vibration gyro sensor elements 100 formed as piezoelectric thin film sensors on the substrate 1 are divided into individual elements. As shown in FIG. 42B, cutting is conducted along cutting lines L1 to L3 in accordance with the element size. In this manner, a vibration gyro sensor element 100, which is partitioned by the penetration portion 13 and the cutting surfaces and serves as a piezoelectric thin film sensor shown in FIG. 43, is completed. Consequently, a portion C shown in FIG. 42B becomes an unnecessary portion.

Mounting Step

Figure 44:
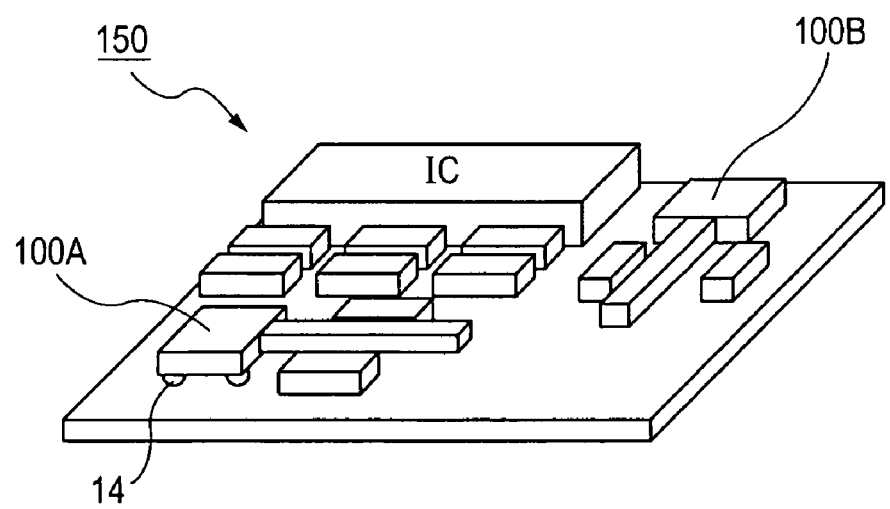
FIG. 44 is a schematic perspective view showing the state in which vibration gyro sensor elements are mounted on an IC substrate.

Individually divided vibration gyro sensor elements 100 are mounted on a support substrate, e.g., an IC substrate, by a flip chip mounting technique, as shown in FIG. 44, for example. The IC substrate is designed in advance in such a way that electrical connection is completed in accordance with the disposition of the elements. In the example shown in FIG. 44, the vibration gyro sensor element 100 is mounted in each of the X direction and the Y direction and, thereby, a biaxial angular velocity sensor 150 provided with two vibration gyro sensor elements 100A and 100B is constructed.

Figure 45:
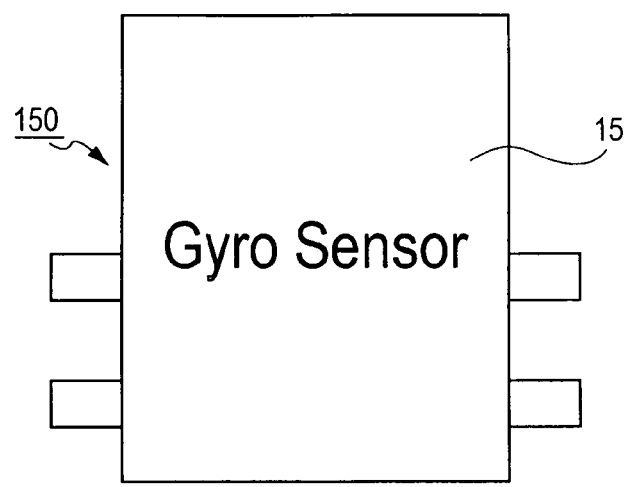
FIG. 45 is a plan view showing the state in which a cover component is disposed on an angular velocity sensor provided with a vibration gyro sensor element.

This angular velocity sensor 150 is hermetically sealed and protected by a cover component 15 to prevent the elements and circuits from contacting the outside, as shown in FIG. 45. The material for the cover component 15 is determined at will. However, the material, e.g., a metal, exhibiting a shielding effect is desirable in consideration of an influence of an external noise. It is desirable that the cover component 15 has a shape that does not obstruct the vibration of the vibration beam.

Second Embodiment

In recent years, electronic components are generally connected to mounting substrates by passing through reflow furnaces. In this case, electronic components are exposed to heat at about 250° C. It is desirable that the characteristics of the vibration gyro sensor element 100 are not changed at this reflow temperature.

Figure 46:
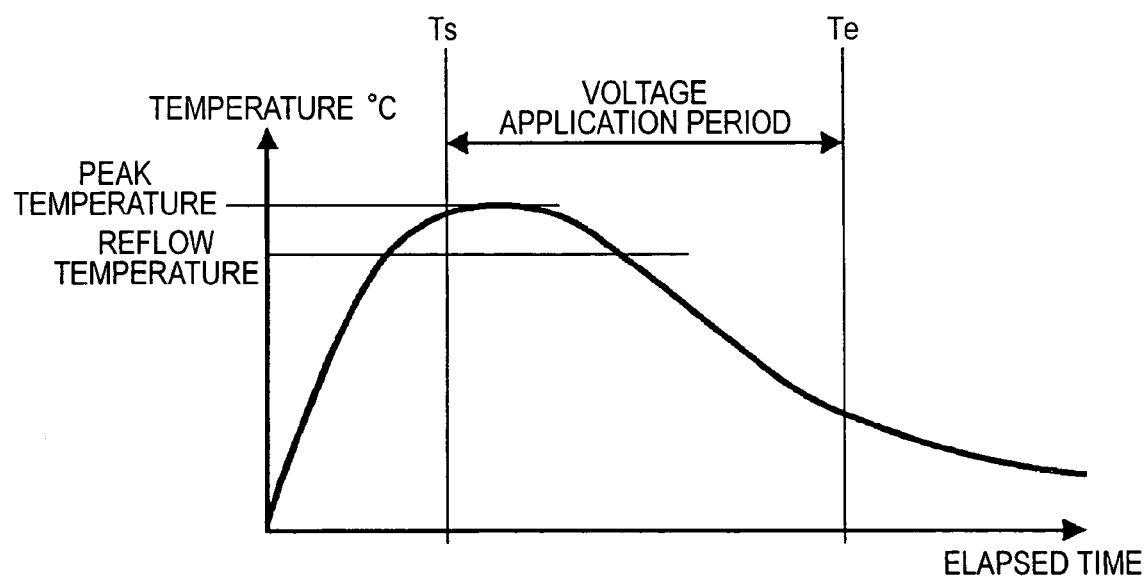
FIG. 46 is a time chart for explaining the high-temperature polarization treatment temperature of a piezoelectric film and the voltage application period, explained in a second embodiment of the present invention.

Accordingly, in a polarization treatment method of the present embodiment, the temperature of high-temperature polarization and the voltage application time are linked and the start time of day Ts of the voltage application and the finish time of day Te are controlled, as shown in FIG. 46. That is, the temperature profile shown in FIG. 46 corresponds to the temperature profile in the reflow furnace. The polarization treatment is conducted by starting the voltage application at a temperature higher than the temperature corresponding to the reflow (for example, 250° C. to 255° C.) and finishing the voltage application at a temperature (for example, room temperature) lower than the reflow temperature.

In this manner, the state in which the reflow has been conducted once may be brought about by starting the voltage application at a temperature higher than the temperature corresponding to the reflow and finishing the voltage application at a temperature lower than the reflow temperature. Therefore, it may become possible that the polarization characteristic is not changed even when the reflow is conducted in the following step. Furthermore, the adjustment of the detection signal may be conducted by exposing to a temperature corresponding to the reflow after the polarization treatment is conducted, as described below.

Figure 47:
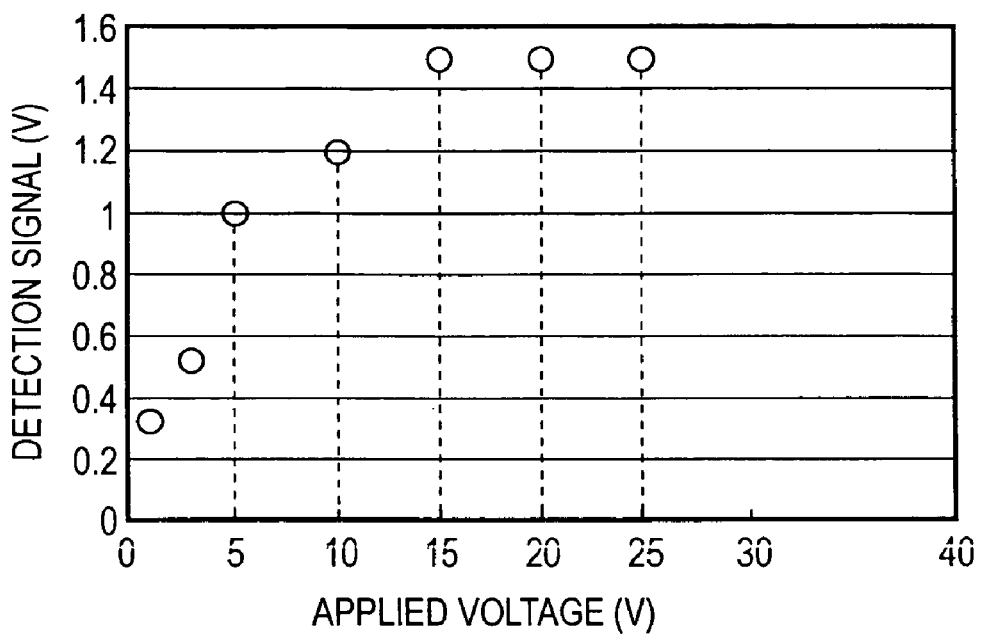
FIG. 47 is a diagram showing the relationship between the applied voltage and the detection signal voltage in the above-described polarization treatment.

FIG. 47 shows the relationship between the applied voltage and the detection signal voltage in the polarization treatment. The polarization temperature is the peak temperature (260° C. in the present example) in the reflow. As shown in FIG. 47, a higher detection signal is attained as the applied voltage is increased, and a detection signal of 1 V or more is attained at an applied voltage of 5 V or more. When a detection signal of 1 V or more is attained, IC may be allowed to operate appropriately, and a predetermined detection sensitivity may be ensured. The detection signal voltage becomes constant (1.5 V in the present example) at an applied voltage of 15 V or more. When the polarization treatment is conducted at the applied voltage at which the detection signal becomes constant, variations in element characteristics among wafers may be reduced.

The upper limit of the applied voltage may not be specified as long as the applied voltage is within the range in which element breakdown due to the voltage does not occur, that is, within the range in which dielectric breakdown of the element does not occur. In the example shown in FIG. 47, data are plotted until the applied voltage in the polarization reaches 25 V. However, the applied voltage may be further increased in accordance with the material constituting the piezoelectric, as a matter of course. In addition, the applied voltage may be changed in accordance with the treatment temperature. For example, when the polarization treatment is conducted at a temperature higher than or equal to the temperature corresponding to the reflow, a voltage of 15 V or more (for example, 20 V) is applied, and the applied voltage is decreased (for example, 5 V) at a temperature lower than or equal to the temperature corresponding to the reflow. When the magnitude of the voltage applied to the piezoelectric film in the polarization treatment is 5 V/μm or more in terms of an electric field strength, a detection signal voltage of a predetermined level or more may be attained.

Figure 48:
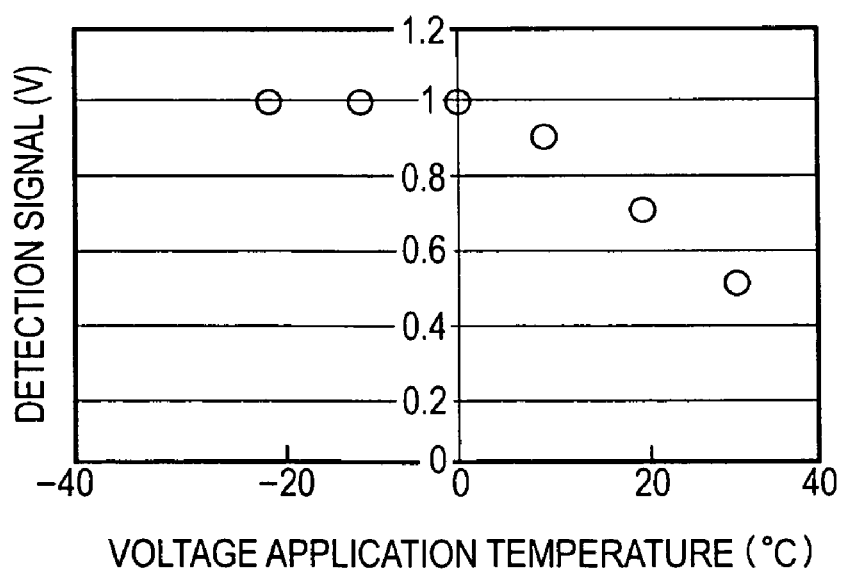
FIG. 48 is a diagram showing the relationship between the temperature at which the application of voltage is started and the detection signal voltage in the above-described polarization treatment.

When the relationship between the temperature at which the application of voltage is started and the detection signal voltage in the polarization treatment is measured, the result shown in FIG. 48 is attained. The applied voltage is 5 V. In FIG. 48, the application start temperature indicated by the horizontal axis is a temperature determined by subtracting the peak temperature (260° C.) from the application start temperature. As is clear from the result shown in FIG. 48, a constant detection signal voltage (1 V) is attained by starting the voltage application at the peak temperature or before the peak temperature is reached. That is, it is ascertained from FIG. 48 that the detection signal is high and constant when the voltage is applied from a temperature lower than the peak temperature (the negative side of the horizontal axis of the graph), whereas the detection signal is decreased when the voltage is applied after the peak temperature is passed (the positive side of the horizontal axis of the graph).

Figure 49:
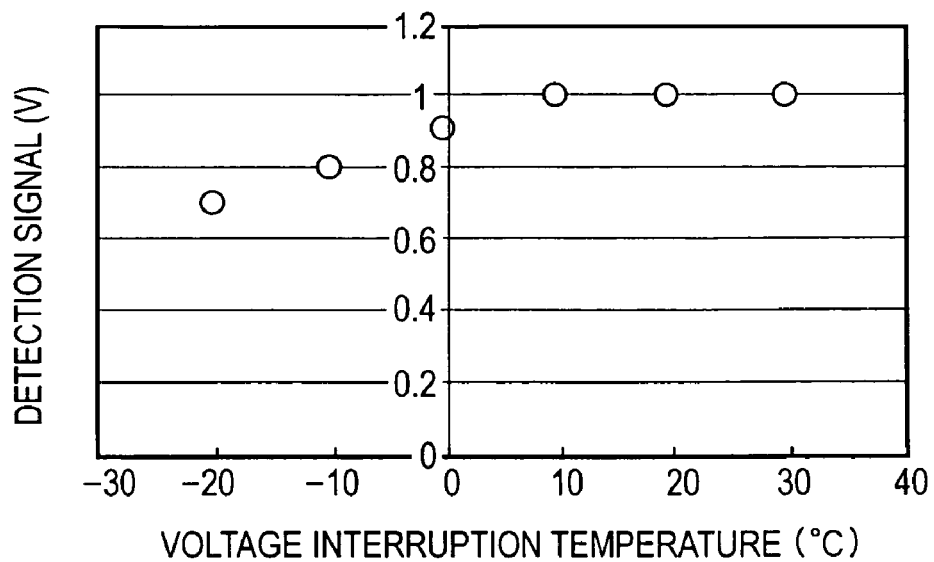
FIG. 49 is a diagram showing the relationship between the temperature at which the application of voltage is interrupted and the detection signal voltage after reflow.

Furthermore, the relationship between the temperature at which the application of voltage is interrupted and the detection signal voltage after reflow is measured, and the result shown in FIG. 49 is attained. The applied voltage is 5 V. In FIG. 49, the voltage interruption temperature indicated by the horizontal axis is a temperature determined by subtracting the voltage interruption temperature from the reflow temperature (250° C. in the present example). As is clear from FIG. 49, a constant detection signal voltage (1 V) is attained when the voltage application is interrupted at a temperature lower than the reflow temperature. That is, it is ascertained from FIG. 49 that the detection signal is decreased when the voltage application is interrupted at a temperature higher than the reflow temperature (the negative side of the horizontal axis of the graph), whereas the detection signal is high and constant when the voltage application is interrupted at a temperature lower than the reflow temperature (the positive side of the horizontal axis of the graph).

Therefore, the state in which the reflow has been conducted once may be brought about by applying the voltage from a temperature higher than the temperature corresponding to the reflow until the temperature lower than the reflow temperature and, thereafter, exposing to a temperature corresponding to the reflow, as in the present embodiment. Consequently, it may become possible that the polarization characteristic is not changed and a constant detection signal voltage is attained even when the reflow is conducted in the following step.

Figure 50:
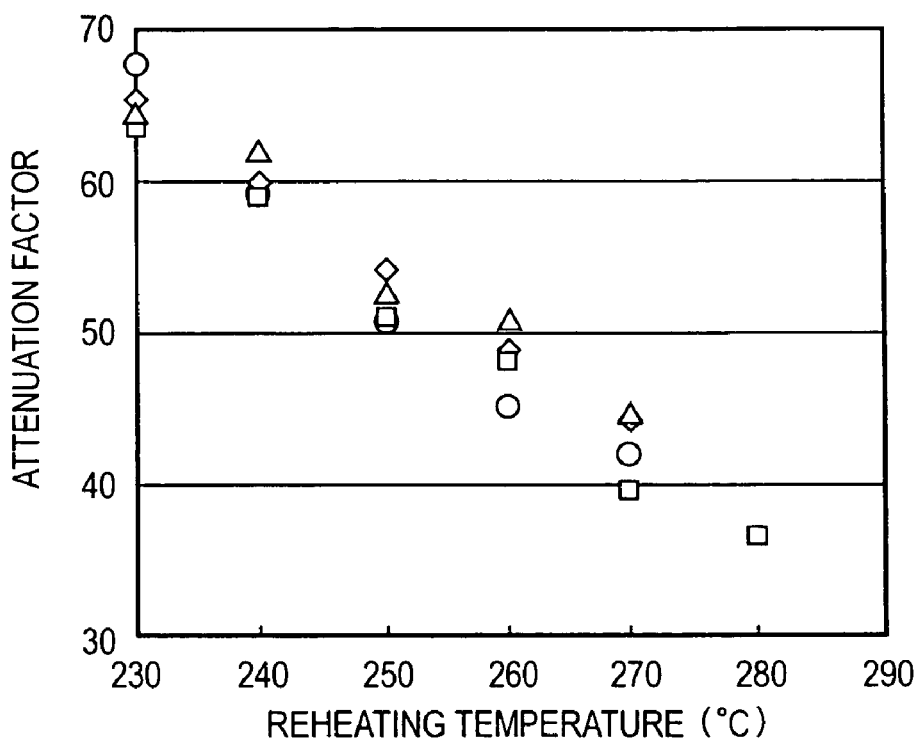
FIG. 50 is a diagram showing the results of measurement of the attenuation factor of the detection signal when a high temperature is applied again after the polarization treatment.

As is clear from FIG. 50, when a high temperature is applied again after the polarization treatment and the attenuation factor of the detection signal is measured, the attenuation factor of the detection signal is decreased as the reheating is conducted at a higher temperature and the exposure temperature becomes higher. That is, FIG. 50 is a graph showing the attenuation factor of the magnitude of detection signal and, therefore, indicating how the magnitude of the initial signal is changed by the following heating with respect to the detection signal of the vibrator only subjected to the polarization treatment. It is ascertained from this graph that there is a correlation between the reheating temperature and the attenuation factor and the attenuation factor may be adjusted by the heating temperature. Consequently, when the piezoelectric characteristics of the vibrators in a wafer exhibit a distribution, the reheating of the vibrator in a portion where the detection signal is too high is conducted at a temperature higher than the temperature of reheating of the other portion in order to allow the detection signal to become the same level as that of the other portion and, thereby, vibrators having a uniform detection signal may be produced all over the wafer. In particular, when an upper limit of the value of the detection signal is set in the signal processing conducted by the IC, the detection signal may be adjusted to become appropriate to the IC by adjusting the reheating temperature, so that an improvement of the yield in the production of vibrators may also be facilitated.

In this manner, with respect to the temperature and the applied voltage of the above-described high-temperature polarization, the voltage may be applied from a temperature higher than the temperature corresponding to the reflow and the magnitude of the detection signal may be adjusted by the exposure temperature in the following step. That is, the magnitude of the detection signal of the vibrator may be decreased to a desired magnitude and adjusted by the temperature of the annealing treatment after the polarization treatment. In the case where the reheating is conducted after the polarization treatment according to an embodiment of the present invention, the magnitude of the detection signal may be adjusted to become a desired magnitude by the reheating temperature.

Third Embodiment

In general, the piezoelectric film 105a (refer to FIG. 3) sandwiched between the reference electrode 104a and the driving electrode 106a (and detection electrodes 106b and 106c) is used after being subjected to the above-described polarization treatment to stabilize the piezoelectric characteristic. This polarization treatment is a treatment to align the polarization directions of the piezoelectric film in a predetermined direction. Usually, the polarization treatment of the piezoelectric film is conducted at a low temperature (room temperature to, for example, 30° C.). The piezoelectric film subjected to this low-temperature polarization treatment is indicated by reference numeral 105L.

The inventors of the present invention noted that a loop center O' (or a coercive electric field Ec') of the hysteresis loop of the piezoelectric subjected to the polarization treatment at a high temperature shifted in the negative electric field strength direction as compared with a loop center O (or a coercive electric field Ec) of the hysteresis loop of the piezoelectric film 105L subjected to the polarization treatment at a low temperature. In the following description, this piezoelectric film subjected to the high-temperature polarization treatment is indicated by reference numeral 105H.

When the piezoelectric film 105H subjected to the high-temperature polarization treatment is driven by application of an operation voltage corresponding to the loop center O of the piezoelectric film 105L subjected to the low-temperature polarization treatment, the piezoelectric film 105H is driven substantially by an offset potential corresponding to the amount of shift of the loop center O'. That is, the center electric field strength of an alternating-current signal input into the driving electrode 106a is set at a position sifted in the positive direction from the center O' of the hysteresis loop of the piezoelectric film 105H.

In this manner, the piezoelectric element is driven while a predetermined offset potential is applied between the reference electrode 104a and the driving electrode 106a as well as the detection electrodes 106b and 106c. Therefore, the detection signals from the detection electrodes 106b and 106c may be generated at a potential higher than the reference potential, so that the SN ratio may be increased and the detection sensitivity may be improved.

Figure 51:
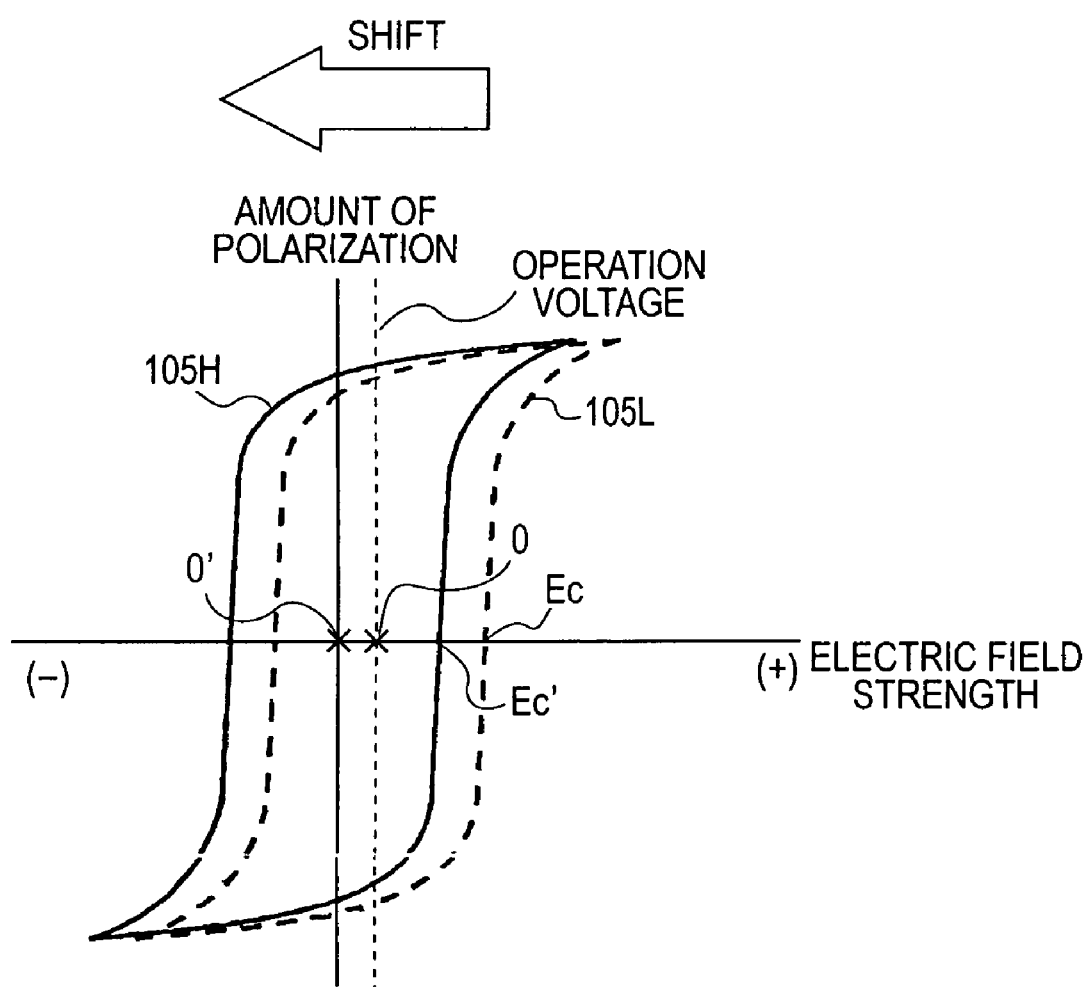
FIG. 51 is a diagram showing the hysteresis loop of the piezoelectric after a high-temperature polarization treatment, explained in a third embodiment of the present invention.

Here, the operation voltage corresponding to the loop center O of the piezoelectric film 105L subjected to the low-temperature polarization treatment refers to the operation voltage corresponding to the case where the driving electrode 106a and the reference electrode 104a are set at an equal potential and the piezoelectric element is used without application of the offset potential between the two electrodes. In this manner, as shown in FIG. 51, the loop center O' of the piezoelectric film 105H subjected to the high-temperature polarization treatment is shifted in the negative electric field strength direction relative to the operation voltage.

Figures 52A, 52B:
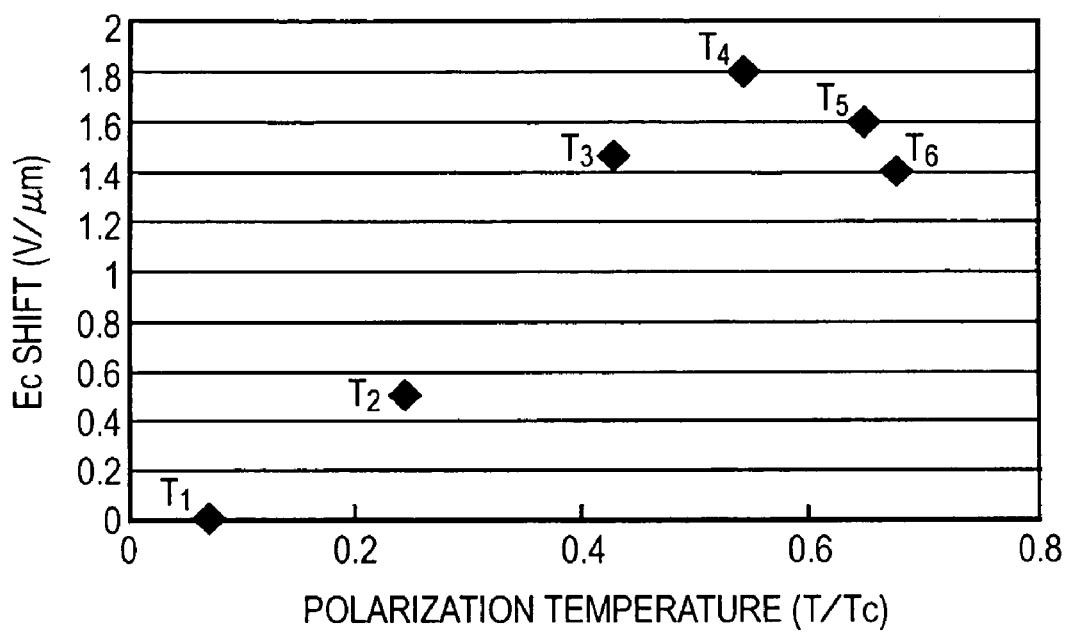
FIGS. 52A and 52B are diagrams showing an example of the relationship between the coercive electric field and the polarization temperature of a piezoelectric subjected to a high-temperature polarization treatment.

FIG. 52A shows the relationship between the polarization temperature and the amount of shift (absolute value) of the coercive electric field Ec of the piezoelectric film. The polarization temperature of the horizontal axis is represented by a ratio (T/Tc) of the treatment temperature T to the Curie temperature Tc of the piezoelectric film. In the present example, PZT having a Curie temperature of about 400° C. is used as a sample of the piezoelectric film. FIG. 52B shows the treatment temperature and the amount of shift of the coercive electric field Ec at each of points T1 to T6 shown in FIG. 52A.

As shown in FIGS. 52A and 52B, the shift of the coercive electric field Ec is observed when the polarization temperature (T/Tc) is 0.2 or more. The amount of shift of the coercive electric field is increased as the polarization temperature is increased. The amount of shift of the coercive electric field corresponds to the amount of offset of the operation voltage of the piezoelectric film. Therefore, the characteristic (sensitivity) of the piezoelectric film is also improved as the amount of shift of the coercive electric field is increased. FIG. 53 shows an example of the relationship between the amount of shift of the coercive electric field and the piezoelectric characteristic. In FIG. 53, the vertical axis indicates the ratio relative to the detection sensitivity of the piezoelectric film 105L subjected to the low-temperature polarization treatment.

According to the present embodiment, the coercive electric field of the piezoelectric film 105H is allowed to shift by 0.5 V/µm or more by the high-temperature polarization treatment where the polarization temperature (T/Tc) is 0.2 or more, and in particular, the treatment temperature T is 100° C. or more. Therefore, the piezoelectric characteristic may be enhanced by a factor of 2 or more without conducting a circuit design in which a bias potential is applied between the electrodes. Consequently, the detection sensitivity to the angular velocity may be increased significantly and, thereby, the element characteristics may be improved. Furthermore, it may become possible to respond satisfactorily to miniaturization of the element.

Other piezoelectric films having different Curie temperatures tend to exhibit relationships similar to the relationship between the polarization temperature (T/Tc) and the amount of shift of the coercive electric field Ec shown in FIG. 52A. Therefore, for example, in the case where PZT is used as the piezoelectric film, although the Curie temperature is varied depending on the composition ratio of the zirconium to titanium, a similar relationship may be applicable to any composition ratio.

As described above, in the vibration gyro sensor element 100 of the present embodiment, since the operation voltage of the piezoelectric film is set at the position shifted in the positive direction from the center of the hysteresis loop of the piezoelectric film by changing the polarization treatment condition of the piezoelectric film, the detection sensitivity to the angular velocity may be increased than ever and, thereby, the precision of output may be improved.

As described below, in the simultaneous production of a plurality of the elements at a wafer level, since variations in element characteristics resulting from an in-plane uniformity problem of the wafer treatment may be compensated, the available percentage or the yield may be improved.

Fourth Embodiment

In general, small electronic components are connected to mounting substrates by being passed through reflow furnaces, as described above. In this case, the heat at about 250° C. is applied to the electronic component. It is desirable that the characteristics of the vibration gyro sensor element 100 are not changed at this reflow temperature. Therefore, in the above-described second embodiment, the polarization treatment is conducted at a temperature higher than or equal to the reflow temperature in order that the characteristics of the element is not changed even when the reflow temperature is applied.

On the other hand, various materials are contained in the thin film constituting the vibrator, and when the element is completed, warp may occur in the vibrator due to the tensile strength of various thin film layers. Therefore, if the direction of warp of the vibrator and the polarization direction of the piezoelectric film are not taken into consideration, the electrical characteristics of the element may not be stabilized, and the polarization state may become extinct.

In the present embodiment, a vibration gyro sensor element capable of exhibiting a desired detection output is produced by specifying the relationship between the change of voltage application polarity in the high-temperature polarization and the warp of the vibrator generated in the formation process.

As explained in the above-described first embodiment, the lower electrode film 4 constituting the reference electrode 104a, the piezoelectric film 5 constituting the piezoelectric film 105a, and the upper electrode film 6 constituting the driving electrode 106a and the detection electrodes 106b and 106c are disposed by lamination on the surface of the vibrator 110 of the vibration gyro sensor element 100. Since these thin film layers are formed on the surface of the thin vibrator 110 of about 100 μm in thickness, the vibrator 110 itself may be warped with a high possibility due to the stresses of materials depending on the selection of the materials for these constituent films.

Figure 54A:
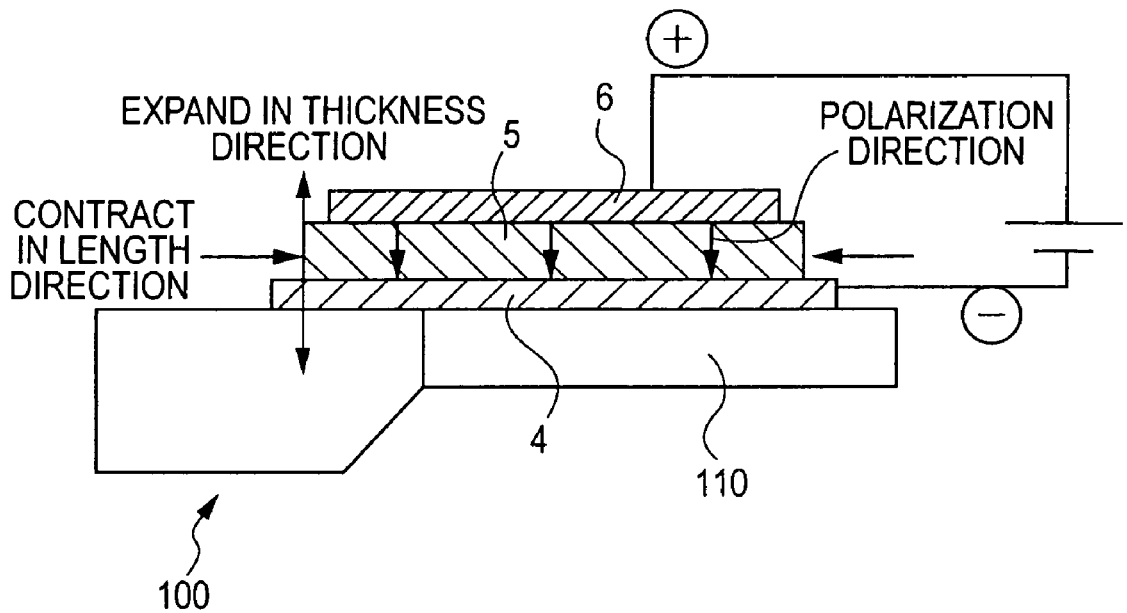
FIGS. 54A and 54B are side views showing polarization directions of a piezoelectric film of a vibration gyro sensor element explained in a fourth embodiment of the present invention.
Figure 54B:
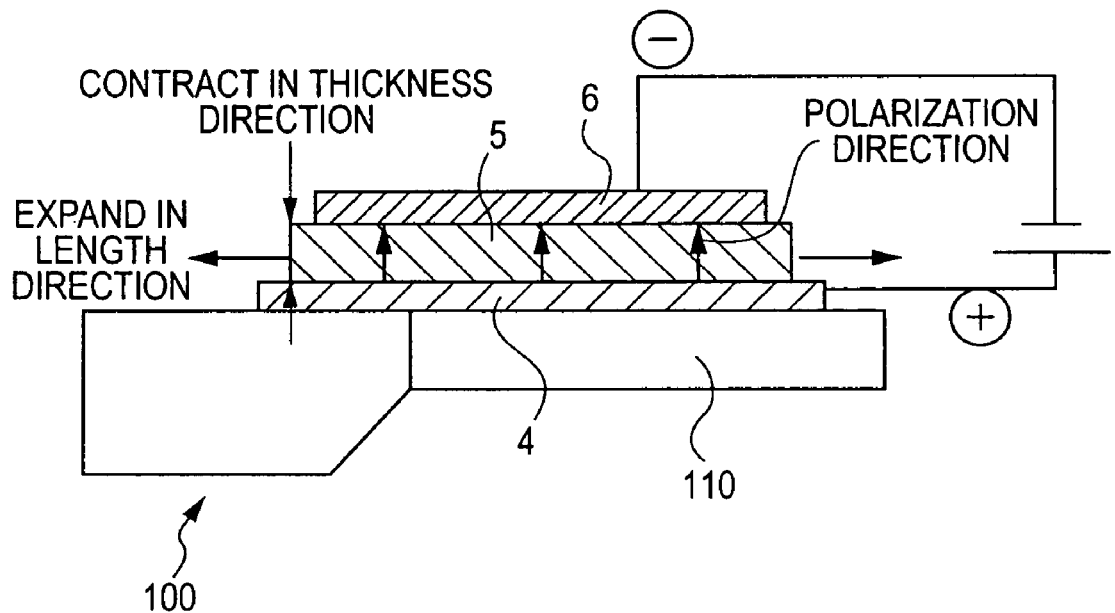
Figure 55A:
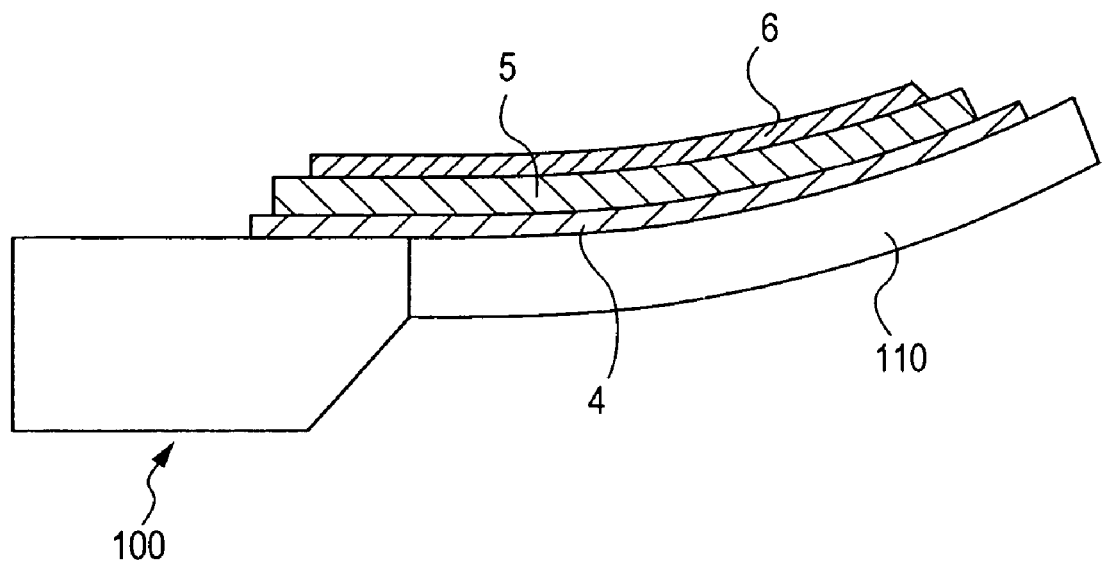
FIGS. 55A and 55B are side views for explaining warp directions of a vibrator when a voltage is applied to a vibration gyro sensor element.
Figure 55B:
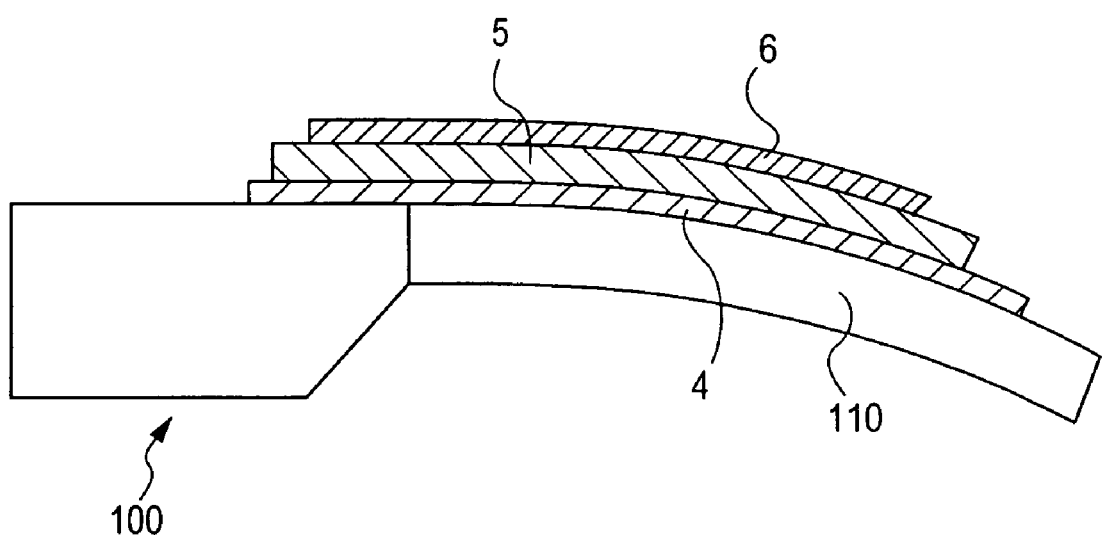

On the other hand, the piezoelectric film 5 itself is used while being in the state in which the polarization is aligned after a polarization treatment is conducted. As shown in FIG. 54A, in the case where the upper electrode film 6 side is a positive electrode (+) and the lower electrode film 4 side is a negative electrode (−), the piezoelectric film 5 is polarized in the direction from the upper electrode film 6 side toward the lower electrode film 4 side. When a vibration voltage is applied to this state, where the upper electrode film 6 side is a positive electrode and the lower electrode film 4 side is a negative electrode, the vibrator 110 is warped toward the piezoelectric film 5 side, as shown in FIG. 55A. Conversely, as shown in FIG. 54B, when a vibration voltage is applied where the upper electrode film 6 side is the negative electrode and the lower electrode film 4 side is the positive electrode, the vibrator 110 functions in such a way that warp occurs toward the side opposite to the piezoelectric film 5, as shown in FIG. 55B. The positive state and the negative state are repeated alternately with a resonant frequency of the vibrator and, thereby, the vibrator is vibrated vertically.

With respect to the piezoelectric film 5, the direction of occurrence of warp is inherently determined depending on the polarization direction. When the polarization treatment is conducted from the upper electrode film 6 side to the lower electrode film 4 side, as shown in FIG. 54A, the vibrator 110 has a property of warping toward the piezoelectric film 5 side, as shown in FIG. 55A. Conversely, when the polarization treatment is conducted from the lower electrode film 4 side to the upper electrode film 6 side, as shown in FIG. 54B, the vibrator 110 has a property of warping toward the side opposite to the piezoelectric film 5, as shown in FIG. 55B.

Put another way, in the case where the piezoelectric film 5 is polarized from the upper electrode film 6 side to the lower electrode film 4 side, as shown in FIG. 54A, the state in which the vibrator 110 is warped toward the piezoelectric film 5 side, as shown in FIG. 55A, indicates that the polarization is stable. The same holds true for an inverse polarization direction.

Consequently, in the case where the vibrator 110 is warped toward the piezoelectric film 5 side, as shown in FIG. 55A, at the point in time when the lower electrode film 4, the piezoelectric film 5, and the upper electrode film 6 are formed, the polarization state tends to become stable in that direction. That is, it is appropriate that a positive electrode is connected to the upper electrode film 6 side, a negative electrode is connected to the lower electrode film 4 side, and a polarization treatment is conducted where the polarization direction is directed from the upper electrode film 6 side toward the lower electrode film 4 side.

Figure 56:
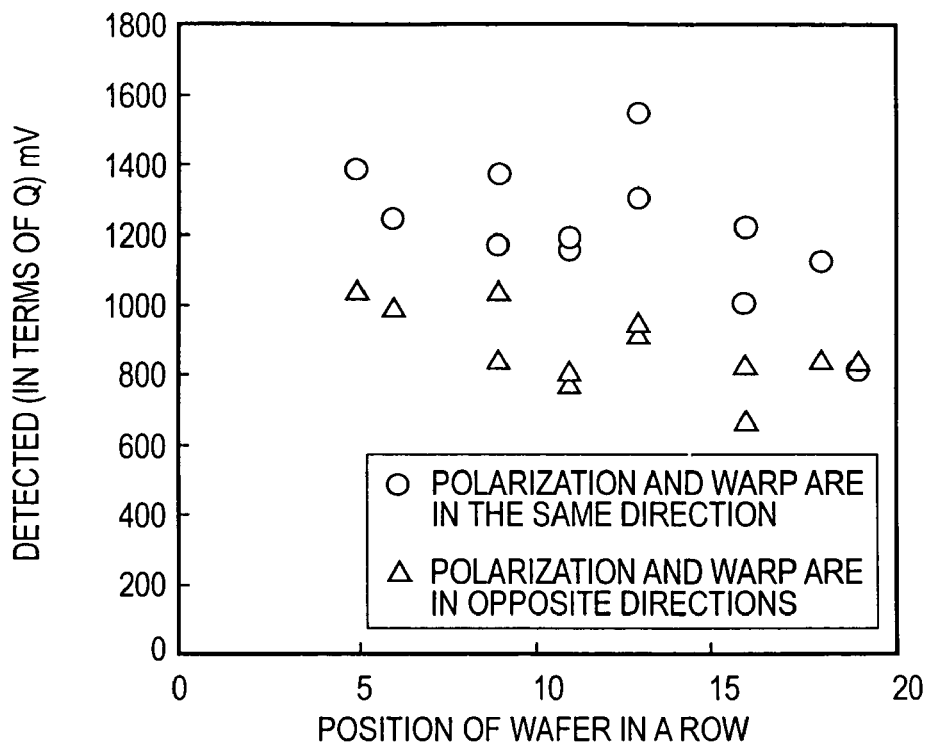
FIG. 56 is a diagram showing an experimental result for explaining the detection sensitivity characteristics depending on the difference in the polarization direction.

FIG. 56 is a plot of the detection signal output of an actual vibrator with respect to the warp direction and the polarization direction. In the present example, the vibrator 110 is warped toward the piezoelectric film 5 side, as shown in FIG. 55A. In FIG. 56, a term "polarization and warp are in the same direction" indicates the polarization treatment in which the upper electrode film 6 side is specified to be a positive electrode and the lower electrode film 4 side is specified to be a negative electrode, as shown in FIG. 54A, and a term "polarization and warp are in opposite directions" indicates the polarization treatment in which the upper electrode film 6 side is specified to be a negative electrode and the lower electrode film 4 side is specified to be a positive electrode, as shown in FIG. 54B.

It is ascertained from FIG. 56 that the output in the case where the directions of the warp and the polarization are in alignment with each other is higher than the output in the case where the directions of the warp and the polarization are not in alignment at any position of the wafer.

Figure 57:
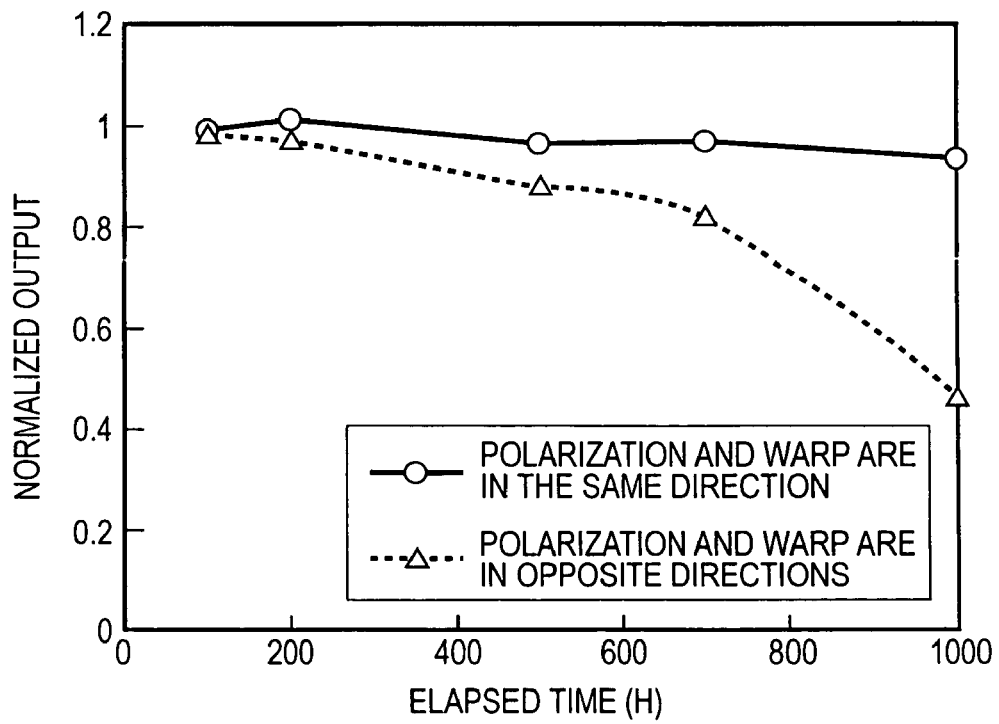
FIG. 57 is a diagram showing an experimental result for explaining the time-lapse change of the output depending on the difference in the polarization direction.

Furthermore, from the result of a long-duration continuous test, as shown in FIG. 57, it is ascertained that the output of the above-described sample in which the polarization and the warp are in the same direction is kept constant for a long time, whereas the characteristics of the sample in which the polarization and the warp are in opposite directions is deteriorated, although this may be caused by deterioration of the polarization state in the long-duration continuous test.

Consequently, it is desirable that the polarization direction of the piezoelectric film 5 is determined in consideration of the state of the stress of the thin film material formed on the vibrator 110, and the polarization treatment is conducted in the direction suitable for applying the stress in the same direction. In the above-described example, the state in which the produced vibrator is warped toward the piezoelectric film side is explained as an example. However, there is a case where the vibrator is warped in the direction opposite to the direction in the above-described example depending on the selection of the material for the thin film. In this case, it is desirable that the polarization application direction is allowed to be the reverse of that in the above-described example and a polarization direction suitable for stabilizing the polarization state is selected, as a matter of course.

The piezoelectric element (vibration gyro sensor element) and the method for manufacturing the same disclosed in the present specification described above may be provided with the following other configurations.

1. A method for manufacturing a vibration gyro sensor element provided with a vibrator including a first electrode film disposed on a substrate surface, a piezoelectric film disposed on the first electrode film, and a second electrode film disposed on the piezoelectric film, the method including the steps of forming a plurality of units of the above-described vibrators on the substrate by a thin film process; and conducting a polarization treatment of the plurality of vibrators simultaneously through wirings disposed on the substrate by the above-described thin film process.

2. The method for manufacturing a vibration gyro sensor element according to the above-described item 1, wherein the ratio of the polarization treatment temperature of the above-described piezoelectric film to the Curie temperature of the piezoelectric film is 0.2 or more.

3. A method for manufacturing a vibration gyro sensor element provided with a vibrator including a first electrode film disposed on a substrate surface, a piezoelectric film disposed on the first electrode film, and a second electrode film disposed on the piezoelectric film where the above-described vibrator is flip chip mounted on a support substrate and the above-described support substrate is connected through reflow to a mounting substrate, the method including the step of applying a voltage from a temperature higher than the temperature corresponding to the reflow and finishing the voltage application at a temperature lower than the temperature corresponding to the reflow in the polarization treatment step of the above-described vibrator.

4. The method for manufacturing a vibration gyro sensor element according to the above-described item 3, the method including the step of exposing the above-described vibrator to the temperature corresponding to the reflow after the above-described polarization treatment.

5. The method for manufacturing a vibration gyro sensor element according to the above-described item 3, wherein the magnitude of the voltage in the above-described polarization treatment of the above-described piezoelectric film is 5 V/μm or more in terms of an electric field strength.

6. A vibration gyro sensor element provided with a vibrator including a first electrode film disposed on a substrate surface, a piezoelectric film disposed on the first electrode film, and a second electrode film disposed on the piezoelectric film, wherein the center electric field strength of an alternating-current signal applied to the above-described piezoelectric film is set at a position shifted in the positive direction from the center of a hysteresis loop of the piezoelectric film.

7. The vibration gyro sensor element according to the above-described item 6, wherein the center electric field strength of an alternating-current signal applied between the above-described first electrode film and the above-described second electrode film is set at a position shifted in the positive direction from the center of a hysteresis loop of the above-described piezoelectric film.

8. The vibration gyro sensor element according to the above-described item 7, wherein the amount of shift of the center of the hysteresis loop of the above-described piezoelectric film is 0.5 V/μm or more.

It should be understood by those skilled in the art that various modifications, combinations, sub-combinations and alterations may occur depending on design requirements and other factors insofar as they are within the scope of the appended claims or the equivalents thereof.

What is claimed is:

1. A piezoelectric element comprising:
a substrate;
a first electrode film disposed on the substrate;
a piezoelectric film disposed on the first electrode film; and
a second electrode film disposed on the piezoelectric film, wherein,
the piezoelectric film has a laminated structure composed of a plurality of crystallized piezoelectric thin films,
the first electrode film comprises a laminated film of a titanium layer and a platinum layer, the titanium layer having a thickness within the range of 5 nm or more to 20 nm or less, and
the second electrode film comprises separate portions providing a driving electrode and at least one detection electrode.

2. The piezoelectric element according to claim 1, wherein the thickness of the piezoelectric thin film is 350 nm or less.

3. The piezoelectric element according to claim 2, wherein at least three layers of the piezoelectric thin films are laminated.

4. The piezoelectric element according to claim 1, wherein the piezoelectric element has a shape of a cantilever.

5. The piezoelectric element according to claim 1, wherein the substrate is a silicon single crystal substrate.

6. A piezoelectric element comprising:
a substrate;
a first electrode film disposed on the substrate;
a piezoelectric film disposed on the first electrode film; and
a second electrode film disposed on the piezoelectric film, wherein,
the piezoelectric film has a laminated structure composed of a plurality of crystallized piezoelectric thin films, and
the second electrode film comprises a driving electrode disposed on the piezoelectric film and a pair of detection electrodes sandwiching the driving electrode.

7. The piezoelectric element according to claim 1, wherein the piezoelectric film comprises lead, zirconium, titanium, and oxygen as primary components.

8. A piezoelectric element comprising:
a substrate;
a first electrode film disposed on the substrate;
a piezoelectric film disposed on the first electrode film; and
a second electrode film disposed on the piezoelectric film, wherein,
the piezoelectric film has a laminated structure composed of a plurality of crystallized piezoelectric thin films, and
the center electric field strength of an alternating-current signal applied between the first electrode film and the second electrode film is set at a position shifted in the positive direction from the center of a hysteresis loop of the piezoelectric film.

9. The piezoelectric element according to claim 8, wherein the center of the hysteresis loop of the piezoelectric film is shifted in the negative direction relative to the center electric field strength of the alternating-current signal when the piezoelectric film is driven while the first electrode film and the second electrode film are connected to an equal potential.

10. The piezoelectric element according to claim 9, wherein the amount of shift of the center of the hysteresis loop of the piezoelectric film is 0.5 V/μm or more.

* * * * *